United States Patent
Sato

(10) Patent No.: US 9,507,265 B2
(45) Date of Patent: Nov. 29, 2016

(54) EXPOSURE APPARATUS, EXPOSING METHOD, METHOD FOR MANUFACTURING DEVICE, PROGRAM, AND RECORDING MEDIUM

(71) Applicant: NIKON CORPORATION, Tokyo (JP)

(72) Inventor: Shinji Sato, Fukaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/681,475

(22) Filed: Apr. 8, 2015

(65) Prior Publication Data

US 2015/0286142 A1 Oct. 8, 2015

Related U.S. Application Data

(63) Continuation of application No. PCT/JP2013/077313, filed on Oct. 8, 2013.

(30) Foreign Application Priority Data

Oct. 12, 2012 (JP) ................................ 2012-227051

(51) Int. Cl.
*G03B 27/32* (2006.01)
*G03B 27/52* (2006.01)
(Continued)

(52) U.S. Cl.
CPC ......... *G03F 7/2041* (2013.01); *G03F 7/70341* (2013.01)

(58) Field of Classification Search
CPC ........................... G03F 7/2041; G03F 7/70341
USPC ............................................. 355/30, 72, 77
See application file for complete search history.

(56) References Cited

U.S. PATENT DOCUMENTS

| 6,208,407 B1 | 3/2001 | Loopstra |
| 6,262,796 B1 | 7/2001 | Loopstra et al. |
| 6,341,007 B1 | 1/2002 | Nishi et al. |

(Continued)

FOREIGN PATENT DOCUMENTS

| EP | 1 713 113 A1 | 10/2006 |
| JP | 2007-142428 A | 6/2007 |

(Continued)

OTHER PUBLICATIONS

Jan. 14, 2014 Search Report issued in International Patent Application No. PCT/JP2013/077313.

(Continued)

*Primary Examiner* — Colin Kreutzer
(74) *Attorney, Agent, or Firm* — Oliff PLC

(57) ABSTRACT

An exposure apparatus includes a liquid immersion member including a first member and a second member and configured to form a liquid immersion space of the liquid, a driving apparatus configured to move the second member with respect to the first member; and a controller configured to control the driving apparatus. The controller controls the driving apparatus so that a first operation of the second member in a first movement period of the substrate between exposure termination of a first shot region and exposure start of a second shot region is different from a second operation of the second member in a second movement period of the substrate between exposure termination of a third shot region and exposure start of a fourth shot region, the first and second shot regions being included in the same row, the third and fourth shot regions being arranged in different rows.

51 Claims, 31 Drawing Sheets

(51) Int. Cl.
*G03B 27/58* (2006.01)
*G03F 7/20* (2006.01)

(56) References Cited

U.S. PATENT DOCUMENTS

| | | | |
|---|---|---|---|
| 6,452,292 | B1 | 9/2002 | Binnard |
| 6,611,316 | B2 | 8/2003 | Sewell |
| 6,778,257 | B2 | 8/2004 | Bleeker et al. |
| 6,897,963 | B1 | 5/2005 | Taniguchi et al. |
| 7,292,313 | B2 | 11/2007 | Poon et al. |
| 7,656,501 | B2 | 2/2010 | Ten Kate et al. |
| 7,864,292 | B2 | 1/2011 | Leenders et al. |
| 8,004,651 | B2 | 8/2011 | Nagasaka |
| 8,068,209 | B2 | 11/2011 | Poon et al. |
| 8,134,685 | B2 | 3/2012 | Nishii et al. |
| 8,237,911 | B2 | 8/2012 | Poon et al. |
| 8,289,497 | B2 | 10/2012 | Poon et al. |
| 8,400,610 | B2 | 3/2013 | Poon et al. |
| 8,477,283 | B2 | 7/2013 | Nishii |
| 8,675,174 | B2 | 3/2014 | Mizutani |
| 8,743,343 | B2 | 6/2014 | Poon et al. |
| 8,891,059 | B2 | 11/2014 | Nagasaka |
| 8,896,806 | B2 | 11/2014 | Sato |
| 8,934,080 | B2 | 1/2015 | Poon et al. |
| 9,013,675 | B2 | 4/2015 | Nishii et al. |
| 2002/0001915 | A1* | 1/2002 | Akimoto ............ G03F 7/70358 438/412 |
| 2007/0109512 | A1 | 5/2007 | Kate et al. |
| 2007/0109513 | A1* | 5/2007 | Antonius Leenders ............ G03F 7/70341 355/53 |
| 2007/0110213 | A1* | 5/2007 | Leenders ............ G03F 7/70341 378/34 |
| 2007/0177125 | A1 | 8/2007 | Shibazaki |
| 2007/0288121 | A1 | 12/2007 | Shibazaki |
| 2008/0049209 | A1 | 2/2008 | Nagasaka et al. |
| 2009/0231560 | A1* | 9/2009 | Poon .................. G03F 7/70341 355/30 |
| 2009/0296054 | A1* | 12/2009 | Kono .................... G03B 27/52 355/30 |
| 2013/0188159 | A1 | 7/2013 | Shibazaki |
| 2013/0265555 | A1 | 10/2013 | Shibazaki |
| 2013/0265556 | A1 | 10/2013 | Sato |
| 2014/0022522 | A1 | 1/2014 | Sato |
| 2014/0253886 | A1 | 9/2014 | Sato |
| 2014/0285781 | A1 | 9/2014 | Sato |
| 2014/0300875 | A1 | 10/2014 | Sato et al. |

FOREIGN PATENT DOCUMENTS

| | | |
|---|---|---|
| JP | 2013-251311 A | 12/2013 |
| WO | 01/35168 A1 | 5/2001 |
| WO | 2004/019128 A2 | 3/2004 |
| WO | 2007/057673 A1 | 5/2007 |

OTHER PUBLICATIONS

Jan. 14, 2014 Written Opinion issued in International Patent Application No. PCT/JP2013/077313.
October 26, 2015 Office Action issued in U.S Appl. No. 14/047,110.
Jan. 22, 2016 Office Action issued in U.S. Appl. No. 14/047,110.

* cited by examiner (A)

(B)

(C)

US 9,507,265 B2

EXPOSURE APPARATUS, EXPOSING METHOD, METHOD FOR MANUFACTURING DEVICE, PROGRAM, AND RECORDING MEDIUM

CROSS-REFERENCE TO RELATED APPLICATION

Priority is claimed on Japanese Patent Application No. 2012-227051, filed Oct. 12, 2012. The present application is a continuation application of International Application PCT/JP2013/077313, filed on Oct. 8, 2013. The contents of the above applications are incorporated herein.

BACKGROUND

Technical Field

The present invention relates to an exposure apparatus, an exposing method, a device manufacturing method, a program, and a recording medium.

For example, in an exposure apparatus which is used in a photolithographic process, as disclosed in U.S. Pat. No. 7,864,292 shown below, a liquid immersion exposure apparatus which exposes a substrate by exposure light via a liquid is known.

SUMMARY

For example, in a liquid immersion exposure apparatus, if liquid flows out from a predetermined space or remains on an object such as a substrate, exposure failure may occur. As a result, a defective device may be manufactured.

An object of an aspect of the present invention is to provide an exposure apparatus and an exposing method capable of suppressing occurrence of exposure failure. Moreover, an object of another aspect of the present invention is to provide a device manufacturing method, a program, and a recording medium capable of suppressing occurrence of a defective device.

According to a first aspect of the present invention, there is provided an exposure apparatus that sequentially exposes each of a plurality of shot regions of a substrate by exposure light via liquid between an emitting surface of an optical member and the substrate while moving the substrate in a scanning direction with respect to the exposure light emitted from the emitting surface, the exposure apparatus including: a liquid immersion member that includes a first member and a second member and that is configured to form a liquid immersion space of the liquid, the first member being disposed at at least a portion of surrounding of the optical member, the second member being disposed at a portion of surrounding of the optical member; a driving apparatus that is configured to move the second member with respect to the first member; and a controller that is configured to control the driving apparatus, wherein, before or after sequential exposures of each of a plurality of shot regions, which are included in one row on the substrate and are disposed in a direction which intersects with the scanning direction, are performed, shot regions of another row different from the one row are exposed, and the controller controls the driving apparatus so that a first operation of the second member in a first movement period of the substrate which is between exposure termination of a first shot region and exposure start of a second shot region is different from a second operation of the second member in a second movement period of the substrate which is between exposure termination of a third shot region and exposure start of a fourth shot region, the first and second shot regions being included in the same row, the third and fourth shot regions being arranged in different rows.

According to a second aspect of the present invention, there is provided an exposure apparatus that sequentially exposes each of a plurality of shot regions of a substrate by exposure light via liquid between an emitting surface of an optical member and the substrate while moving the substrate in a scanning direction with respect to the exposure light emitted from the emitting surface, the exposure apparatus including: a liquid immersion member that includes a first member and a second member and that is configured to form a liquid immersion space of the liquid, the first member having a first lower surface and being disposed at at least a portion of surrounding of the optical member, the second member having a second upper surface opposite to the first lower surface via a gap and a second lower surface which is capable of opposing the substrate and the second member being disposed at at least a portion of surrounding of an optical path of the exposure light, a driving apparatus that is configured to move the second member with respect to the first member: and a controller that is configured to control the driving apparatus, wherein, before or after sequential exposures of each of a plurality of shot regions, which are included in one row on the substrate and are disposed in a direction which intersects with the scanning direction, are performed, shot regions of another row different from the one row are exposed, and the controller controls the driving apparatus so that a first operation of the second member in a first movement period of the substrate which is between exposure termination of a first shot region and exposure start of a second shot region is different from a second operation of the second member in a second movement period of the substrate which is between exposure termination of a third shot region and exposure start of a fourth shot region, the first and second shot regions being included in the same row, the third and fourth shot regions being arranged in different rows.

According to a third aspect of the present invention, there is provided an exposure apparatus that sequentially exposes each of a plurality of shot regions of a substrate by exposure light via liquid between an emitting surface of an optical member and the substrate while moving the substrate in a scanning direction with respect to the exposure light emitted from the emitting surface, the exposure apparatus including: a liquid immersion member that includes a first member and a second member and that is configured to form a liquid immersion space of the liquid, the first member being disposed at at least a portion of surrounding of the optical member, the second member being disposed at a portion of surrounding of the optical member; a driving apparatus that is configured to move the second member with respect to the first member; and a controller that is configured to control the driving apparatus, wherein third and fourth shot regions are sequentially exposed before or after sequential exposures of first and second shot regions are performed, the first and second shot regions having a first size with respect to the scanning direction, third and fourth shot regions having a second size which is different from the first size with respect to the scanning direction, and the controller controls the driving apparatus so that a first operation of the second member in a first movement period of the substrate which is between exposure termination of the first shot region and exposure start of the second shot region is different from a second operation of the second member in a second movement period of the substrate which is between exposure termination of the third shot region and exposure start of the fourth shot region.

According to a fourth aspect of the present invention, there is provided an exposure apparatus that sequentially exposes each of a plurality of shot regions of a substrate by exposure light via liquid between an emitting surface of an optical member and the substrate while moving the substrate in a scanning direction with respect to the exposure light emitted from the emitting surface, the exposure apparatus including: a liquid immersion member that includes a first member and a second member and that is configured to form a liquid immersion space of the liquid, the first member having a first lower surface and being disposed at at least a portion of surrounding of the optical member, the second member having a second upper surface opposite to the first lower surface via a gap and a second lower surface which is capable of opposing the substrate and the second member being disposed at at least a portion of surrounding of an optical path of the exposure light; a driving apparatus that is configured to move the second member with respect to the first member; and a controller that is configured to control the driving apparatus, wherein third and fourth shot regions are sequentially exposed before or after sequential exposures of first and second shot regions are performed, the first and second shot regions having a first size with respect to the scanning direction, third and fourth shot regions having a second size which is different from the first size with respect to the scanning direction, and the controller controls the driving apparatus so that a first operation of the second member in a first movement period of the substrate which is between exposure termination of the first shot region and exposure start of the second shot region is different from a second operation of the second member in a second movement period of the substrate which is between exposure termination of the third shot region and exposure start of the fourth shot region.

According to a fifth aspect of the present invention, there is provided an exposure apparatus that sequentially exposes each of a plurality of shot regions of a substrate by exposure light via liquid between an emitting surface of an optical member and the substrate while moving the substrate in a scanning direction with respect to the exposure light emitted from the emitting surface, the exposure apparatus including: a liquid immersion member that includes a first member and a second member and that is configured to form a liquid immersion space of the liquid, the first member being disposed at at least a portion of surrounding of the optical member, the second member being disposed at a portion of surrounding of the optical member; a driving apparatus that is configured to move the second member with respect to the first member; and a controller that is configured to control the driving apparatus, wherein third and fourth shot regions are sequentially exposed before or after sequential exposures of first and second shot regions are performed, the first shot region having a first size with respect to the scanning direction, the second shot region having a second size with respect to the scanning direction and the third and fourth shot regions having a third size with respect to the scanning direction, and the controller controls the driving apparatus so that a first operation of the second member in a first movement period of the substrate which is between exposure termination of the first shot region and exposure start of the second shot region is different from a second operation of the second member in a second movement period of the substrate which is between exposure termination of the third shot region and exposure start of the fourth shot region.

According to a sixth aspect of the present invention, there is provided an exposure apparatus that sequentially exposes each of a plurality of shot regions of a substrate by exposure light via liquid between an emitting surface of an optical member and the substrate while moving the substrate in a scanning direction with respect to the exposure light emitted from the emitting surface, the exposure apparatus including: a liquid immersion member that includes a first member and a second member and that is configured to form a liquid immersion space of the liquid, the first member having a first lower surface and being disposed at at least a portion of surrounding of the optical member, the second member having a second upper surface opposite to the first lower surface via a gap and a second lower surface which is capable of opposing the substrate and the second member being disposed at at least a portion of surrounding of an optical path of the exposure light; a driving apparatus that is configured to move the second member with respect to the first member, and a controller that is configured to control the driving apparatus, wherein third and fourth shot regions are sequentially exposed before or after sequential exposures of first and second shot regions are performed, the first shot region having a first size with respect to the scanning direction, the second shot region having a second size with respect to the scanning direction and the third and fourth shot regions having a third size with respect to the scanning direction, and the controller controls the driving apparatus so that a first operation of the second member in a first movement period of the substrate which is between exposure termination of the first shot region and exposure start of the second shot region is different from a second operation of the second member in a second movement period of the substrate which is between exposure termination of the third shot region and exposure start of the fourth shot region.

According to a seventh aspect of the invention, there is provided an exposure apparatus that sequentially exposes each of a plurality of shot regions of a substrate by exposure light via liquid between an emitting surface of an optical member and the substrate while moving the substrate in a scanning direction with respect to the exposure light emitted from the emitting surface, the exposure apparatus including: a liquid immersion member that includes a first member and a second member and that is configured to form a liquid immersion space of the liquid, the first member being disposed at at least a portion of surrounding of the optical member, the second member being disposed at a portion of surrounding of the optical member; a driving apparatus that is configured to move the second member with respect to the first member; and a controller that is configured to control the driving apparatus, wherein the controller controls the driving apparatus so that the second member is moved to one side of the direction which intersects with the scanning direction at a first movement condition in a first movement period of the substrate which is between exposure termination of the first shot region and exposure start of the second shot region, and the second member is moved to the other side of direction which intersects with the scanning direction at a second movement condition in a second exposure period of the substrate which is between exposure start and exposure termination of the second shot region, the second movement condition being different from the first movement condition.

According to an eighth aspect of the invention, there is provided an exposure apparatus that sequentially exposes each of a plurality of shot regions of a substrate by exposure light via liquid between an emitting surface of an optical member and the substrate while moving the substrate in a scanning direction with respect to the exposure light emitted from the emitting surface, the exposure apparatus including: a liquid immersion member that includes a first member and a second member and that is configured to form a liquid immersion space of the liquid, the first member having a first lower surface and being disposed at at least a portion of surrounding of the optical member, the second member having a second upper surface opposite to the first lower surface via a gap and a second lower surface which is capable of opposing the substrate and the second member being disposed at at least a portion of surrounding of an optical path of the exposure light; a driving apparatus that is configured to move the second member with respect to the first member, and a controller that is configured to control the driving apparatus, wherein the controller controls the driving apparatus so that the second member is moved to one side of the direction which intersects with the scanning direction at a first movement condition in a first movement period of the substrate which is between exposure termination of the first shot region and exposure start of the second shot region, and the second member is moved to the other side of direction which intersects with the scanning direction at a second movement condition in a second exposure period of the substrate which is between exposure start and exposure termination of the second shot region, the second movement condition being different from the first movement condition.

According to a ninth aspect of the present invention, there is provided an exposure apparatus that sequentially exposes each of a plurality of shot regions of a substrate by exposure light via liquid between an emitting surface of an optical member and the substrate while moving the substrate in a scanning direction with respect to the exposure light emitted from the emitting surface, the exposure apparatus including: a liquid immersion member that includes a first member and a second member and that is configured to form a liquid immersion space of the liquid, the first member being disposed at at least a portion of surrounding of the optical member, the second member being disposed at at least a portion of surrounding of the optical member; a driving apparatus that is configured to move the second member with respect to the first member; and a controller that is configured to control the driving apparatus, wherein, before or after sequential exposures of a plurality of shot regions, which are included in one row on the substrate and are disposed in a direction which intersects with the scanning direction, are performed, shot regions of another row different from the one row are exposed, and the controller controls the driving apparatus and moves the second member with respect to the first member in a movement period of the substrate which is between exposure termination of a shot region of a row and exposure start of a shot region of another row to be exposed next.

According to a tenth aspect of the present invention, there is provided an exposure apparatus that sequentially exposes each of a plurality of shot regions of a substrate by exposure light via liquid between an emitting surface of an optical member and the substrate while moving the substrate in a scanning direction with respect to the exposure light emitted from the emitting surface, the exposure apparatus including: a liquid immersion member that includes a first member and a second member and that is configured to form a liquid immersion space of the liquid, the first member having a first lower surface and being disposed at at least a portion of surrounding of the optical member, the second member having a second upper surface opposite to the first lower surface via a gap and a second lower surface which is capable of opposing the substrate and the second member being disposed at at least a portion of surrounding of an optical path of the exposure light; a driving apparatus that is configured to move the second member with respect to the first member; and a controller that is configured to control the driving apparatus, wherein, before or after sequential exposures of a plurality of shot regions, which are included in one row on the substrate and are disposed in a direction which intersects with the scanning direction, are performed, shot regions of another row different from the one row are exposed, and the controller controls the driving apparatus and moves the second member with respect to the first member in a movement period of the substrate which is between exposure termination of a shot region of a row and exposure start of a shot region of another row to be exposed next.

According to an eleventh aspect of the present invention, there is provided a method of manufacturing a device, including: exposing the substrate using the exposure apparatus according to any one of the first to tenth aspects: and developing the exposed substrate.

According to a twelfth aspect of the present invention, there is provided an exposing method that sequentially exposes each of a plurality of shot regions of a substrate by exposure light via liquid between an emitting surface of an optical member and the substrate while moving the substrate in a scanning direction with respect to the exposure light emitted from the emitting surface, the exposing method including: forming a liquid immersion space of the liquid by using a liquid immersion member that includes a first member and a second member, the first member being disposed at at least a portion of surrounding of the optical member, the second member being disposed at a portion of surrounding of the optical member; sequentially exposing each of a plurality of shot regions by the exposure light emitted from the emitting surface via the liquid of the liquid immersion space, the plurality of shot regions being included in one row on the substrate and being disposed in a direction which intersects with a scanning direction; exposing shot regions of another row different from the one row via the liquid of the liquid immersion space before or after exposing the shot regions included in the one row; and moving the second member with respect to the first member in at least a portion of an exposure of the substrate so that a first operation of the second member in a first movement period of the substrate which is between exposure termination of a first shot region and exposure start of a second shot region is different from a second operation of the second member in a second movement period of the substrate which is between exposure termination of a third shot region and exposure start of a fourth shot region, the first and second shot regions being included in the same row, the third and fourth shot regions being arranged in different rows.

According to a thirteenth aspect of the present invention, there is provided an exposing method that sequentially exposes each of a plurality of shot regions of a substrate by exposure light via liquid between an emitting surface of an optical member and the substrate while moving the substrate in a scanning direction with respect to the exposure light emitted from the emitting surface, the exposing method including: forming a liquid immersion space of the liquid by using a liquid immersion member that includes a first member and a second member, the first member having a first lower surface and being disposed at at least a portion of surrounding of the optical member, the second member having a second upper surface opposite to the first lower surface via a gap and a second lower surface which is capable of opposing to the substrate and the second member being disposed at at least a portion of surrounding of an optical path of the exposure light: sequentially exposing each of a plurality of shot regions by the exposure light emitted from the emitting surface via the liquid of the liquid immersion space, the plurality of shot regions being included in one row on the substrate and being disposed in a direction which intersects with a scanning direction; exposing shot regions of another row different from the one row via the liquid of the liquid immersion space before or after exposing the shot regions included in the one row; and moving the second member with respect to the first member in at least a portion of an exposure of the substrate so that a first operation of the second member in a first movement period of the substrate which is between exposure termination of a first shot region and exposure start of a second shot region is different from a second operation of the second member in a second movement period of the substrate which is between exposure termination of a third shot region and exposure start of a fourth shot region, the first and second shot regions being included in the same row, the third and fourth shot regions being arranged in different rows.

According to a fourteenth aspect of the present invention, there is provided an exposing method that sequentially exposes each of a plurality of shot regions of a substrate by exposure light via liquid between an emitting surface of an optical member and the substrate while moving the substrate in a scanning direction with respect to the exposure light emitted from the emitting surface, the exposing method including: forming a liquid immersion space of the liquid by using a liquid immersion member that includes a first member and a second member, the first member being disposed at at least a portion of surrounding of the optical member, the second member being disposed at a portion of surrounding of the optical member, sequentially exposing first and second shot regions by the exposure light emitted from the emitting surface via the liquid of the liquid immersion space, the first and second shot regions having a first size with respect to the scanning direction; sequentially exposing third and fourth shot regions by the exposure light emitted from the emitting surface via the liquid of the liquid immersion space before or after exposures of the first and second shot regions, the third and fourth shot regions having a second size different from the first size with respect to the scanning direction; and moving the second member with respect to the first member in at least a portion of an exposure of the substrate so that a first operation of the second member in a first movement period of the substrate which is between exposure termination of the first shot region and exposure start of the second shot region is different from a second operation of the second member in a second movement period of the substrate which is between exposure termination of the third shot region and exposure start of the fourth shot region.

According to a fifteen aspect of the present invention, there is provided an exposing method that sequentially exposes each of a plurality of shot regions of a substrate by exposure light via liquid between an emitting surface of an optical member and the substrate while moving the substrate in a scanning direction with respect to the exposure light emitted from the emitting surface, the exposing method including: forming a liquid immersion space of the liquid by using a liquid immersion member that includes a first member and a second member, the first member having a first lower surface and being disposed at at least a portion of surrounding of the optical member, the second member having a second upper surface opposite to the first lower surface via a gap and a second lower surface which is capable of opposing to the substrate and the second member being disposed at at least a portion of surrounding of an optical path of the exposure light; sequentially exposing first and second shot regions by the exposure light emitted from the emitting surface via the liquid of the liquid immersion space, the first and second shot regions having a first size with respect to the scanning direction; sequentially exposing third and fourth shot regions by the exposure light emitted from the emitting surface via the liquid of the liquid immersion space before or after exposures of the first and second shot regions, the third and fourth shot regions having a second size different from the first size with respect to the scanning direction: and moving the second member with respect to the first member in at least a portion of an exposure of the substrate so that a first operation of the second member in a first movement period of the substrate which is between exposure termination of the first shot region and exposure start of the second shot region is different from a second operation of the second member in a second movement period of the substrate which is between exposure termination of the third shot region and exposure start of the fourth shot region.

According to a sixteenth aspect of the present invention, there is provided an exposing method that sequentially exposes each of a plurality of shot regions of a substrate by exposure light via liquid between an emitting surface of an optical member and the substrate while moving the substrate in a scanning direction with respect to the exposure light emitted from the emitting surface, the exposing method including: forming a liquid immersion space of the liquid by using a liquid immersion member that includes a first member and a second member, the first member being disposed at at least a portion of surrounding of the optical member, the second member being disposed at a portion of surrounding of the optical member: sequentially exposing first and second shot regions by the exposure light emitted from the emitting surface via the liquid of the liquid immersion space, the first shot region having a first size with respect to the scanning direction and the second shot region having a second size with respect to the scanning direction; sequentially exposing third and fourth shot regions by the exposure light emitted from the emitting surface via the liquid of the liquid immersion space before or after exposures of the first and second shot regions, the third and fourth shot regions having a third size with respect to the scanning direction: and moving the second member with respect to the first member in at least a portion of an exposure of the substrate so that a first operation of the second member in a first movement period of the substrate which is between exposure termination of the first shot region and exposure start of the second shot region is different from a second operation of the second member in a second movement period of the substrate which is between exposure termination of the third shot region and exposure start of the fourth shot region.

According to a seventeenth aspect of the present invention, there is provided an exposing method that sequentially exposes each of a plurality of shot regions of a substrate by exposure light via liquid between an emitting surface of an optical member and the substrate while moving the substrate in a scanning direction with respect to the exposure light emitted from the emitting surface, the exposing method including: forming a liquid immersion space of the liquid by using a liquid immersion member that includes a first member and a second member the first member having a first lower surface and being disposed at at least a portion of surrounding of the optical member, the second member having a second upper surface opposite to the first lower surface via a gap and a second lower surface which is capable of opposing to the substrate and the second member being disposed at at least a portion of surrounding of an optical path of the exposure light; sequentially exposing first and second shot regions by the exposure light emitted from the emitting surface via the liquid of the liquid immersion space, the first shot region having a first size with respect to the scanning direction and the second shot region having a second size with respect to the scanning direction; sequentially exposing third and fourth shot regions by the exposure light emitted from the emitting surface via the liquid of the liquid immersion space before or after exposures of the first and second shot regions, the third and fourth shot regions having a third size with respect to the scanning direction; and moving the second member with respect to the first member in at least a portion of an exposure of the substrate so that a first operation of the second member in a first movement period of the substrate which is between exposure termination of the first shot region and exposure start of the second shot region is different from a second operation of the second member in a second movement period of the substrate which is between exposure termination of the third shot region and exposure start of the fourth shot region.

According to an eighteenth aspect of the present invention, there is provided an exposing method that sequentially exposes each of a plurality of shot regions of a substrate by exposure light via liquid between an emitting surface of an optical member and the substrate while moving the substrate in a scanning direction with respect to the exposure light emitted from the emitting surface, the exposing method including: forming a liquid immersion space of the liquid by using a liquid immersion member that includes a first member and a second member, the first member being disposed at at least a portion of surrounding of the optical member, the second member being disposed at a portion of surrounding of the optical member: sequentially exposing first and second shot regions of the substrate by the exposure light emitted from the emitting surface via the liquid of the liquid immersion space; moving the second member with respect to the first member in at least a portion of an exposure of the substrate so that the second member is moved at a first movement condition to one side of the direction which intersects with the scanning direction in a first movement period of the substrate which is between exposure termination of the first shot region and exposure start of the second shot region, and the second member is moved at a second movement condition to the other side of the direction which intersects with the scanning direction in a second exposure period of the substrate which is between exposure start and exposure termination of the second shot region, the second movement condition being different from the first movement condition.

According to a nineteenth aspect of the present invention, there is provided an exposing method that sequentially exposes each of a plurality of shot regions of a substrate by exposure light via liquid between an emitting surface of an optical member and the substrate while moving the substrate in a scanning direction with respect to the exposure light emitted from the emitting surface, the exposing method including: forming a liquid immersion space of the liquid by using a liquid immersion member that includes a first member and a second member, the first member having a first lower surface and being disposed at at least a portion of surrounding of the optical member, the second member having a second upper surface opposite to the first lower surface via a gap and a second lower surface which is capable of opposing to the substrate and the second member being disposed at at least a portion of surrounding of an optical path of the exposure light; sequentially exposing first and second shot regions of the substrate by the exposure light emitted from the emitting surface via the liquid of the liquid immersion space; moving the second member with respect to the first member in at least a portion of an exposure of the substrate so that the second member is moved at a first movement condition to one side of the direction which intersects with the scanning direction in a first movement period of the substrate which is between exposure termination of the first shot region and exposure start of the second shot region, and the second member is moved at a second movement condition to the other side of the direction which intersects with the scanning direction in a second exposure period of the substrate which is between exposure start and exposure termination of the second shot region, the second movement condition being different from the first movement condition.

According to a twentieth aspect of the present invention, there is provided an exposing method that sequentially exposes each of a plurality of shot regions of a substrate by exposure light via liquid between an emitting surface of an optical member and the substrate while moving the substrate in a scanning direction with respect to the exposure light emitted from the emitting surface, the exposing method including: forming a liquid immersion space of the liquid by using a liquid immersion member that includes a first member and a second member, the first member being disposed at at least a portion of surrounding of the optical member, the second member being disposed at a portion of surrounding of the optical member, sequentially exposing a plurality of shot regions by the exposure light emitted from the emitting surface via the liquid of the liquid immersion space, the plurality of shot regions being included in one row on the substrate and being disposed in a direction which intersects with the scanning direction; exposing shot regions of another row different from the one row via the liquid of the liquid immersion space before or after of exposure of the shot regions included in the one row: and moving the second member with respect to the first member in a movement period of the substrate which is between exposure termination of a shot region of a row and exposure start of a shot region of different row to be exposed next.

According to a twenty-first aspect of the present invention, there is provided an exposing method that sequentially exposes each of a plurality of shot regions of a substrate by exposure light via liquid between an emitting surface of an optical member and the substrate while moving the substrate in a scanning direction with respect to the exposure light emitted from the emitting surface, the exposing method including: forming a liquid immersion space of the liquid by using a liquid immersion member that includes a first member and a second member, the first member having a first lower surface and being disposed at at least a portion of surrounding of the optical member, the second member having a second upper surface opposite to the first lower surface via a gap and a second lower surface which is capable of opposing to the substrate and the second member being disposed at at least a portion of surrounding of an optical path of the exposure light; sequentially exposing a plurality of shot regions by the exposure light emitted from the emitting surface via the liquid of the liquid immersion space, the plurality of shot regions being included in one row on the substrate and being disposed in a direction which intersects with the scanning direction; exposing shot regions of another row different from the one row via the liquid of the liquid immersion space before or after of exposure of the shot regions included in the one row; and moving the second member with respect to the first member in a movement period of the substrate which is between exposure termination of a shot region of a row and exposure start of a shot region of different row to be exposed next.

According to a twenty-second aspect of the present invention, there is provided a method of manufacturing a device including: exposing the substrate using the exposing method according to any one of the twelfth to twenty-first aspects; and developing the exposed substrate.

According to a twenty-third aspect of the present invention, there is provided a program that causes a computer to execute a control of an exposure apparatus which sequentially exposes each of a plurality of shot regions of a substrate by exposure light via liquid between an emitting surface of an optical member and the substrate while moving the substrate in a scanning direction with respect to the exposure light emitted from the emitting surface, including: forming a liquid immersion space of the liquid by using a liquid immersion member that includes a first member and a second member, the first member having a first lower surface and being disposed at at least a portion of surrounding of the optical member, the second member having a second upper surface opposite to the first lower surface via a gap and a second lower surface which is capable of opposing to the substrate and the second member being disposed at at least a portion of surrounding of an optical path of the exposure light; sequentially exposing each of a plurality of shot regions by the exposure light emitted from the emitting surface via the liquid of the liquid immersion space, the plurality of shot regions being included in one row on the substrate and being disposed in a direction which intersects with a scanning direction; exposing shot regions of another row different from the one row via the liquid of the liquid immersion space before or after exposing the shot regions included in the one row; and moving the second member with respect to the first member in at least a portion of an exposure of the substrate so that a first operation of the second member in a first movement period of the substrate which is between exposure termination of a first shot region and exposure start of a second shot region is different from a second operation of the second member in a second movement period of the substrate which is between exposure termination of a third shot region and exposure start of a fourth shot region, the first and second shot regions being included in the same row, the third and fourth shot regions being arranged in different rows.

According to a twenty-fourth aspect of the present invention, there is provided a program that causes a computer to execute a control of an exposure apparatus which sequentially exposes each of a plurality of shot regions of a substrate by exposure light via liquid between an emitting surface of an optical member and the substrate while moving the substrate in a scanning direction with respect to the exposure light emitted from the emitting surface, including: forming a liquid immersion space of the liquid by using a liquid immersion member that includes a first member and a second member, the first member having a first lower surface and being disposed at at least a portion of surrounding of the optical member, the second member having a second upper surface opposite to the first lower surface via a gap and a second lower surface which is capable of opposing to the substrate and the second member being disposed at at least a portion of surrounding of an optical path of the exposure light: sequentially exposing first and second shot regions by the exposure light emitted from the emitting surface via the liquid of the liquid immersion space, the first and second shot regions having a first size with respect to the scanning direction; sequentially exposing third and fourth shot regions by the exposure light emitted from the emitting surface via the liquid of the liquid immersion space before or after exposures of the first and second shot regions, the third and fourth shot regions having a second size different from the first size with respect to the scanning direction; and moving the second member with respect to the first member in at least a portion of an exposure of the substrate so that a first operation of the second member in a first movement period of the substrate which is between exposure termination of the first shot region and exposure start of the second shot region is different from a second operation of the second member in a second movement period of the substrate which is between exposure termination of the third shot region and exposure start of the fourth shot region.

According to a twenty-fifth aspect of the present invention, there is provided a program that causes a computer to execute a control of an exposure apparatus which sequentially exposes each of a plurality of shot regions of a substrate by exposure light via liquid between an emitting surface of an optical member and the substrate while moving the substrate in a scanning direction with respect to the exposure light emitted from the emitting surface, including: forming a liquid immersion space of the liquid by using a liquid immersion member that includes a first member and a second member, the first member having a first lower surface and being disposed at at least a portion of surrounding of the optical member, the second member having a second upper surface opposite to the first lower surface via a gap and a second lower surface which is capable of opposing to the substrate and the second member being disposed at at least a portion of surrounding of an optical path of the exposure light: sequentially exposing first and second shot regions by the exposure light emitted from the emitting surface via the liquid of the liquid immersion space, the first shot region having a first size with respect to the scanning direction and the second shot region having a second size with respect to the scanning direction: sequentially exposing third and fourth shot regions by the exposure light emitted from the emitting surface via the liquid of the liquid immersion space before or after exposures of the first and second shot regions, the third and fourth shot regions having a third size with respect to the scanning direction; and moving the second member with respect to the first member in at least a portion of an exposure of the substrate so that a first operation of the second member in a first movement period of the substrate which is between exposure termination of the first shot region and exposure start of the second shot region is different from a second operation of the second member in a second movement period of the substrate which is between exposure termination of the third shot region and exposure start of the fourth shot region.

According to a twenty-sixth aspect of the present invention, there is provided a program that causes a computer to execute a control of an exposure apparatus which sequentially exposes each of a plurality of shot regions of a substrate by exposure light via liquid between an emitting surface of an optical member and the substrate while moving the substrate in a scanning direction with respect to the exposure light emitted from the emitting surface, including: forming a liquid immersion space of the liquid by using a liquid immersion member that includes a first member and a second member, the first member having a first lower surface and being disposed at at least a portion of surrounding of the optical member, the second member having a second upper surface opposite to the first lower surface via a gap and a second lower surface which is capable of opposing to the substrate and the second member being disposed at at least a portion of surrounding of an optical path of the exposure light; sequentially exposing first and second shot regions of the substrate by the exposure light emitted from the emitting surface via the liquid of the liquid immersion space; and moving the second member with respect to the first member in at least a portion of an exposure of the substrate so that the second member is moved at a first movement condition to one side of the direction which intersects with the scanning direction in a first movement period of the substrate which is between exposure termination of the first shot region and exposure start of the second shot region, and the second member is moved at a second movement condition to the other side of the direction which intersects with the scanning direction in a second exposure period of the substrate which is between exposure start and exposure termination of the second shot region, the second movement condition being different from the first movement condition.

According to a twenty-seventh aspect of the present invention, there is provided a program that causes a computer to execute a control of an exposure apparatus which sequentially exposes each of a plurality of shot regions of a substrate by exposure light via liquid between an emitting surface of an optical member and the substrate while moving the substrate in a scanning direction with respect to the exposure light emitted from the emitting surface, including: forming a liquid immersion space of the liquid by using a liquid immersion member that includes a first member and a second member, the first member having a first lower surface and being disposed at at least a portion of surrounding of the optical member, the second member having a second upper surface opposite to the first lower surface via a gap and a second lower surface which is capable of opposing to the substrate and the second member being disposed at at least a portion of surrounding of an optical path of the exposure light; sequentially exposing a plurality of shot regions by the exposure light emitted from the emitting surface via the liquid of the liquid immersion space, the plurality of shot regions being included in one row on the substrate and being disposed in a direction which intersects with the scanning direction: exposing shot regions of another row different from the one row via the liquid of the liquid immersion space before or after of exposure of the shot regions included in the one row; and moving the second member with respect to the first member in a movement period of the substrate which is between exposure termination of a shot region of a row and exposure start of a shot region of different row to be exposed next.

According to a twenty-eighth aspect of the present invention, there is provided a computer-readable recording medium on which the program according to any one of the twenty-third to twenty-seventh aspects is recorded.

According to the aspects of the present invention, occurrence of exposure failure can be suppressed. In addition, according to the aspects of the present invention, occurrence of a defective device can be suppressed.

DESCRIPTION OF THE EMBODIMENTS

Figure 1:
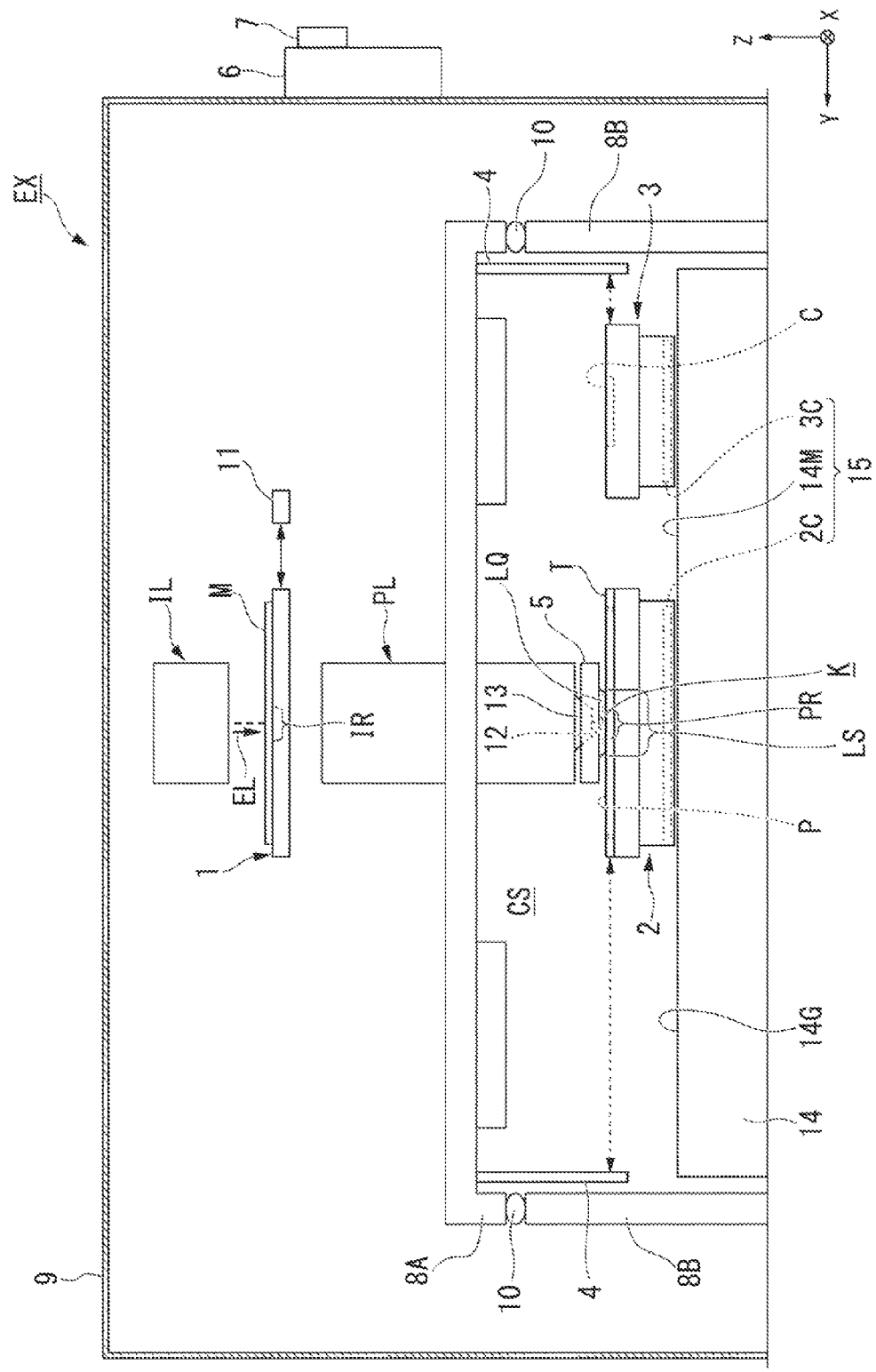
FIG. 1 is a view showing an example of an exposure apparatus according to a first embodiment.

Hereinafter, embodiments of the present invention will be described referring to the drawings. However, the present invention is not limited thereto. In the descriptions below, an XYZ rectangular coordinate system is set, and a positional relationship of each portion will be described referring to the XYZ rectangular coordinate system. A predetermined direction in a horizontal surface is set to an X axis direction, a direction orthogonal to the X axis direction in the horizontal surface is set to a Y axis direction, and a direction (that is, a vertical direction) orthogonal to each of the X axis direction and the Y axis direction is set to a Z axis direction. Moreover, the rotation (inclination) directions around the X axis, the Y axis, and the Z axis are set to the θX direction, the θY direction, and the θZ direction.

<First Embodiment>

A first embodiment will be described. FIG. 1 is a schematic configuration view showing an example of an exposure apparatus EX according to the first embodiment. The exposure apparatus EX of the present embodiment is a liquid immersion exposure apparatus which exposes a substrate P via a liquid LQ using exposure light EL. In the present embodiment, a liquid immersion space LS is formed so that an optical path K of the exposure light EL which is radiated to the substrate P is filled with the liquid LQ. The liquid immersion space LS means a portion (space or region) which is filled with the liquid. The substrate P is exposed by the exposure light EL via the liquid LQ in the liquid immersion space LS. In the present embodiment, water (pure water) is used for the liquid LQ.

For example, the exposure apparatus EX of the present embodiment is an exposure apparatus which includes a substrate stage and a measurement stage as disclosed in U.S. Pat. No. 6,897,963, European Patent Application Publication No. 1713113, or the like.

In FIG. 1, the exposure apparatus EX includes: a mask stage 1 which is movable while holding a mask M; a substrate stage 2 which is movable while holding a substrate P; a measurement stage 3 which does not hold the substrate P, and which is movable while mounting a measurement member (measurement instrument) C which measures the exposure light EL; a measurement system 4 which measures positions of the substrate stage 2 and the measurement stage 3; an illumination system IL which illuminates the mask M with the exposure light EL; a projection optical system PL which projects an image of a pattern of the mask M which is illuminated with the exposure light EL to the substrate P; a liquid immersion member 5 which forms the liquid immersion space LS of a liquid LQ: a controller 6 which controls an operation of the entire exposure apparatus EX; and a storage apparatus 7 which is connected to the controller 6 and stores various information with respect to the exposure.

Moreover, the exposure apparatus EX includes a reference frame 8A which supports the projection optical system PL and various measurement systems including the measurement system 4, an apparatus frame 8B which supports the reference frame 8A, and a vibration isolator 10 which is disposed between the reference frame 8A and the apparatus frame 8B, and suppresses transmission of vibration from the apparatus frame 8B to the reference frame 8A. The vibration isolator 10 includes a spring apparatus or the like. In the present embodiment, the vibration isolator 10 includes a gas spring (for example, air mount). In addition, either one of a detection system which detects an alignment mark of the substrate P and a detection system which detects the position of the surface of an object such as the substrate P, or both detection systems may be supported by the reference frame 8A.

In addition, the exposure apparatus EX includes a chamber apparatus 9 which adjusts an environment (at least one of temperature, humidity, pressure, and a degree of cleanness) of a space CS to which the exposure light EL advances. At least the projection optical system PL, the liquid immersion member 5, the substrate stage 2, and the measurement stage 3 are disposed in the space CS. In the present embodiment, at least a portion of the mask stage 1 and the illumination system IL is also disposed in the space CS.

The mask M includes a reticle on which a device pattern projected to the substrate P is formed. For example, the mask M includes a transmission type mask which includes a transparent plate such as a glass plate, and a pattern formed on the transparent plate using a light-shielding material such as chromium. Moreover, a reflection type mask may be used for the mask M.

The substrate P is a substrate for manufacturing a device. For example, the substrate P includes a base material such as a semiconductor wafer and a photosensitive film which is formed on the base material. The photosensitive film is a film of a photosensitive material (photoresist). Moreover, the substrate P may include another film in addition to the photosensitive film. For example, the substrate P may include an antireflection film and a protective film (top coat film) which protects the photosensitive film.

The illumination system IL radiates the exposure light EL to an illumination region IR. The illumination region IR includes positions which can be radiated with the exposure light EL emitted from the illumination system IL. The illumination system IL illuminates at least a portion of the mask M disposed in the illumination region IR by the exposure light EL having a uniform illumination distribution. For example, as for the exposure light EL which is emitted from the illumination system IL, far-ultraviolet light (DUV light) such as a bright line (g-line, h-line, i-line) emitted from a mercury lamp and KrF excimer laser light (248 nm in wavelength), ArF excimer laser light (193 nm in wavelength), vacuum-ultraviolet light (VUV light) such as $F_2$ laser light (157 nm in wavelength), and the like are used. In the present embodiment, as for the exposure light EL, ArF excimer laser light, which is an ultraviolet light (vacuum-ultraviolet light), is used.

The mask stage 1 is movable in a state where it holds the mask M. For example, the mask stage 1 is moved by an operation of a driving system 11 which includes a planar motor as disclosed in U.S. Pat. No. 6,452,292. In the present embodiment, the mask stage 1 is able to move in six directions of the X axis, the Y axis, the Z axis, the θX, the θY, and the θZ by the operation of the driving system 11. Moreover, the driving system 11 may not include a planar motor. For example, the driving system 11 may include a linear motor.

The projection optical system PL radiates the exposure light EL to a projection region PR. The projection region PR includes positions which can be irradiated with the exposure light EL emitted from the projection optical system PL. The projection optical system PL projects the image of the pattern of the mask M on at least a portion of the substrate P disposed in the projection region PR by a predetermined projection magnification. In the present embodiment, the projection optical system PL is a reduction system. The projection magnification of the projection optical system PL is ¼. In addition, the projection magnification of the projection optical system PL may be ⅕, ⅛, or the like. Moreover, the projection optical system PL may be either an equal magnification system or an enlargement system. In the present embodiment, the optical axis of the projection optical system PL is parallel to the Z axis. The projection optical system PL may be any of a refraction system which does not include a reflective optical element, a reflection system which does not include a refractive optical element, or a reflective refraction system which includes the reflective optical element and the refractive optical element. The projection optical system PL may form either an inverted image or an erected image.

The projection optical system PL includes a terminal optical element 13 which includes an emitting surface 12 from which the exposure light EL is emitted. The terminal optical element 13 is an optical member which is a part of the projection optical system PL. The emitting surface 12 emits the exposure light EL toward the image surface of the projection optical system PL. The terminal optical element 13 is an optical element nearest to the image surface of the projection optical system PL among the plurality of optical elements of the projection optical system PL. The projection region PR includes positions which can be irradiated with the exposure light EL emitted from the emitting surface 12.

In the present embodiment, the emitting surface 12 faces the −Z axis direction. The exposure light EL emitted from the emitting surface 12 advances in the −Z axis direction. The emitting surface 12 is parallel to the XY plane. Moreover, the emitting surface 12 facing the −Z axis direction may have a convex surface or a concave surface. In addition, the emitting surface 12 may be inclined with respect to the XY plane and include a curved surface. In the present embodiment, the optical axis of the terminal optical element 13 is parallel to the Z axis.

With respect to the direction parallel to the optical axis of the terminal optical element 13, the emitting surface 12 side is at the −Z side, and the incident surface side is at the +Z side. With respect to the direction parallel to the optical axis of the projection optical system PL, the image surface side of the projection optical system PL is at the −Z side, and the object surface side of the projection optical system PL is at the +Z side.

The substrate stage 2 is able to move in the XY plane, which includes positions (projection region PR) which can be irradiated with the exposure light EL from the emitting surface 12, in a state where the substrate stage holds the substrate P. The measurement stage 3 is able to move in the XY plane, which includes positions (projection region PR) which can be irradiated with the exposure light EL from the emitting surface 12, in a state where a measurement member (measurement instrument) C is mounted on the measurement stage. Each of the substrate stage 2 and the measurement stage 3 is able to move on a guide surface 14G of a base member 14. The guide surface 14G and the XY plane are substantially parallel to each other.

The substrate stage 2 includes a first holding portion which releasably holds the substrate P and a second holding portion which is disposed at the surrounding of the first holding portion and releasably holds a cover member T as disclosed in, for example, United States Patent Application Publication No. 2007/0177125, United States Patent Application Publication No. 2008/0049209, and the like. The first holding portion holds the substrate P so that the surface (upper surface) of the substrate P and the XY plane are substantially parallel to each other. The upper surface of the substrate P held by the first holding portion and the upper surface of the cover member T held by the second holding portion are disposed in a substantially same plane.

With respect to the Z axis direction, a distance between the emitting surface 12 and the upper surface of the substrate P held by the first holding portion is substantially the same as a distance between the emitting surface 12 and the upper surface of the cover member T held by the second holding portion. Moreover, with respect to the Z axis direction, a situation in which the distance between the emitting surface 12 and the upper surface of the substrate P is substantially the same as the distance between the emitting surface 12 and the upper surface of the cover member T includes a situation in which the difference between the distance between the emitting surface 12 and the upper surface of the substrate P and the distance between the emitting surface 12 and the upper surface of the cover member T is within, for example, 10% of the distance (a so-called working distance) between the emitting surface 12 and the upper surface of the substrate P when the substrate P is exposed. In addition, the upper surface of the substrate P held by the first holding portion and the upper surface of the cover member T held by the second holding portion may not be disposed in the same plane. For example, with respect to the Z axis direction, the position of the upper surface of the substrate P and the position of the upper surface of the cover member T may be different from each other. For example, there may be a step between the upper surface of the substrate P and the upper surface of the cover member T. In addition, the upper surface of the cover member T may be inclined with respect to the upper surface of the substrate P, and the upper surface of the cover member T may include a curved surface.

The substrate stage 2 and the measurement stage 3 are moved by an operation of a driving system 15 which includes a planar motor as disclosed in, for example, U.S. Pat. No. 6,452,292. The driving system 15 includes a mover 2C which is disposed at the substrate stage 2, a mover 3C which is disposed at the measurement stage 3, and a stator 14M which is disposed at the base member 14. Each of the substrate stage 2 and the measurement stage 3 is able to move on a guide surface 14G in six directions of the X axis, the Y axis, the Z axis, the θX, the θY, and the θZ directions by the operation of the driving system 15. Moreover, the driving system 15 may not include a planar motor. The driving system 15 may include a linear motor.

The measurement system 4 includes an interferometer system. The interferometer system includes a unit which radiates measurement light to a measurement mirror of the substrate stage 2 and a measurement mirror of the measurement stage 3 and measures the positions of the substrate stage 2 and the measurement stage 3. In addition, for example, the measurement system may include an encoder system as disclosed in United States Patent Application Publication No. 2007/0288121. In addition, the measurement system 4 may include only one of the interferometer system and the encoder system.

When exposure processing of the substrate P is performed, or when predetermined measurement processing is performed, the controller 6 performs a position control of the substrate stage 2 (substrate P) and the measurement stage 3 (measurement member C) based on the measurement results of the measurement system 4.

Figure 2:
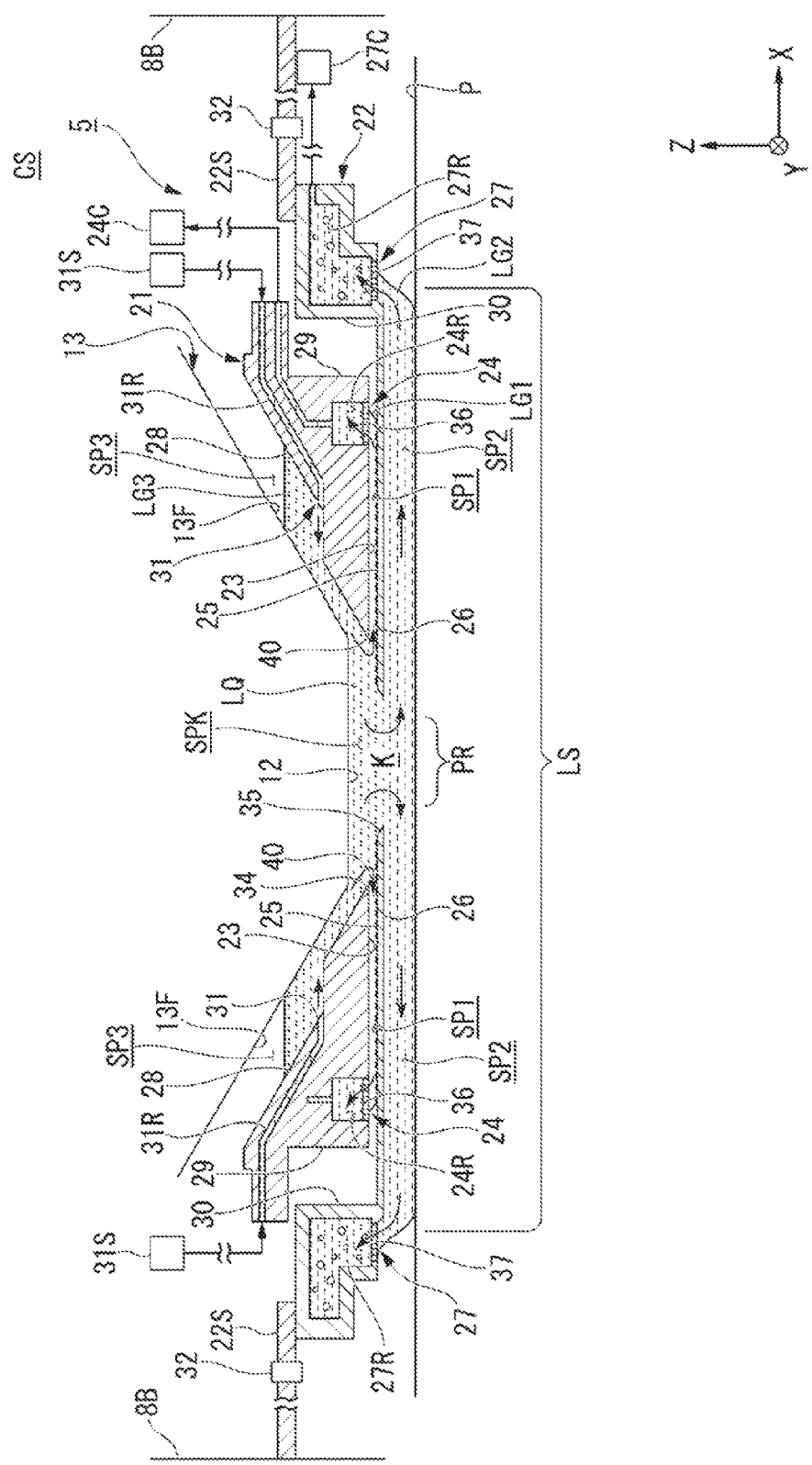
FIG. 2 is a side cross-sectional view showing an example of a liquid immersion member according to the first embodiment.
Figure 3:
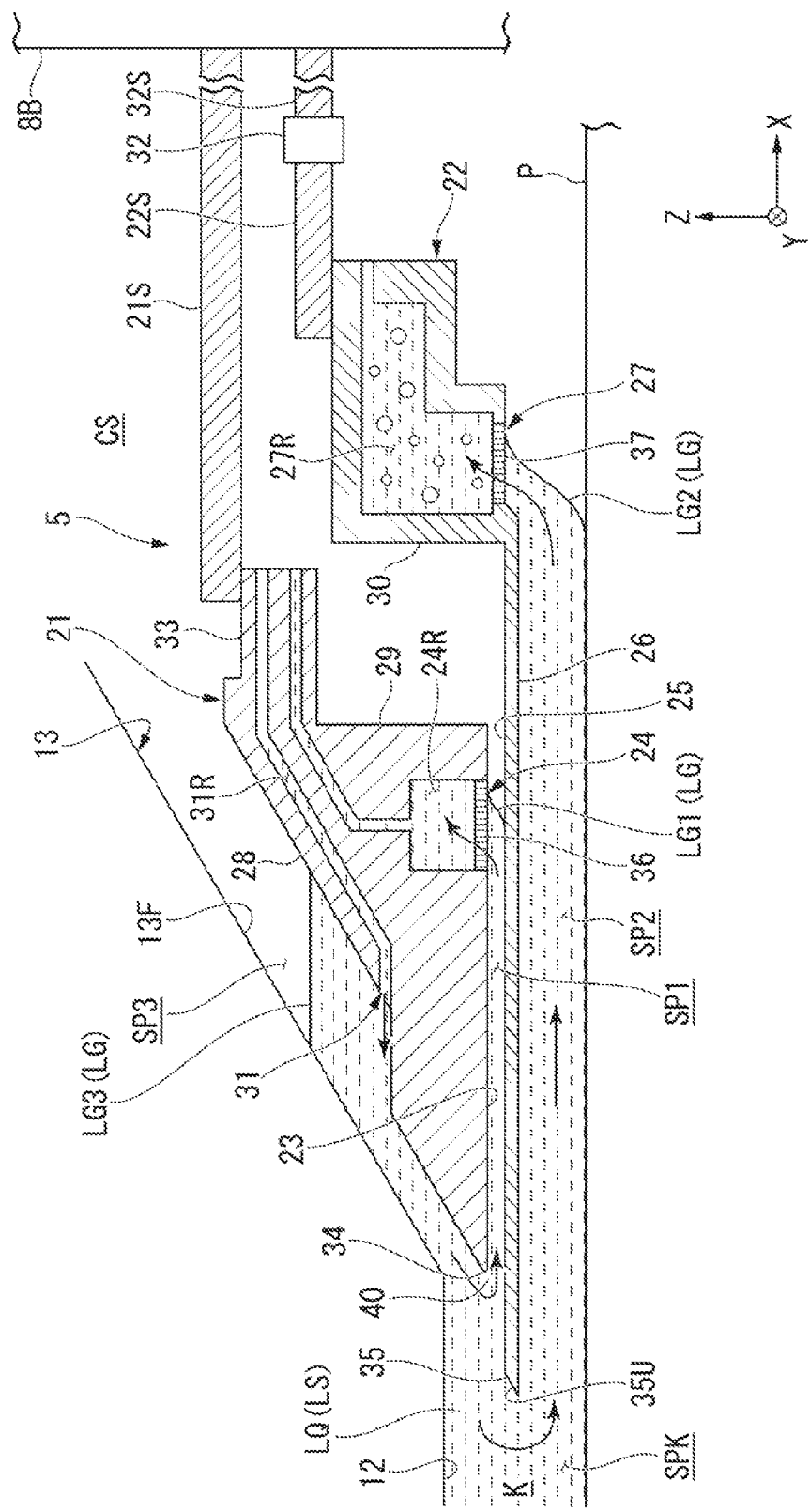
FIG. 3 is a side cross-sectional view showing a portion of the liquid immersion member according to the first embodiment.
Figure 4:
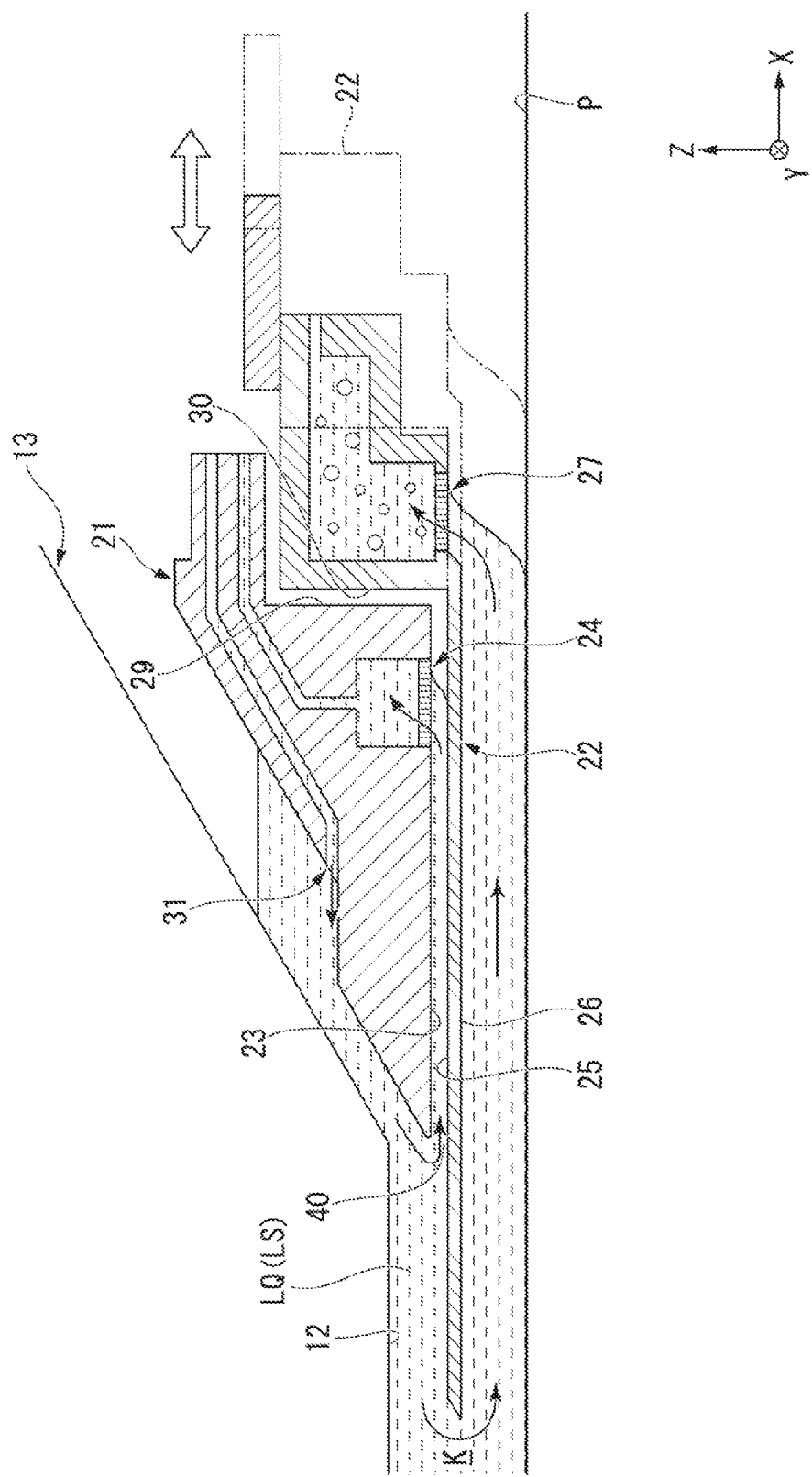
FIG. 4 is a view showing an example of an operation of the liquid immersion member according to the first embodiment.
Figure 5:
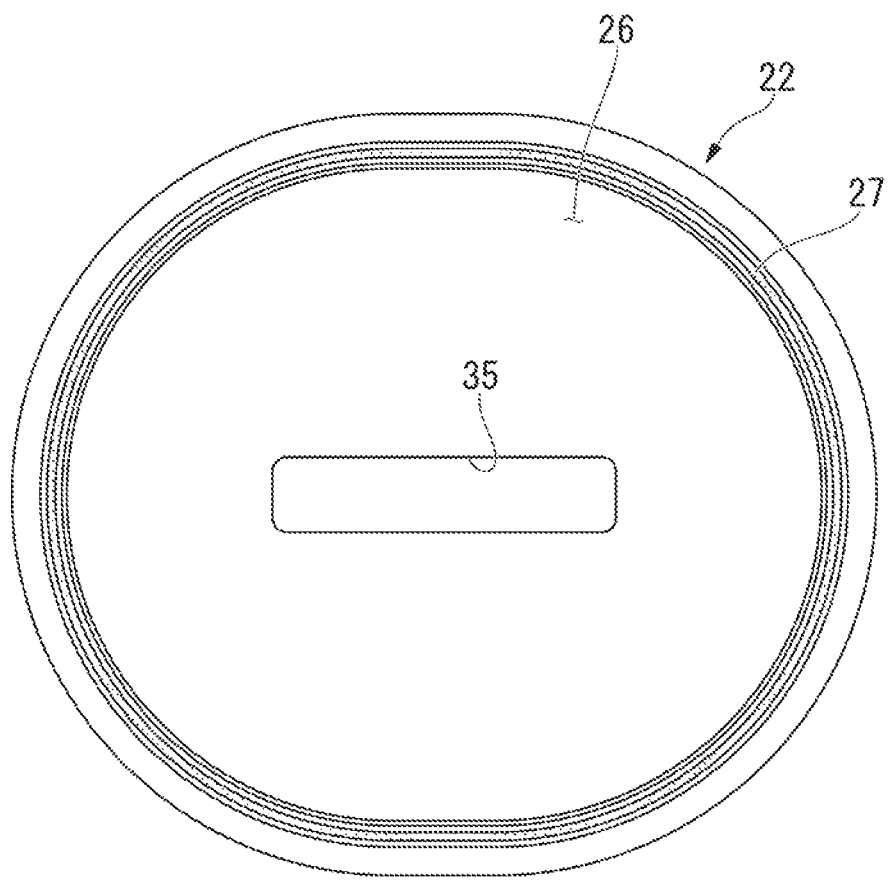
FIG. 5 is a view when the liquid immersion member according to the first embodiment is viewed from below.
Figure 5:
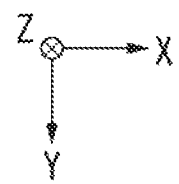
Figure 6:
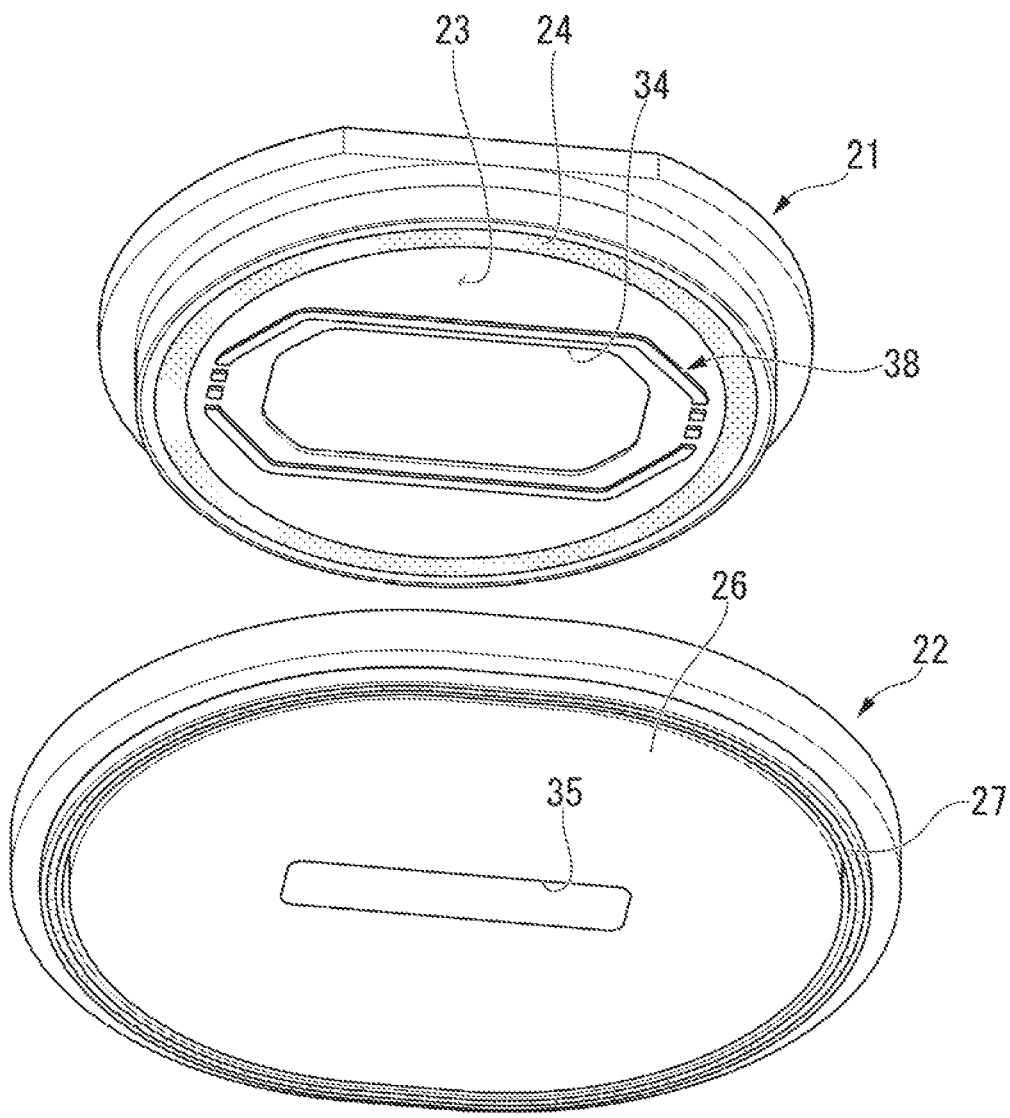
FIG. 6 is an exploded perspective view showing an example of the liquid immersion member according to the first embodiment.
Figure 7:
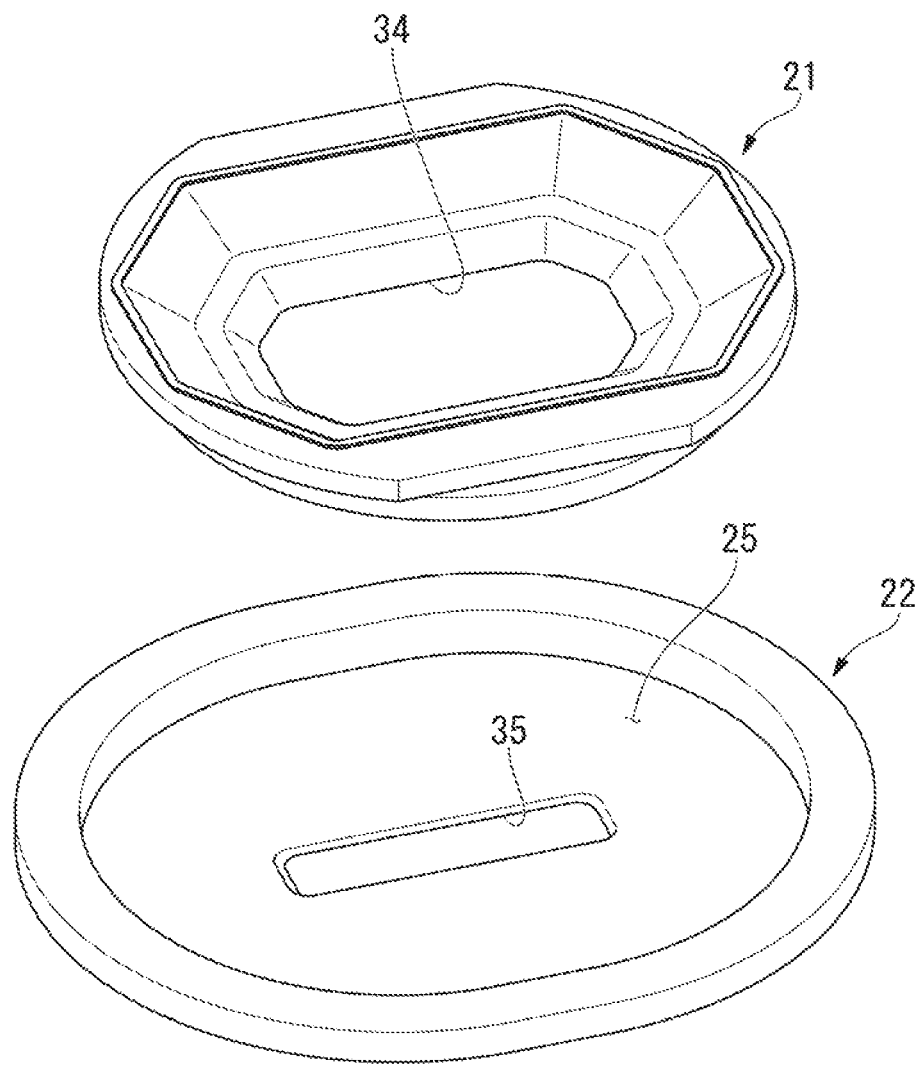
FIG. 7 is an exploded perspective view showing an example of the liquid immersion member according to the first embodiment.

Next, the liquid immersion member 5 according to the present embodiment will be described. In addition, the liquid immersion member may also be referred to as a nozzle member. FIG. 2 is a cross-sectional view of the liquid immersion member 5 parallel to the XZ plane. FIG. 3 is a view in which a portion of FIG. 2 is enlarged. FIG. 4 is a view showing an example of the operation of the liquid immersion member 5. FIG. 5 is a view when the liquid immersion member 5 is viewed from below (−Z side). FIGS. 6 and 7 are exploded perspective views of the liquid immersion member 5.

The liquid immersion member 5 forms a liquid immersion space LS of the liquid LQ above the object which is movable below the terminal optical element 13.

The object which is movable below the terminal optical element 13 is able to move in the XY plane which includes the position opposite to the emitting surface 12. The object is able to be opposite to the emitting surface 12 and be disposed in the projection region PR. The object is able to move below the liquid immersion member 5 and is able to be opposite to the liquid immersion member 5. In the present embodiment, the object includes at least one of at least a portion of the substrate stage 2 (for example, the cover member T of the substrate stage 2), the substrate P which is held by the substrate stage 2 (first holding portion), and the measurement stage 3. In the exposure of the substrate P, the liquid immersion space LS is formed so that the optical path K of the exposure light EL between the emitting surface 12 of the terminal optical element 13 and the substrate P is filled with the liquid LQ. When the exposure light EL is radiated to the substrate P, the liquid immersion space LS is formed so that only a portion of the surface region of the substrate P which includes the projection region PR is covered by the liquid LQ.

In the descriptions below, the object is the substrate P. Moreover, as described above, the object may be at least one of the substrate stage 2 and the measurement stage 3, and the object may be other than the substrate P, the substrate stage 2, and the measurement stage 3.

There is a case in which the liquid immersion space LS may be formed over two objects. For example, there is a case in which the liquid immersion space LS may be formed over the cover member T of the substrate stage 2 and the substrate P. There is a case in which the liquid immersion space LS may be formed over the substrate stage 2 and the measurement stage 3.

The liquid immersion space LS is formed so that the optical path K of the exposure light EL emitted from the emitting surface 12 of the terminal optical element 13 is filled with the liquid LQ. At least a portion of the liquid immersion space LS is formed in a space between the terminal optical element 13 and the substrate P (object). At least a portion of the liquid immersion space LS is formed in a space between the liquid immersion member 5 and the substrate P (object).

The liquid immersion member 5 includes a first member 21 which is disposed at at least a portion of the surrounding of the terminal optical element 13, and a second member 22 which is disposed at at least a portion of the surrounding of the optical path K below the first member 21. The second member 22 is movable with respect to the first member 21.

The first member 21 is disposed at a position further away from the substrate P (object) than the second member 22. At least a portion of the second member 22 is disposed between the first member 21 and the substrate P (object). At least a portion of the second member 22 is disposed between the terminal optical element 13 and the substrate P (object). In addition, the second member 22 may not be disposed between the terminal optical element 13 and the substrate P (object).

The first member 21 includes a lower surface 23 facing the −Z axis direction and a liquid recovery part 24 that is disposed at at least a portion of the surrounding of the lower surface 23 and that is capable of recovering the liquid LQ. The liquid recovery part 24 may be referred to as a fluid recovery part that is capable of recovering a fluid (liquid LQ and/or air). The second member 22 includes an upper surface 25 facing the +Z axis direction, a lower surface 26 facing the −Z axis direction, and a fluid recovery part 27 which is disposed at at least a portion of the surrounding of the lower surface 26. The liquid recovery part 24 recovers at least a portion of the liquid LQ of the liquid immersion space LS. The fluid recovery part 27 recovers at least a portion of the liquid LQ of the liquid immersion space LS. The lower surface 23 may be referred to as a first lower surface. The upper surface 25 may be referred to as a second upper surface. The lower surface 26 may be referred to as a second lower surface.

The first member 21 includes an inner surface 28 which is opposite to a side surface 13F of the terminal optical element 13, and an outer surface 29 toward the outside with respect to the optical path K (optical axis of the terminal optical element 13). The second member 22 includes an inner surface 30 which is opposite to the outer surface 29 via a gap. The inner surface 28 of the first member 21 may be referred to as facing surface.

The inner surface 28 of the first member 21 is opposite to the side surface 13F of the terminal optical element 13 via a gap.

The second member 22 is able to be opposite to the lower surface 23. The second member 22 is able to be opposite to the liquid recovery part 24. At least a portion of the upper surface 25 of the second member 22 is opposite to the lower surface 23 via a gap. At least a portion of the upper surface 25 is opposite to the emitting surface 12 via a gap. Moreover, the upper surface 25 may not be opposite to the emitting surface 12.

The substrate P (object) is able to be opposite to the lower surface 26. The substrate P (object) is able to be opposite to at least a portion of the fluid recovery part 27. At least a portion of the upper surface of the substrate P is opposite to the lower surface 26 via a gap. At least a portion of the upper surface of the substrate P is opposite to the emitting surface 12 via a gap.

In the Z axis direction, a size of the gap between the upper surface of the substrate P (object) and the emitting surface 12 is larger than a size of the gap between the upper surface of the substrate P and the lower surface 26. Moreover, the size of the gap between the upper surface of the substrate P (object) and the emitting surface 12 may be substantially the same as the size of the gap between the upper surface of the substrate P and the lower surface 26. In addition, the size of the gap between the upper surface of the substrate P (object) and the emitting surface 12 may be smaller than a size of the gap between the upper surface of the substrate P and the lower surface 26.

A first space SP1 is formed between the lower surface 23 and the upper surface 25. A second space SP2 is formed between the lower surface 26 and the upper surface of the substrate P (object). A third space SP3 is formed between the side surface 13F and the inner surface 28.

The upper surface 25 has liquid repellent property against the liquid LQ. In the present embodiment, the upper surface 25 includes a surface of a resin film which includes fluorine. The upper surface 25 include a surface of a PFA (Tetra fluoro ethylene-perfluoro alkylvinyl ether copolymer) film. Moreover, the upper surface 25 may include a surface of PTFE (Poly tetra fluoro ethylene) film. A contact angle of the upper surface 25 with respect to the liquid LQ is larger than 90°. In addition, for example, the contact angle of the upper surface 25 with respect to the liquid LQ may be larger than 100°, may be larger than 110°, and may be larger than 120°.

Since the upper surface 25 has liquid repellent property with respect to the liquid LQ, occurrence of a gas portion in the liquid LQ in the first space SP1 or mixing of bubbles into the liquid LQ is suppressed.

Moreover, the contact angle of the upper surface 25 with respect to the liquid LQ may be larger than the contact angle of the upper surface of the substrate P with respect to the liquid LQ. In addition, the contact angle of the upper surface 25 with respect to the liquid LQ may be smaller than the contact angle of the upper surface of the substrate P with respect to the liquid LQ. Moreover, the contact angle of the upper surface 25 with respect to the liquid LQ may be substantially equal to the contact angle of the upper surface of the substrate P with respect to the liquid LQ.

In addition, the upper surface 25 may have a hydrophilic property with respect to the liquid LQ. The contact angle of the upper surface 25 with respect to the liquid LQ may be smaller than 90°, may be smaller than 80°, and may be smaller than 70°. Accordingly, the liquid LQ smoothly flows in the first space SP1.

Moreover, the lower surface 23 may have liquid repellent property with respect to liquid LQ. For example, both of the lower surface 23 and the upper surface 25 may have liquid repellent property with respect to liquid LQ. The contact angle of the lower surface 23 with respect to the liquid LQ may be larger than 90°, may be larger than 100°, may be larger than 100°, and may be larger than 120°.

In addition, the lower surface 23 may have liquid repellent property with respect to the liquid LQ, and the upper surface 25 may have hydrophilic property with respect to the liquid LQ. The contact angle of the lower surface 23 with respect to the liquid LQ may be larger than the contact angle of the upper surface 25 with respect to the liquid LQ.

Moreover, the lower surface 23 may have hydrophilic property with respect to the liquid LQ. For example, both of the lower surface 23 and the upper surface 25 may have hydrophilic property with respect to liquid LQ. The contact angle of the lower surface 23 with respect to the liquid LQ may be smaller than 90°, may be smaller than 80°, and may be smaller than 70°.

In addition, the lower surface 23 may have hydrophilic property with respect to the liquid LQ, and the upper surface 25 may have liquid repellent property with respect to the liquid LQ. The contact angle of the lower surface 23 with respect to the liquid LQ may be smaller than the contact of the upper surface 25 with respect to the liquid LQ.

In the present embodiment, the lower surface 26 has hydrophilic property with respect to the liquid LQ. The contact angle of the lower surface 26 with respect to the liquid LQ may be smaller than 90°, may be smaller than 80°, and may be smaller than 70°. In the present embodiment, the contact angle of the lower surface 26 with respect to the liquid LQ is smaller than the contact angle of the upper surface of the substrate P with respect to the liquid LQ. Moreover, the contact angle of the lower surface 26 with respect to the liquid LQ may be larger than or be substantially equal to the contact angle of the upper surface of the substrate P with respect to the liquid LQ.

The side surface 13F of the terminal optical element 13 is disposed at the surrounding of the emitting surface 12. The side surface 13F is a non-emitting surface from which the exposure light EL is not emitted. The exposure light EL passes through the emitting surface 12 and does not pass through the side surface 13F.

The lower surface 23 of the first member 21 does not recover the liquid LQ. The lower surface 23 is a non-recovery part and is not able to recover the liquid LQ. The lower surface 23 of the first member 21 is able to hold the liquid LQ between the lower surface and the second member 22.

The upper surface 25 of the second member 22 does not recover the liquid LQ. The upper surface 25 is a non-recovery part and is not able to recover the liquid LQ. The upper surface 25 of the second member 22 is able to hold the liquid LQ between the upper surface 25 and the first member 21.

The lower surface 26 of the second member 22 does not recover the liquid LQ. The lower surface 26 is a non-recovery part and is not able to recover the liquid LQ. The lower surface 26 of the second member 22 is able to hold the liquid LQ between the substrate P (object) and the lower surface 26.

The inner surface 28, the outer surface 29, and the inner surface 30 do not recover the liquid LQ. The inner surface 28, the outer surface 29, and the inner surface 30 are non-recovery parts and they are not able to recover the liquid LQ.

In the present embodiment, the lower surface 23 is substantially parallel to the XY plane. The upper surface 25 is also substantially parallel to the XY plane. The lower surface 26 is also substantially parallel to the XY plane. That is, the lower surface 23 and the upper surface 25 are substantially parallel to each other. The upper surface 25 and the lower surface 26 are substantially parallel to each other.

Moreover, the lower surface 23 may not be parallel to the XY plane. The lower surface 23 may be inclined with respect to the XY plane and may include a curved surface.

In addition, the upper surface 25 may not be parallel to the XY plane. The upper surface 25 may be inclined with respect to the XY plane and may include a curved surface.

Moreover, the lower surface 26 may not be parallel to the XY plane. The lower surface 26 may be inclined with respect to the XY plane and may include a curved surface.

In addition, the lower surface 23 and the upper surface 25 may be parallel to each other and may not be parallel to each other. The upper surface 25 and the lower surface 26 may be parallel to each other or may not be parallel to each other. The lower surface 23 and the lower surface 26 may be parallel to each other and may not be parallel to each other.

The first member 21 includes an opening 34 through which the exposure light EL emitted from the emitting surface 12 is able to pass. The second member 22 includes an opening 35 through which the exposure light EL emitted from the emitting surface 12 is able to pass. The opening 34 may be referred to as a first opening and the opening 35 may be referred to as a second opening. At least a portion of the terminal optical element 13 is disposed at the inner side of the opening 34. The lower surface 23 is arranged at the surrounding of the lower end of the opening 34. The upper surface 25 is arranged at the surrounding of the upper end of the opening 35. The lower surface 26 is arranged at the surrounding of the lower end of the opening 35.

In the present embodiment, at least a portion of an inner surface 35U of the second member 22 is inclined upwardly and outwardly in a radial direction from the optical path K. At least a part of the inner surface 35U of the second member 22 defines the opening 35 which faces the optical path K. Accordingly, the second member 22 is able to smoothly move in a state where the inner surface 35U of the second member 22 is disposed at the liquid immersion space LS. Moreover, even when the second member 22 moves in a state where the inner surface 35U of the second member 22 is disposed at the liquid immersion space LS, a change in a pressure of the liquid LQ in the liquid immersion space LS is suppressed.

The size of the opening 34 in the XY plane is larger than the size of the opening 35. With respect to the X axis direction, the size of the opening 34 is larger than the size of the opening 35. With respect to the Y axis direction, the size of the opening 34 is larger than the size of the opening 35. In the present embodiment, the first member 21 is not disposed immediately below the emitting surface 12. The opening 34 of the first member 21 is disposed at the surrounding of the emitting surface 12. The opening 34 is larger than the emitting surface 12. The lower end of the gap which is formed between the side surface 13F of the terminal optical element 13 and the first member 21 faces the upper surface 25 of the second member 22. Moreover, the opening 35 of the second member 22 is disposed to be opposite to the emitting surface 12. In the present embodiment, the shape of the opening 35 in the XY plane is a rectangular shape. The opening 35 is long in the X axis direction. Moreover, the shape of the opening 35 may be an elliptical shape which is long in the X axis direction and may be a polygonal shape which is long in the X axis direction.

In addition, the size of the opening 34 may be smaller than the size of the opening 35. Moreover, the size of the opening 34 may be substantially the same as the size of the opening 35.

The first member 21 is disposed at the surrounding of the terminal optical element 13. The first member 21 is an annular member. The first member 21 is disposed so as not to contact the terminal optical element 13. A gap is formed between the first member 21 and the terminal optical element 13. The first member 21 is not opposite to the emitting surface 12. Moreover, a portion of the first member 21 may not be opposite to the emitting surface 12. That is, a portion of the first member 21 may be disposed between the emitting surface 12 and the upper surface of the substrate P (object). In addition, the first member 21 may not be annular. For example, the first member 21 may be disposed at a portion of the surrounding of the terminal optical element 13 (optical path K). For example, a plurality of first members 21 may be disposed at the surrounding of the terminal optical element 13 (optical path K).

The second member 22 is disposed at a surrounding of the optical path K. The second member 22 is an annular member. The second member 22 is disposed so as not to contact the first member 21. A gap is formed between the second member 22 and the first member 21.

The first member 21 is supported by the apparatus frame 8B via a supporting member 21S. Moreover, the first member 21 may be supported by the reference frame 8A via a supporting member.

The second member 22 is supported by the apparatus frame 8B via a supporting member 22S. The supporting member 22S is connected to the second member 22 outside the first member 21 with respect to the optical path K. In addition, the first member 21 may be supported by the reference frame 8A via a supporting member.

The second member 22 is able to relatively move with respect to the first member 21. The second member 22 is able to relatively move with respect to the terminal optical element 13. A relative position between the second member 22 and the first member 21 is changed. The relative position between the second member 22 and the terminal optical element 13 is changed.

The second member 22 is able to relatively move in the XY plane perpendicular to the optical axis of the terminal optical element 13. The second member 22 is able to move to be substantially parallel to the XY plane. As shown in FIG. 4, in the present embodiment, the second member 22 is able to move in at least the X axis direction. Moreover, the second member 22 is able to move in at least one direction of the Y axis, the Z axis, the θX, the θY, and the θZ directions, in addition to the X axis direction.

In the present embodiment, the terminal optical element 13 does not substantially move. The first member 21 also does not substantially move.

The second member 22 is able to move below at least a portion of the first member 21. The second member 22 is able to move between the first member 21 and the substrate P (object).

The second member 22 moves in the XY plane, and thus, the size of the gap between the outer surface 29 of the first member 21 and the inner surface 30 of the second member 22 is changed. In other words, the second member 22 moves in the XY plane, and thus, the size of the space between the outer surface 29 and the inner surface 30 is changed. For example, in the example shown in FIG. 4, the second member 22 moves in the −X axis direction, and thus, the size of the gap between the outer surface 29 and the inner surface 30 is decreased (the space between the outer surface 29 and the inner surface 30 is decreased) in the +X side with respect to the terminal optical element 13. The second member 22 moves in the +X axis direction, and thus, the size of the gap between the outer surface 29 and the inner surface 30 is increased (the space between the outer surface 29 and the inner surface 30 is increased) in the +X side with respect to the terminal optical element 13.

In the present embodiment, a movable range of the second member 22 is determined so that the first member 21 (outer surface 29) and the second member 22 (inner surface 30) do not contact each other.

In the present embodiment, the second member 22 is driven by a driving apparatus 32. The driving apparatus 32 is able to move the second member 22 with respect to the first member 21. The driving apparatus 32 is controlled by the controller 6.

In the present embodiment, the driving apparatus 32 moves the supporting member 22S. The supporting member 22S is moved by the driving apparatus 32, and thus, the second member 22 is moved. For example, the driving apparatus 32 includes a motor, and moves the second member 22 using Lorentz force.

The driving apparatus 32 is supported by the apparatus frame 8B via a supporting member 32S. The second member 22 is supported by the apparatus frame 8B via the supporting member 22S, the driving apparatus 32, and the supporting member 32S. Even when vibration occurs due to the movement of the second member 22, transmission of the vibration to the reference frame 8A is suppressed by the vibration isolator 10.

The second member 22 may move in parallel with at least a part of a period in which the exposure light EL is emitted from the emitting surface 12. The second member 22 may move in parallel with at least a part of a period in which the exposure light EL is emitted from the emitting surface 12 in a state where the liquid immersion space LS is formed.

The second member 22 may move in parallel with at least a part of a period in which the substrate P (object) moves. The second member 22 may move in parallel with at least a part of a period in which the substrate P (object) moves in the state where the liquid immersion space LS is formed.

The second member 22 may move in the movement direction of the substrate P (object). For example, the second member 22 may be moved in the movement direction of the substrate P in at least a part of a period in which the substrate P is moved. For example, when the substrate P moves in one direction (for example, +X axis direction) in the XY plane, the second member 22 may move in one direction (the +X axis direction) in the XY plane in synchronization with the movement of the substrate P.

The liquid immersion member 5 includes a liquid supply part 31 which supplies the liquid LQ to form the liquid immersion space LS. The liquid supply part 31 is disposed at the first member 21.

Moreover, the liquid supply part 31 may be disposed at both of the first member 21 and the second member 22.

In addition, the liquid supply part 31 may be disposed at the first member 21 and not be disposed at the second member 22. In addition, the liquid supply part 31 may be disposed at the second member 22 and not be disposed at the first member 21. Moreover, the liquid supply part 31 may be disposed at members other than the first member 21 and the second member 22.

The liquid supply part 31 is disposed inside the liquid recovery pan 24 and the fluid recovery pan 27 in the radial direction from the optical path K (the optical axis of the terminal optical element 13). In the present embodiment, the liquid supply part 31 includes an opening (liquid supply port) which is disposed at the inner surface 28 of the first member 21. The liquid supply part 31 is disposed to be opposite to the side surface 13F. The liquid supply part 31 supplies the liquid LQ to the third space SP3 between the side surface 13F and the inner surface 28. In the present embodiment, the liquid supply part 31 is disposed at each of the +X side and the −X side with respect to the optical path K (terminal optical element 13).

Moreover, the liquid supply part 31 may be disposed at the Y axis direction with respect to the optical path K (terminal optical element 13), and the plurality of liquid supply parts may be disposed at the surrounding of the optical path K (terminal optical element 13) which includes the X axis direction and the Y axis direction. One liquid supply part 31 may be provided. In addition, instead of the liquid supply part 31 or in addition to the liquid supply part 31, a liquid supply part which is able to supply the liquid LQ may be provided at the lower surface 23.

In the present embodiment, the liquid supply part (liquid supply port) 31 is connected to a liquid supply apparatus 31S via a supply channel 31R which is formed in the inner portion of the first member 21. The liquid supply apparatus 31S is able to supply the cleaned liquid LQ, in which the temperature is adjusted, to the liquid supply part 31. In order to form the liquid immersion space LS, the liquid supply part 31 supplies the liquid LQ from the liquid supply apparatus 31S.

An opening 40 is formed between the inner edge of the lower surface 23 and the upper surface 25. An optical path space SPK which includes the optical path K between the emitting surface 12 and the substrate P (object) and the first space SP1 between the lower surface 23 and the upper surface 25 are connected to each other via the opening 40. The optical path space SPK includes the space between the emitting surface 12 and the substrate P (object) and the space between the emitting surface 12 and the upper surface 25. The opening 40 is disposed so as to face the optical path K. The third space SP3 between the side surface 13F and the inner surface 28 and the first space SP1 are connected to each other via the opening 40.

At least a portion of the liquid LQ from the liquid supply part 31 is supplied to the first space SP1 between the lower surface 23 and the upper surface 25 via the opening 40. At least a portion of the liquid LQ, which is supplied from the liquid supply part 31 to form the liquid immersion space LS, is supplied to the substrate P (object) opposite to the emitting surface 12 via the opening 34 and the opening 35. Accordingly, the optical path K is filled with the liquid LQ. At least a portion of the liquid LQ from the liquid supply part 31 is supplied to the second space SP2 between the lower surface 26 and the upper surface of the substrate P (object).

With respect to the Z axis direction, the size of the first space SP1 is smaller than the size of the second space SP2. In addition, with respect to the Z axis direction, the size of the first space SP1 may be substantially the same as the size of the second space SP2 and may be larger than the size of the second space SP2.

The liquid recovery part 24 is disposed outside the lower surface 23 with respect to the optical path K (with respect to an optical axis of the terminal optical element 13). The liquid recovery part 24 is disposed at surrounding of the lower surface 23. The liquid recovery part 24 is disposed at surrounding of the optical path K of the exposure light EL. Moreover, the liquid recovery part 24 may be disposed at a portion of surrounding of the lower surface 23. For example, a plurality of the liquid recovery parts 24 may be disposed at surrounding of the lower surface 23. The liquid recovery part 24 is disposed to face the first space SP1. The liquid recovery part 24 recovers at least a portion of the liquid LQ in the first space SP1.

A fluid recovery part 27 is disposed outside the lower surface 26 with respect to the optical path K (with respect to an optical axis of the terminal optical element 13). The fluid recovery part 27 is disposed at surrounding of the lower surface 26. The fluid recovery part 27 is disposed at surrounding of the optical path K of the exposure light EL. Moreover, the fluid recovery part 27 may be disposed at a portion of surrounding of the lower surface 26. For example, a plurality of the fluid recovery parts 27 may be disposed at surrounding of the lower surface 26. The fluid recovery part 27 is disposed so as to oppose the second space SP2. The fluid recovery pan 27 recovers at least a portion of the liquid LQ in the second space SP2.

The fluid recovery part 27 is disposed outside the first member 21 with respect to the optical path K (the optical axis of the terminal optical element 13). The fluid recovery part 27 is disposed outside the first space SP1 with respect to the optical path K (the optical axis of the terminal optical element 13).

In the present embodiment, movement of the liquid LQ from one of the first space SP1 at the upper surface 25 side and the second space SP2 at the lower surface 26 side to the other is suppressed. The first space SP1 and the second space SP2 are partitioned by the second member 22. The liquid LQ in the first space SP1 is able to move to the second space SP2 via the opening 35. The liquid LQ in the first space SP1 is able to move to the second space SP2 only through the opening 35. The liquid LQ, which is present in the first space SP1 further outside than the opening 35 from the optical path K, is not able to move to the second space SP2. The liquid LQ in the second space SP2 is able to move to the first space SP1 via the opening 35. The liquid LQ in the second space SP2 is able to move to the first space SP1 only through the opening 35. The liquid LQ, which is present in the second space SP2 further outside than the opening 35 from the optical path K, is not able to move to the first space SP1. That is, in the present embodiment, the liquid immersion member 5 does not have a channel which fluidly connects the first space SP1 and the second space SP2, other than the opening 35.

In the present embodiment, the fluid recovery part 27 recovers at least a portion of the liquid LQ in the second space SP2 and does not recover the liquid LQ in the first space SP1. The liquid recovery part 24 recovers at least a portion of the liquid LQ in the first space SP1 and does not recover the liquid LQ in the second space SP2. When the upper surface 25 of the second member 22 is not provided below the liquid recovery part 24, the liquid recovery part 24 may recovery the liquid LQ on the object (substrate P).

Moreover, the liquid LQ, which moves outside (outside the outer surface 29) the first space SP1 from the optical path K, is suppressed from being moved to the substrate P (second space SP2) due to the inner surface 30.

The liquid recovery part 24 includes an opening (fluid recovery port) which is disposed at at least a portion of surrounding of the lower surface 23 of the first member 21. The liquid recovery part 24 is disposed to be opposite to the upper surface 25. The liquid recovery part 24 is connected to a liquid recovery apparatus 24C via a recovery channel (space) 24R which is formed in the inner portion of the first member 21. The liquid recovery apparatus 24C is able to connect the liquid recovery part 24 and a vacuum system (not shown). The liquid recovery part 24 is able to recover at least a portion of the liquid LQ in the first space SP1. At least a portion of the liquid LQ in the first space SP1 is able to flow into the recovery channel 24R via the liquid recovery part 24. The liquid recovery part 24 may recover the liquid LQ, which has flown onto the upper surface 25 of the second member 22 from the third space SP3 between the side surface 13F of the terminal optical element 13 and the inner surface of the first member 21 via a space between the outer surface 29 of the first member 21 and the inner surface 30 of the second member 22 and through the upper surface of the first member 21. That is, the liquid recovery part 24 may be used as a recovery part that recovers the liquid LQ on the upper surface 25 of the second member 22 which comes from the space SP3 without going through the opening 40. Additionally, the recovery part that recovers the liquid LQ from the space SP3 may be provided at the upper surface of the first member 21, and may be provided at at least of one of the upper surface 25 and inner surface 30 of the second member 22.

In the present embodiment, the liquid recovery part 24 includes a porous member 36, and the fluid recovery port includes holes of the porous member 36. In the present embodiment, the porous member 36 includes a mesh plate. The porous member 36 includes a lower surface to which the upper surface 25 is able to be opposite, an upper surface which faces the recovery channel 24R, and the plurality of holes which connect the lower surface and the upper surface. The liquid recovery part 24 recovers the liquid LQ via the holes of the porous member 36. The liquid LQ in the first space SP1 recovered from the liquid recovery part 24 (holes of the porous member 36) flows into the recovery channel 24R, flows to the recovery channel 24R, and is recovered by the liquid recovery apparatus 24C.

In the present embodiment, substantially only the liquid LQ is recovered via the fluid recovery part 24, and the recovery of gas via the liquid recovery part 24 is limited. A controller 6 adjusts a pressure difference between pressure (pressure of the first space SP1) at the lower surface side of the porous member 36 and pressure (pressure of the recovery channel 24R) at the upper surface side of the porous member 36 so that the liquid LQ in the first space SP1 passes through the holes of the porous member 36 and flows into the recovery channel 24R and gas does not pass through the holes of the porous member 36. Moreover, for example, an example of technology which recovers only liquid via the porous member is disclosed in U.S. Pat. No. 7,292,313 or the like.

In addition, both of the liquid LQ and the gas may be recovered (sucked) via the porous member 36. That is, the liquid recovery part 24 may recover the liquid LQ together with gas. Additionally, when the liquid LQ is not present below the liquid recovery part 24, the liquid recovery part 24 may only recover gas. Moreover, the porous member 36 may not be provided at the first member 21. That is, the fluid (one or both of liquid LQ and gas) in the first space SP1 may be recovered without through the porous member.

In the present embodiment, the lower surface of the liquid recovery part 24 includes the lower surface of the porous member 36. The lower surface of the liquid recovery part 24 is disposed at the surrounding of the lower surface 23. In the present embodiment, the lower surface of the liquid recovery part 24 is substantially parallel with the XY plane. In the present embodiment, the lower surface of the liquid recovery part 24 and the lower surface 23 are disposed in the same plane (flush with each other).

Moreover, the lower surface of the liquid recovery part 24 may be disposed more at the +Z side than the lower surface 23 and may be disposed more at the −Z side than the lower surface 23. In addition, the lower surface of the liquid recovery part 24 may be inclined with respect to the lower surface 23 and may include a curved surface.

Moreover, the liquid recovery part 24 for recovering the fluid (one or both of liquid LQ and gas) in the first space SP1 may be disposed at the second member 22 to face the first space SP1. The liquid recovery part 24 may be disposed at both of the first member 21 and the second member 22. The liquid recovery part 24 may be disposed at the first member 21 and may not be disposed at the second member 22. The liquid recovery part 24 may be disposed at the second member 22 and may not be disposed at the first member 21.

The fluid recovery part 27 includes an opening (fluid recovery port) which is disposed at at least a portion of the surrounding of the lower surface 26 of the second member 22. The fluid recovery part 27 is disposed to be opposite to the upper surface of the substrate P (object). The fluid recovery part 27 is connected to a liquid recovery apparatus 27C via a recovery channel (space) 27R which is formed in the inner portion of the second member 22. The liquid recovery apparatus 27C is able to connect the fluid recovery part 27 and a vacuum system (not shown). The fluid recovery part 27 is able to recover at least a portion of the liquid LQ at the second space SP2. At least a portion of the liquid LQ at the second space SP2 is able to flow into the recovery channel 27R via the fluid recovery part 27.

In the present embodiment, the fluid recovery part 27 includes a porous member 37, and the fluid recovery port includes holes of the porous member 37. In the present embodiment, the porous member 37 includes a mesh plate. The porous member 37 includes a lower surface to which the upper surface of the substrate P (object) is able to be opposite, an upper surface which faces the recovery channel 27R, and the plurality of holes which connect the lower surface and the upper surface. The liquid recovery part 27 recovers the fluid (one or both of the liquid LQ and the gas) via the holes of the porous member 37. The liquid LQ in the second space SP2 recovered from the fluid recovery part 27 (holes of the porous member 37) flows into the recovery channel 27R, flows to the recovery channel 27R, and is recovered by the liquid recovery apparatus 27C.

The recovery channel 27R is disposed outside the inner surface 30 with respect to the optical path K (the optical axis of the terminal optical element 13). The recovery channel 27R is disposed above the liquid recovery part 27. The second member 22 moves, and thus, the fluid recovery part 27 and the recovery channel 27R of the second member 22 moves outside the outer surface 29 of the first member 21.

The gas is recovered via the fluid recovery part 27 along with the liquid LQ. Moreover, only the liquid LQ is recovered via the porous member 37, and the recovery of the gas via the porous member 37 may be limited. In addition, the porous member 37 may not be provided at the second member 22. That is, the fluid (one or both of liquid LQ and gas) in the second space SP2 may be recovered without through the porous member.

In the present embodiment, the lower surface of the fluid recovery part 27 includes the lower surface of the porous member 37. The lower surface of the fluid recovery part 27 is disposed at the surrounding of the lower surface 26. In the present embodiment, the lower surface of the fluid recovery part 27 is substantially parallel with the XY plane. In the present embodiment, the lower surface of the fluid recovery part 27 may be disposed more at the +Z side than the lower surface 26.

Moreover, the lower surface of the fluid recovery part 27 and the lower surface 26 may be disposed in the same plane (may be flush with each other). The lower surface of the fluid recovery part 27 may be disposed more at the −Z side than the lower surface 26. In addition, the lower surface of the fluid recovery part 27 may be inclined with respect to the lower surface 26 and may include a curved surftace. For example, the lower surface of the fluid recovery part 27 (the porous member 37) may be inclined upwardly and outwardly in a radial direction with respect to the optical path K. Additionally, the lower surface of the fluid recovery part 27 (the porous member 37) may not have to be at same height (a position in Z axis direction) all around the entire circumferential at surrounding of the opening 35. For example, a portion of the lower surface of the fluid recovery part 27 (a porous member 37) located at both sides of the opening 35 in the Y axis direction may be lower than a portion of the lower surface of the fluid recovery part 27 (a porous member 37) located at both sides of the opening 35 in the X axis direction. For example, when the lower surface of the fluid recovery part 27 (a porous member 37) of the second member 22 is facing the surface of the substrate P, the shape of the lower surface of the fluid recovery part 27 (a porous member 37) may be determined so that a dimension of a gap (a distance in the Z axis direction) formed in between the lower surface of the fluid recovery part 27 (a porous member 37) and the surface of the substrate P at one side in the Y axis direction with respect to the optical path K of the exposure light is smaller than a dimension of a gap (a distance in the Z axis direction) formed in between the lower surface of the fluid recovery part 27 (a porous member 37) and the surface of the substrate P at one side in the X axis direction with respect to the optical path K of the exposure light.

In the present embodiment, since the recovery operation of the liquid LQ from the fluid recovery part 27 is performed in parallel with the supply operation of the liquid LQ from the liquid supply part 31, the liquid immersion space LS is formed between the terminal optical element 13 and the liquid immersion member 5 at one side and the substrate P (object) at the other side, by the liquid LQ.

Moreover, in the present embodiment, the recovery operation of the fluid from the liquid recovery part 24 is performed in parallel with the supply operation of the liquid LQ from the liquid supply part 31 and the recovery operation of the fluid from the fluid recovery part 27.

In the present embodiment, a portion of an interface LG of the liquid LQ in the liquid immersion space LS is formed between the second member 22 and the substrate P (object).

In the present embodiment, a portion of the interface LG of the liquid LQ in the liquid immersion space LS is formed between the first member 21 and the second member 22.

In the present embodiment, a portion of the interface LG of the liquid LQ in the liquid immersion space LS is formed between the terminal optical element 13 and the first member 21.

In the descriptions below, the interface LG of the liquid LQ which is formed between the first member 21 and the second member 22 is appropriately referred to as a first interface LG1. The interface LG which is formed between the second member 22 and the substrate P (object) is appropriately referred to as a second interface LG2. The interface LG which is formed between the terminal optical element 13 and the first member 21 is appropriately referred to as a third interface LG3.

In the present embodiment, the first interface LG1 is formed between the lower surface of the liquid recovery part 24 and the upper surface 25. The second interface LG2 is formed between the lower surface of the liquid recovery part 27 and the upper surface of the substrate P (object).

In the present embodiment, the first interface LG1 is formed between the lower surface of the liquid recovery part 24 and the upper surface 25, and the movement of the liquid LQ in the first space SP1 to the space (for example, the space between the outer surface 29 and the inner surface 30) outside the liquid recovery part 24 is suppressed. The liquid LQ is not present in the space between the outer surface 29 and the inner surface 30. The space between the outer surface 29 and the inner surface 30 becomes a space with gas.

The space between the outer surface 29 and the inner surface 30 is connected to the space CS. In other words, the space between the outer surface 29 and the inner surface 30 is opened to the atmosphere. When the pressure of the space CS is at atmospheric pressure, the space between the outer surface 29 and the inner surface 30 is opened to the atmosphere. Accordingly, the second member 22 is able to smoothly move. Moreover, the pressure of the space CS may be higher or lower than the atmospheric pressure.

Figure 8:
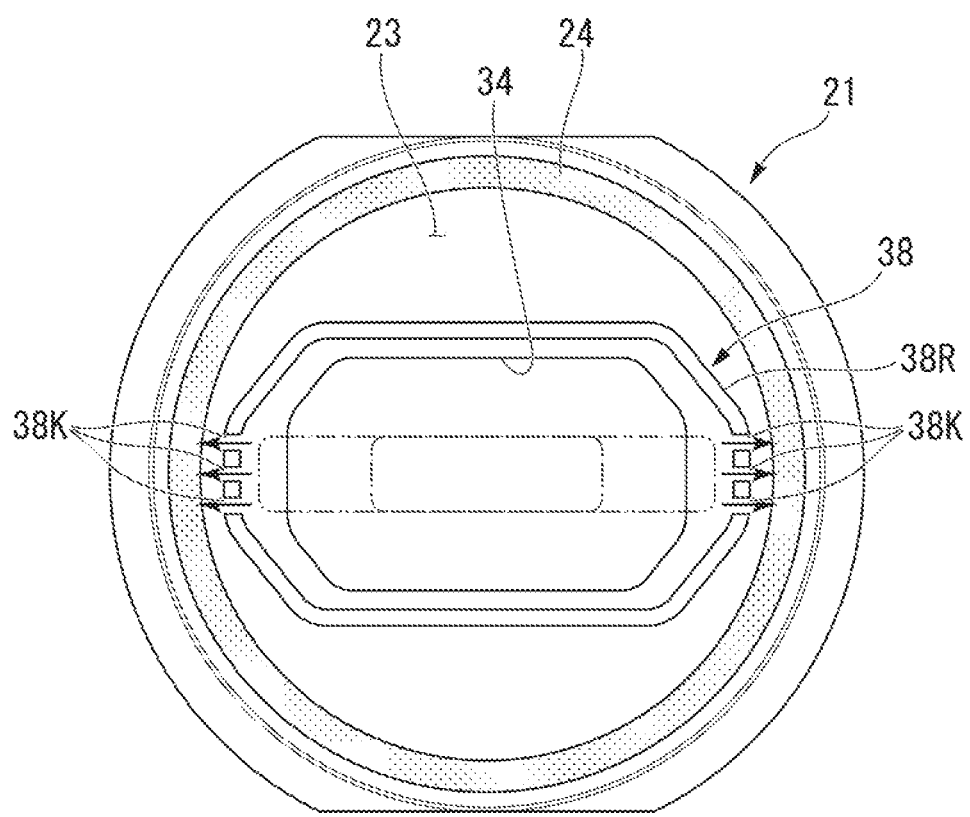
FIG. 8 is a view showing an example of a first member according to the first embodiment.
Figure 8:
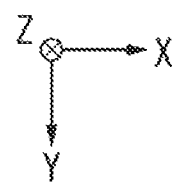

FIG. 8 is a view when the first member 21 is viewed from the lower surface 23 side. In the present embodiment, an introducing part 38, which introduces at least a portion of the liquid LQ from the liquid supply part 31, is disposed at the lower surface 23 of the first member 21. The introducing part 38 is a protruding part which is provided at the lower surface 23. The introducing part 38 introduces at least a portion of the liquid LQ from the liquid supply part 31 to the liquid recovery part 24.

The shape of the introducing part 38 is determined based on the movement direction of the second member 22. In the present embodiment, the introducing part 38 is provided to promote the flow of the liquid LQ in the direction parallel to the movement direction of the second member 22.

For example, when the second member 22 moves in the X axis direction, the shape of the introducing part 38 is determined so that the liquid LQ flows in the direction parallel to the X axis direction in the first space SP1 and reaches the liquid recovery part 24. For example, when the second member 22 moves in the +X axis direction, at least a portion of the liquid LQ in the first space SP1 flows in the +X axis direction by the introducing part 38. When the second member 22 moves in the −X axis direction, at least a portion of the liquid LQ in the first space SP1 flows in the −X axis direction by the introducing part 38.

In the present embodiment, the introducing part 38 includes a wall part 38R which is disposed at at least a portion of the surrounding of the opening 34 and a slit (opening) 38K which is formed at a portion of the wall part 38R.

The wall part 38 is disposed to surround the opening 34. The slit 38K is formed at each of the +X side and the −X side with respect to the optical path K so that the flow of the liquid LQ in the direction parallel to the X axis direction is promoted.

Due to the introducing part 38, a flow rate of the liquid LQ in the first space SP1 is increased with respect to the direction parallel to the movement direction of the second member 22. In the present embodiment, due to the introducing part 38, the flow rate of the liquid LQ is increased with respect to the X axis direction in the first space SP1. That is, velocity of the liquid LQ, which flows toward the space between the lower surface of the liquid recovery part 24 and the upper surface 25, is increased. Accordingly, the change of the position of the first interface LG1 with respect to the first member 21 or the change of the shape of the first interface LG1 is suppressed. Therefore, the liquid LQ in the first space SP1 is suppressed from being flowed outside the first space SP1.

Moreover, the position at which the slit 38K is formed is not limited to the +X side and the −X side with respect to the optical path K. For example, when the second member 22 moves to be parallel with the Y axis, the slit 38K may be added to the +Y side and the −Y side with respect to the optical path K. When the second member 22 does not move to be parallel with the Y axis, the slit 38K may be added to the +Y side and the −Y side with respect to the optical path K.

In addition, the shape (position or the like of the slit 38K) of the introducing part 38 may not be determined based on the movement direction of the second member 22. For example, the shape of the introducing part 38 may be determined so that the liquid LQ radially flows with respect to the optical path K in the entire circumference of the optical path K.

In the present embodiment, the second member 22 is able to be opposite to the entire lower surface 23. For example, as shown in FIG. 2, when the second member 22 is disposed at an origin where the optical axis of the terminal optical element 13 and the center of the opening 35 substantially coincide with each other, the entire lower surface 23 is opposite to the upper surface 25 of the second member 22. In addition, when the second member 22 is disposed at the origin, a portion of the emitting surface 12 is opposite to the upper surface 25 of the second member 22. Moreover, when the second member 22 is disposed at the origin, the lower surface of the liquid recovery part 24 is opposite to the upper surface 25 of the second member 22.

In addition, in the present embodiment, when the second member 22 is disposed at the origin, the center of the opening 34 substantially coincides with the center of the opening 35.

Next, an example of the operation of the second member 22 will be described. The second member 22 is able to cooperatively move with the movement of the substrate P (object). The second member 22 is able to move to be independent of the substrate P (object). The second member 22 is able to move in parallel with at least a portion of the movement of the substrate P (object). The second member 22 is able to move in a state where the liquid immersion space LS is formed. The second member 22 is able to move in a state where the liquid LQ is present in the first space SP1 and the second space SP2.

The second member 22 may move when the second member 22 and the substrate (object) are not opposite to each other. For example, the second member 22 may move when the object is not present below the second member 22. Moreover, the second member 22 may move when the liquid LQ is not present in the space between the second member 22 and the substrate P (object). For example, the second member 22 may move when the liquid immersion space LS is not formed.

For example, the second member 22 is moved based on movement conditions of the substrate P (object). For example, the controller 6 moves the second member 22 in parallel with at least a portion of the movement of the substrate P (object) based on the movement conditions of the substrate P (object). The controller 6 moves the second member 22 while performing the supply of the liquid LQ from the liquid supply part 31 and the recovery of the liquid LQ from the fluid recovery part 27 and the liquid recovery part 24 so that the liquid immersion space LS is continuous to be formed.

In the present embodiment, the second member 22 is able to move so that the relative movement between the second member 22 and the substrate P (object) is decreased. Moreover, the second member 22 is able to move so that the relative movement between the second member and the substrate P (object) is smaller than the relative movement between the first member 21 and the substrate P (object). For example, the second member 22 may move in synchronization with the substrate P (object).

The relative movement includes at least one of a relative speed and a relative acceleration. For example, in a state where the liquid immersion space LS is formed, that is, in a state where the liquid LQ is present in the second space SP2, the second member 22 may move so that the relative speed between the second member 22 and the substrate P (object) is decreased. Moreover, in the state where the liquid immersion space LS is formed, that is, in the state where the liquid LQ is present in the second space SP2, the second member 22 may move so that the relative acceleration between the second member and the substrate P (object) is decreased. In addition, in the state where the liquid immersion space LS is formed, that is, in the state where the liquid LQ is present in the second space SP2, the second member 22 may move so that the relative speed between the second member and the substrate P (object) is smaller than the relative speed between the first member 21 and the substrate P (object). Moreover, in the state where the liquid immersion space LS is formed, that is, in a state where the liquid LQ is present in the second space SP2, the second member 22 may move so that the relative acceleration between the second member and the substrate P (object) is smaller than the relative acceleration between the first member 21 and the substrate P (object).

For example, the second member 22 is able to move in the movement direction of the substrate P (object). For example, when the substrate P (object) moves in the +X axis direction (or the −X axis direction), the second member 22 is able to move in the +X axis direction (or the −X axis direction). Moreover, when the substrate P (object) moves in the +Y axis direction (or the −Y axis direction) while moving in the +X axis direction, the second member 22 is able to move in the +X axis direction. In addition, when the substrate P (object) moves in the +Y axis direction (or the −Y axis direction) while moving in the −X axis direction, the second member 22 is able to move in the −X axis direction. That is, in the present embodiment, when the substrate P (object) moves in the direction which includes the component of the X axis direction, the second member 22 moves in the X axis direction.

For example, the second member 22 may move in the X axis direction in parallel with at least a portion of the movement of the substrate P (object) in the direction including the component in the X axis direction.

Moreover, the second member 22 may move in the Y axis direction. When the substrate P (object) moves in the direction including the component in the Y axis direction, the second member 22 may move in the Y axis direction. For example, the second member 22 may move in the Y axis direction so that the difference in the relative speed between the second member and the substrate P (object) is decreased in parallel with at least a portion of the movement of the substrate P (object) in the direction including the component in the Y axis direction.

Figure 9:
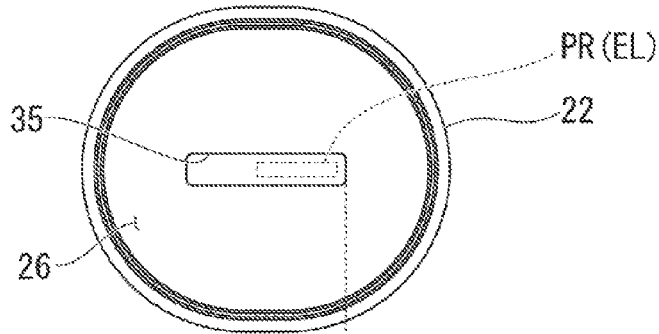
FIG. 9 is a view for explaining an example of an operation of the liquid immersion member according to the first embodiment.
Figure 9:
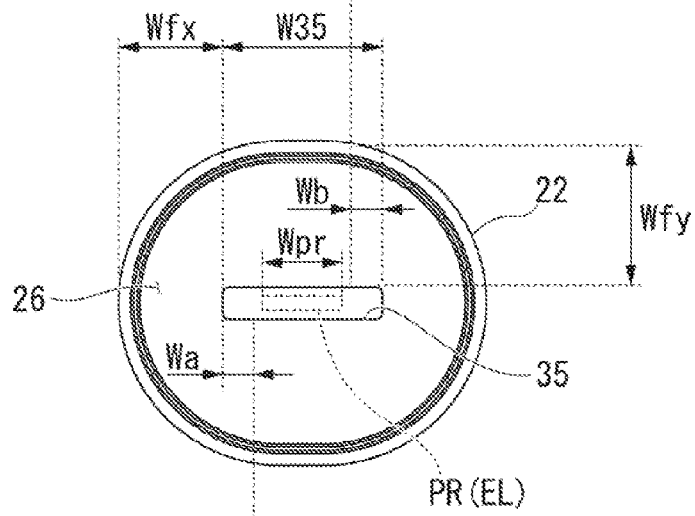
Figure 9:
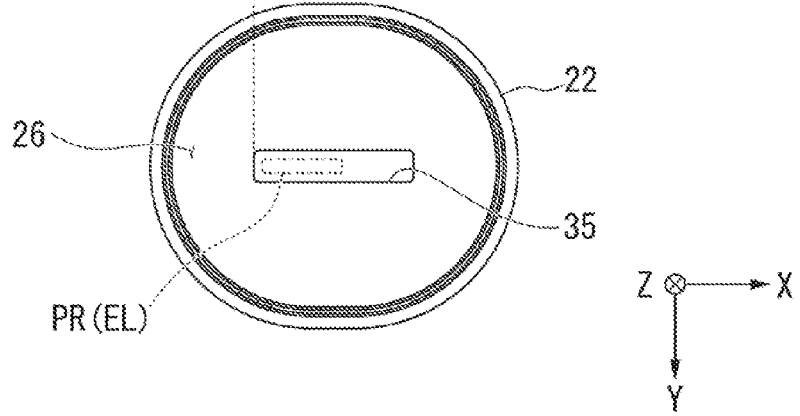

FIG. 9 shows an example of a state where the second member 22 moves. FIG. 9 is a view when the liquid immersion member 5 is viewed from below (−Z side).

In the descriptions below, the second member 22 moves in the X axis direction. Moreover, as described above, the second member 22 may move in the Y axis direction and may move in an arbitrary direction in the XY plane which includes the component in the X axis direction (or the Y axis direction).

When the substrate P (object) moves in the X axis direction (or a predetermined direction in the XY plane which includes the component in the X axis direction), as shown in FIGS. 9(A) to 9(C), the second member 22 moves in the X axis direction.

In the present embodiment, the second member 22 is able to move in a movable range which is defined with respect to the X axis direction. FIG. 9(A) shows a state where the second member 22 is disposed at the furthest end of the −X side of the movable range. FIG. 9(B) shows a state where the second member 22 is disposed at the center of the movable range. FIG. 9(C) shows a state where the second member 22 is disposed at the furthest end of the +X side of the movable end.

In the descriptions below, the position of the second member 22 shown in FIG. 9(A) is appropriately referred to as a first end part position, the position of the second member 22 shown in FIG. 9(B) is appropriately referred to as a center position, and the position of the second member 22 shown in FIG. 9(C) is appropriately referred to as a second end part position. Moreover, as shown in FIG. 9(B), the state where the second member 22 is disposed at the center position includes the state where the second member 22 is disposed at the origin.

In the present embodiment, the size of the opening 35 is determined based on the size of the movable range of the second member 22 so that the exposure light EL from the emitting surface 12 passes through the opening 35. The size of the movable range of the second member 22 includes the distance between the first end part position and the second end part position with respect to the X axis direction. The size in the X axis direction of the opening 35 is determined so that, even when the second member 22 moves in the X axis direction, the exposure light EL from the emitting surface 12 is not radiated to the second member 22.

In FIG. 9, the size W35 of the opening 35 with respect to the X axis direction is larger than the sum of the size Wpr of the exposure light EL (projection region PR) and the size (Wa+Wb) of the movable range of the second member 22. The size W35 is determined as the size in which, even when the second member 22 moves between the first end part position and the second end part position, the exposure light EL from the emitting surface 12 is not blocked. Accordingly, even when the second member 22 moves, the exposure light EL from the emitting surface 12 is not blocked by the second member 22 and can be radiated to the substrate P (object).

Next, a method of exposing the substrate P using the exposure apparatus EX including the above-described configuration will be described.

In a substrate exchange position away from the liquid immersion member 5, processing which carries (loads) the substrate P before the exposure to the substrate stage 2 (first holding portion) is performed. Moreover, in at least a part of a period in which the substrate stage 2 is away from the liquid immersion member 5, the measurement stage 3 is disposed to be opposite to the terminal optical element 13 and the liquid immersion member 5. The controller 6 performs the supply of the liquid LQ from the liquid supply part 31 and the recovery of the liquid LQ from the fluid recovery part 27, and the liquid immersion space LS is formed at the measurement stage 3.

After the substrate P before the exposure is loaded on the substrate stage 2 and the measurement processing using the measurement stage 3 is terminated, the controller 6 moves the substrate stage 2 so that the terminal optical element 13 and the liquid immersion member 5 are opposite to the substrate stage 2 (substrate P). In the state where the terminal optical element 13 and the liquid immersion member 5 are opposite to the substrate stage 2 (substrate P), the recovery of the liquid LQ from the fluid recovery part 27 is performed in parallel with the supply of the liquid LQ from the liquid supply part 31, and thus, the liquid immersion space LS is formed between the terminal optical element 13 and the liquid immersion member 5, and the substrate stage 2 (substrate P) so that the optical path K is filled with the liquid LQ.

In the present embodiment, the recovery of the liquid LQ from the liquid recovery part 24 is performed in parallel with the supply of the liquid LQ from the liquid supply part 31 and the recovery of the liquid LQ from the fluid recovery part 27.

The controller 6 starts the exposure processing of the substrate P. In the state where the liquid immersion space LS is formed on the substrate P, the controller 6 emits the exposure light EL from the illumination system IL. The illumination system IL illuminates the mask M with the exposure light EL. The exposure light EL from the mask M is radiated to the substrate P via the liquid LQ in the liquid immersion space LS between the projection optical system PL and the emitting surface 12, and the substrate P. Accordingly, the substrate P is exposed by the exposure light EL which is emitted from the emitting surface 12 via the liquid LQ in the liquid immersion space LS between the emitting surface 12 of the terminal optical element 13 and the substrate P, and the image of the pattern of the mask M is projected to the substrate P.

The exposure apparatus EX of the present embodiment is a scanning type exposure apparatus (a so-called scanning stepper) in which the mask M and the substrate P synchronously move in a predetermined scanning direction and the image of the pattern of the mask M is projected to the substrate P. In the present embodiment, the scanning direction of the substrate P (synchronous movement direction) is set to the Y axis direction, and the scanning direction (synchronous movement direction) of the mask M is also set to the Y axis direction. The controller 6 radiates the exposure light EL to the substrate P via the projection optical system PL and the liquid LQ in the liquid immersion space LS on the substrate P while moving the substrate P in the Y axis direction with respect to the projection region PR of the projection optical system PL and moving the mask M in the Y axis direction with respect to the illumination region IR of the illumination system IL in synchronization with the movement in the Y axis direction of the substrate P.

Figure 10:
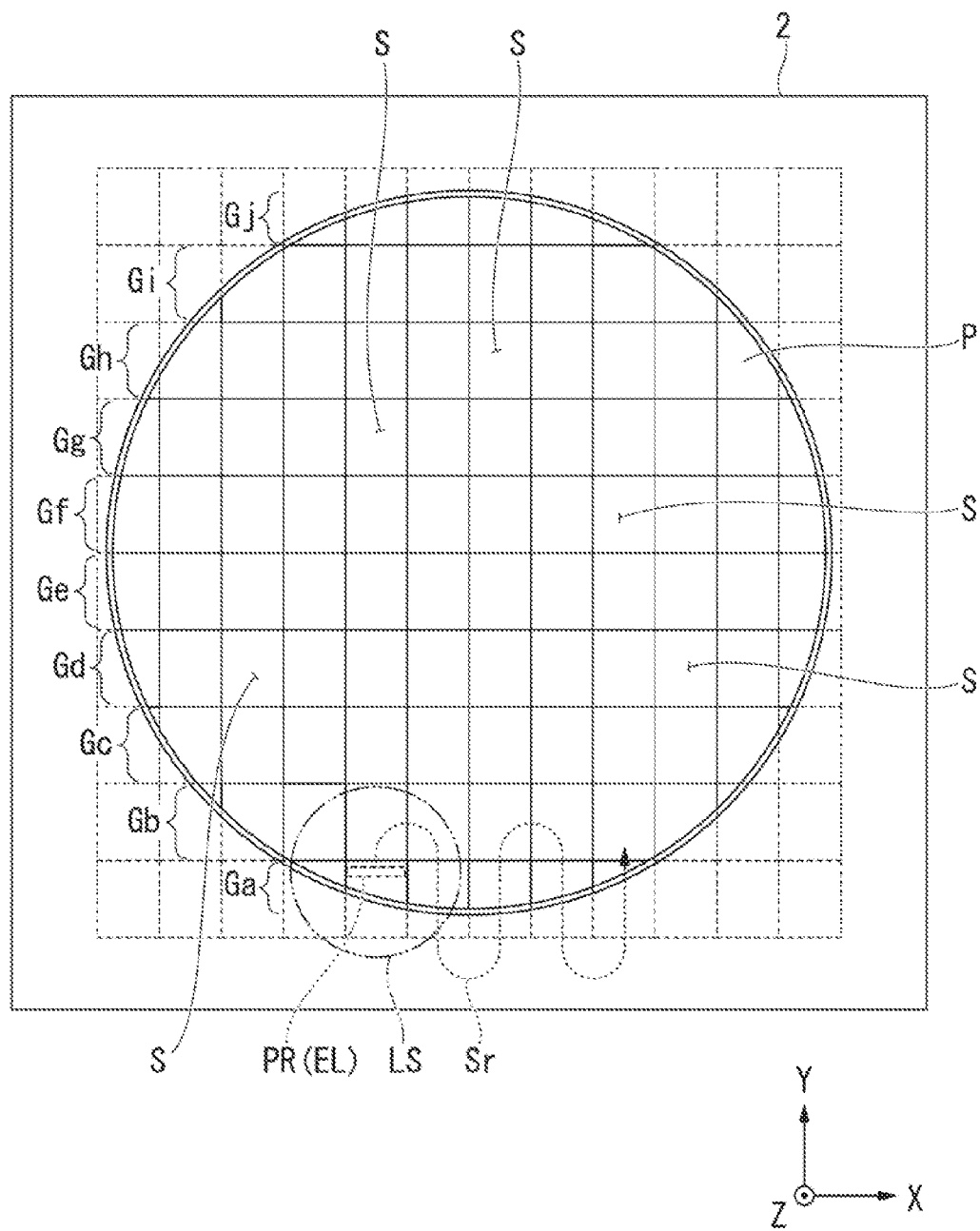
FIG. 10 is a view for explaining an example of the operation of the exposure apparatus according to the first embodiment.

FIG. 10 is a view showing an example of the substrate P which is held by the substrate stage 2. In the present embodiment, a plurality of shot regions S, which are regions to be exposed on the substrate P, are arranged in a matrix form.

The controller 6 sequentially exposes the plurality of shot regions S of the substrate P by the exposure light EL emitted from the emitting surface 12 via the liquid LQ in the liquid immersion space LS between the emitting surface 12 and the substrate P while moving the substrate P held by the first holding portion in the Y axis direction (scanning direction) with respect to the exposure light EL emitted from the emitting surface 12 of the terminal optical element 13.

For example, in order to expose one shot region S of the substrate P, in the state where the liquid immersion space LS is formed, the controller 6 radiates the exposure light EL to the shot region S via the projection optical system PL and the liquid LQ in the liquid immersion space LS on the substrate P while moving the substrate P in the Y axis direction with respect to the exposure light EL emitted from the emitting surface 12 (the projection region PR of the projection optical system PL), and moving the mask M in the Y axis direction with respect to the illumination region IR of the illumination system IL in synchronization with the movement in the Y axis direction of the substrate P. Accordingly, the image of the pattern of the mask M is projected to the shot region S, and the shot region S is exposed by the exposure light EL which is emitted from the emitting surface 12.

After the exposure of the shot region S is terminated, in order to start the exposure of a next shot region S, in the state where the liquid immersion space LS is formed, the controller 6 moves the substrate P in the direction (for example, X axis direction, directions which are inclined with respect to the X axis direction and Y axis direction in the XY plane, or the like) which intersects the Y axis in the XY plane, and moves the next shot region S to an exposure starting position. Thereafter, the controller 6 starts the exposure of the shot region S.

The controller 6 repeats the operation which exposes the shot region while moving the shot region in the Y axis direction with respect to the position (projection region PR) radiated with the exposure light EL from the emitting surface 12 in the state where the liquid immersion space LS is formed above the substrate P (substrate stage 2), and after the exposure of the shot region, the operation which moves the substrate P in the direction (for example, X axis direction, directions which are inclined with respect to the X axis direction and Y axis direction in the XY plane, or the like) which intersects the Y axis direction in the XY plane so that the next shot region is disposed at the exposure start position in the state where the liquid immersion space LS is formed on the substrate P (substrate stage 2), and the controller sequentially exposes each of the plurality of shot regions of the substrate P.

In the descriptions below, the operation, which moves the substrate P (shot region) in the Y axis direction with respect to the position (projection region PR) radiated with the exposure light EL from the emitting surface 12 in a state where the liquid immersion space LS is formed above the substrate P (substrate stage 2) in order to expose the shot region, is appropriately referred to as a scan movement operation. Moreover, the operation, which moves the substrate P in the XY plane before the exposure of the next shot region starts in the state where the liquid immersion space LS is formed on the substrate P (substrate stage 2) after the exposure of a predetermined shot region is terminated, is appropriately referred to as a step movement operation.

In the present embodiment, the scan movement operation includes an operation in which the substrate P moves in the Y axis direction from a state where a predetermined shot region S is placed at the exposure starting position to a state where the predetermined shot region is placed at the exposure termination position. The step movement operation includes an operation in which the substrate P moves in a direction intersecting the Y axis direction in the XY plane from a state where a predetermined shot region S is placed at the exposure termination position to a state where the next shot region S is placed at the exposure starting position.

The exposure starting position includes a position of the substrate P when one end in the Y axis direction of a predetermined shot region S passes through the projection region PR in order to expose the shot region S. The exposure termination position includes a position of the substrate P when the other end in the Y axis direction of the shot region S, which was radiated by the exposure light EL passes through the projection region PR.

The exposure starting position of the shot region S includes a starting position of the scan movement operation in order to expose the shot region S. The exposure starting position of the shot region S includes a termination position of the step movement operation in order to dispose the shot region S at the exposure starting position.

The exposure termination position of the shot region S includes a termination position of the scan movement operation in order to expose the shot region S. The exposure termination position of the shot region S includes a starting position of the step movement operation in order to place the next shot region S at the exposure starting position after the exposure of the shot region S is terminated.

In the descriptions below, a period, in which the scan movement operation is performed in order to expose a predetermined shot region S, is appropriately referred to as a scan movement period. In the descriptions below, a period, in which the step movement operation is performed in order to start the exposure of the next shot region S after the exposure termination of a predetermined shot region S, is appropriately referred to as a step movement period.

The scan movement period includes the exposure period from the exposure start of a predetermined shot region S to the exposure termination. The step movement period includes a movement period of the substrate P from the exposure termination of a predetermined shot region S to the exposure start of the next shot region S.

In the scan movement operation, the exposure light EL is emitted from the emitting surface 12. In the scan movement operation, the exposure light EL is radiated to the substrate P (object). In the step movement operation, the exposure light EL is not emitted from the emitting surface 12. In the step movement operation, the exposure light EL is not radiated to the substrate P (object).

The controller 6 sequentially exposes each of the plurality of shot regions S of the substrate P while repeating the scan movement operation and the step movement operation. Moreover, the scan movement operation is an equal speed movement mainly with respect to the Y axis direction. The step movement operation includes acceleration and deceleration movement. For example, the step movement operation between from the exposure termination of a predetermined shot region S to the exposure start of the next shot region S includes one or both of the acceleration and deceleration movement with respect to the Y axis direction and the acceleration and deceleration movement with respect to the X axis direction.

Moreover, there is a case where at least a portion of the liquid immersion space LS may be formed above the substrate stage 2 (cover member T) in at least a portion of the scan movement operation and the step movement operation. There is a case where the liquid immersion space LS may be formed over the substrate P and the substrate stage 2 (cover member T) in at least a part of the scan movement operation and the step movement operation. When the exposure of the substrate P is performed in a state where the substrate stage 2 and the measurement stage 3 approach or contact each other, there is a case where the liquid immersion space LS may be formed over the substrate stage 2 (cover member T) and the measurement stage 3 in at least a part of the scan movement operation and the step movement operation.

The controller 6 controls the driving system 15 based on exposure conditions of the plurality of shot regions S on the substrate P and moves the substrate P (substrate stage 2). For example, the exposure conditions of the plurality of shot regions S are defined by exposure control information referred to as an exposure recipe. The exposure control information is stored in the storage apparatus 7.

The exposure conditions (exposure control information) include a plurality of arrangement information of the shot region S (the position of each of the plurality of shot regions S in the substrate P). Moreover, the exposure conditions (exposure control information) include size information (size information with respect to the Y axis direction) of each of the plurality of shot regions S.

As shown in FIG. 10, rows of the shot regions S are provided on the substrate P. In the present embodiment, the rows of the shot regions S are formed by the plurality of shot regions S which are disposed in the X axis direction on the substrate P. One row includes the plurality of shot regions S which are disposed in the X axis direction.

The rows of the shot regions S are provided in plural on the substrate P. The rows of the shot region S are disposed in plural in the Y axis direction on the substrate P. In the example shown in FIG. 10, rows Ga to Gj of the shot regions S are provided on the substrate P. The row Ga is disposed at the most −Y side among the plurality of rows Ga to Gj. With respect to the Y axis direction, the row Gb is disposed to be adjacent to the row Ga. The row Gb is disposed at the +Y side of the row Ga. With respect to the Y axis direction, the row Gc is disposed to be adjacent to the row Gb. The row Gc is disposed at the +Y side of the row Gb. Similarly, the rows Gd to Gj are disposed in the Y axis direction.

In the example shown in FIG. 10, each of the rows Ga and Gj includes 6 shot regions S which are disposed in the X axis direction on the substrate P. Each of the rows Gb and Gi includes 10 shot regions S which are disposed in the X axis direction on the substrate P. Each of the rows Gc, Gd, Ge, Gf, Gg, and Gh includes 12 shot regions S which are disposed in the X axis direction on the substrate P.

The controller 6 sequentially exposes each of the plurality of shot regions S while moving the substrate P by a predetermined movement condition based on the exposure conditions (exposure control information) stored in the storage apparatus 7. The movement conditions of the substrate P (object) include at least one of the movement speed, the acceleration, the movement distance, the movement direction, and the movement locus in the XY plane.

As an example, in the present embodiment, initially, the exposure in the shot regions S of the row Ga among the plurality of shot regions S of the substrate P is performed. In the present embodiment, initially, the plurality of shot regions S included in the row Ga is sequentially exposed. When each of the plurality of shot regions S included in the row Ga are sequentially exposed, the controller 6 radiates the exposure light EL to the projection region PR while moving the substrate stage 2 so that the projection region PR of the projection optical system PL and the substrate P relatively move along a movement locus shown by an arrow Sr in FIG. 10, and sequentially exposes each of the plurality of the shot regions S of the row Ga via the liquid LQ by the exposure light EL. The controller 6 sequentially exposes each of the plurality of shot regions S included in the row Ga while repeating the scan movement operation and the step movement operation.

In the present embodiment, after each of the plurality of shot regions S included in the row Ga are sequentially exposed, the exposure of the shot regions S of the row Gb is performed. In the state where the liquid immersion space LS is formed, the controller 6 sequentially exposes each of the plurality of shot regions S included in the row Gb while repeating the scan movement operation and the step movement operation.

After each of the plurality of shot regions S included in the row Gb are sequentially exposed, each of the shot regions S of the row Gc are exposed. Similarly, each of the plurality of shot regions S included in each of rows Gd to rows Gj is sequentially exposed.

After each of the plurality of shot regions S included in the row Gj are sequentially exposed, the substrate stage 2 is moved to a substrate exchange position, and a processing which exports (unloads) the exposed substrate P from the substrate stage 2 (first holding portion) is performed.

Hereinafter, the above-described processing is repeated, and the plurality of substrates P is sequentially exposed.

In the present embodiment, the second member 22 moves in at least a portion of the exposure processing of the substrate P. For example, the second member 22 moves in parallel with at least a portion of the step movement operation of the substrate P (substrate stage 2) in the state where the liquid immersion space LS is formed. For example, the second member 22 moves in parallel with at least a portion of the scan movement operation of the substrate P (substrate stage 2) in the state where the liquid immersion space LS is formed. The exposure light EL is emitted from the emitting surface 12 in parallel with the movement of the second member 22. In addition, the second member 22 may not move during the scan movement operation. That is, the second member 22 may not move in parallel with the emission of the exposure light EL from the emitting surface 12. For example, the second member 22 may move so that the relative movement (relative speed, relative acceleration) between the second member and the substrate P (substrate stage 2) is decreased when the substrate P (substrate stage 2) performs the step movement operation. In addition, the second member 22 may move so that the relative movement (relative speed, relative acceleration) between the second member and the substrate P (substrate stage 2) is decreased when the substrate P (substrate stage 2) performs the scan movement operation.

Figure 11:
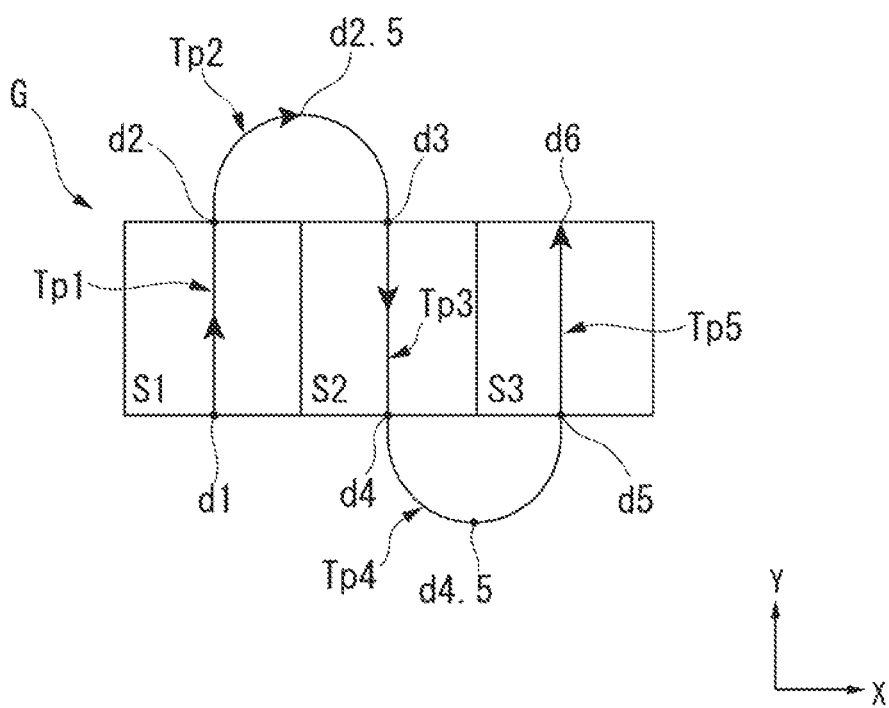
FIG. 11 is a schematic view for explaining an example of the operation of the exposure apparatus according to the first embodiment.

FIG. 11 is a view schematically showing an example of the movement locus of the substrate P when sequentially exposing each of a shot region S1, a shot region S2, and a shot region S3 included in a predetermined row G while performing the step movement which includes the components in the +X axis direction on the substrate P. The shot regions S1, S2, and S3 are disposed in the X axis direction.

As shown in FIG. 11, when the shot regions S1, S2, and S3 are exposed, the substrate P sequentially moves a pathway Tp1 from a position d1 to a position d2 adjacent at the +Y side with respect to the position d1, a pathway Tp2 from the position d2 to a position d3 adjacent at the +X side with respect to the position d2, a pathway Tp3 from the position d3 to a position d4 adjacent at the −Y side with respect to the position d3, a pathway Tp4 from the position d4 to a position d5 adjacent at the +X side with respect to the position d4, and a pathway Tp5 from the position d5 to a position d6 adjacent at the +Y side with respect to the position d5, under the terminal optical element 13. The positions d1, d2, d3, d4, d5, and d6 are positions in the XY plane.

At least a portion of the pathway Tp1 is a straight line parallel to the Y axis. At least a portion of the pathway Tp3 is a straight line parallel to the Y axis. At least a portion of the pathway Tp5 is a straight line parallel to the Y axis. The pathway Tp2 includes a curved line passing through a position d2.5. The pathway Tp4 includes a curved line passing through a position d4.5. The position d1 includes the start point of the pathway Tp1, and the position d2 includes the end point of the pathway Tp1. The position d2 includes the start point of the pathway Tp2, and the position d3 includes the end point of the pathway Tp2. The position d3 includes the start point of the pathway Tp3, and the position d4 includes the end point of the pathway Tp3. The position d4 includes the start point of the pathway Tp4, and the position d5 includes the end point of the pathway Tp4. The position d5 includes the start point of the pathway Tp5, and the position d6 includes the end point of the pathway Tp5. The pathway Tp1 is a pathway on which the substrate P moves in the +Y axis direction. The pathway Tp3 is a pathway on which the substrate P moves in the −Y axis direction. The pathway Tp5 is a pathway on which the substrate P moves in the +Y axis direction. The pathway Tp2 and the pathway Tp4 are pathways on which the substrate P moves in the direction which has the +X axis direction as the main component.

When the substrate P moves on the pathway Tp1 in the state where the liquid immersion space LS is formed, the exposure light EL is radiated to the shot region S1 via the liquid LQ. When the substrate P moves on the pathway Tp3 in the state where the liquid immersion space LS is formed, the exposure light EL is radiated to the shot region S2 via the liquid LQ. When the substrate P moves on the pathway Tp5 in the state where the liquid immersion space LS is formed, the exposure light EL is radiated to the shot region S3 via the liquid LQ. When the substrate P moves on the pathway Tp2 and the pathway Tp4, the exposure light EL is not radiated.

Each of the operation in which the substrate P moves the pathway Tp1, the operation in which the substrate P moves the pathway Tp3, and the operation in which the substrate P moves the pathway Tp5 includes the scan movement operation. Moreover, each of the operation in which the substrate P moves the pathway Tp2 and the operation in which the substrate P moves the pathway Tp4 includes the step movement operation.

That is, each of the period in which the substrate P moves the pathway Tp1, the period in which the substrate P moves the pathway Tp3, and the period in which the substrate P moves the pathway Tp5 includes the scan movement period (exposure period). Each of the period in which the substrate P moves the pathway Tp2 and the period in which the substrate P moves the pathway Tp4 includes the step movement period.

Figure 12:
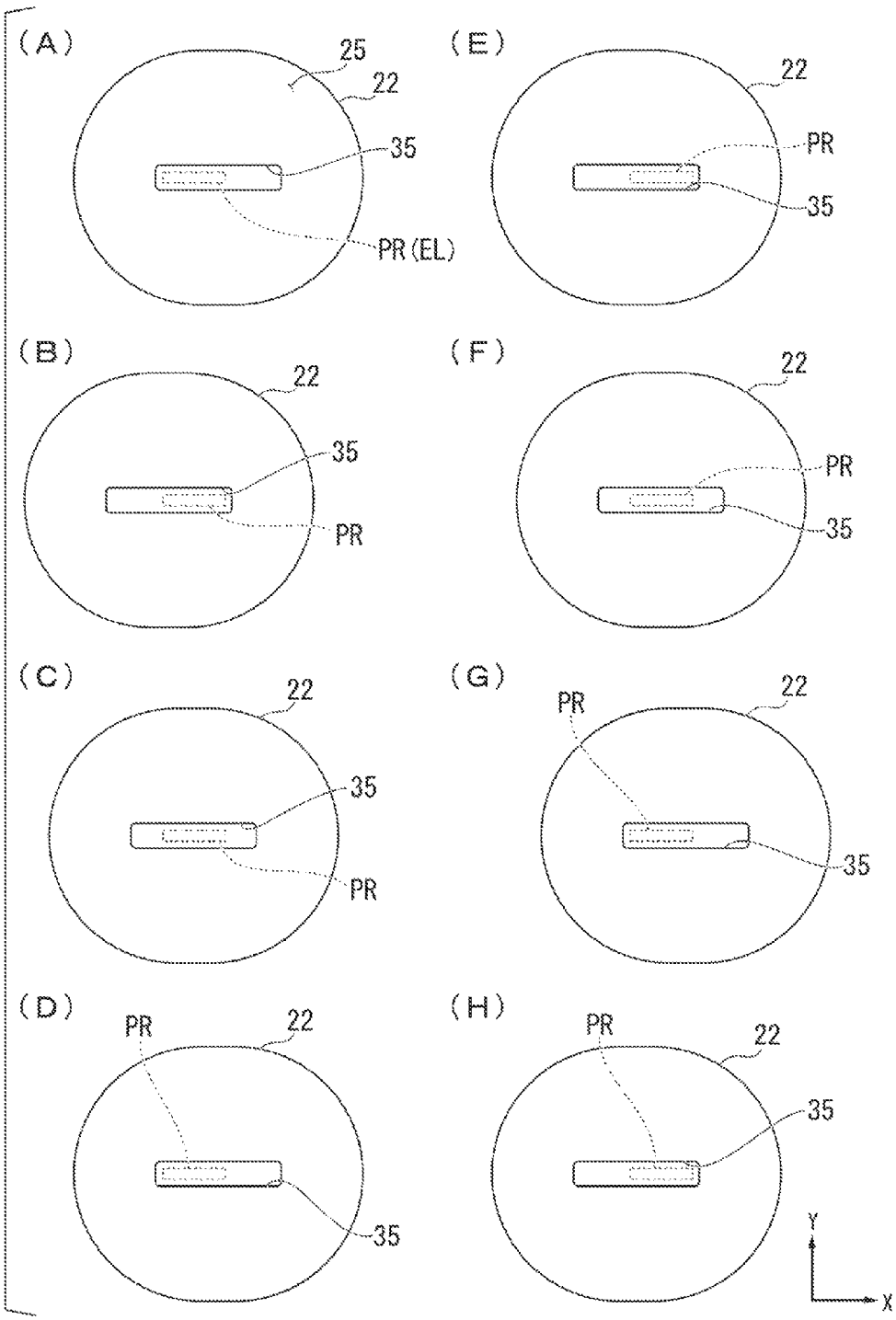
FIG. 12 is a schematic view for explaining an example of the operation of the liquid immersion member according to the first embodiment.

FIG. 12 is a schematic view showing an example of the operation of the second member 22. FIG. 12 is a view when the second member 22 is viewed from the upper surface 25 side. When the substrate P is positioned at the position d1 as shown in FIG. 11, the second member 22 is disposed at the position shown in FIG. 12(A) with respect to the projection region PR (the optical path K of the exposure light EL). When the substrate P is positioned at the position d2, the second member 22 is disposed at the position shown in FIG. 12(B) with respect to the projection region PR (the optical path K of the exposure light EL). That is, during the scan movement operation of the substrate P from the position d1 to the position d2, the second member 22 moves in the −X axis direction, which is opposite to the direction (+X axis direction) of the step movement of the substrate P. When the substrate P is positioned at the position d2.5, the second member 22 is disposed at the position shown in FIG. 12(C) with respect to the projection region PR (the optical path K of the exposure light EL). When the substrate P is positioned at the position d3, the second member 22 is disposed at the position shown in FIG. 12(D) with respect to the projection region PR (the optical path K of the exposure light EL). That is, during the step operation movement of the substrate P from the position d2 to the position d3, the second member 22 moves in the +X axis direction, which is the same as the direction (+X axis direction) of the step movement of the substrate P. When the substrate P is positioned at the position d4, the second member 22 is disposed at the position shown in FIG. 12(E) with respect to the projection region PR (the optical path K of the exposure light EL). That is, during the scan movement operation of the substrate P from the position d3 to the position d4, the second member 22 moves in the −X axis direction, which is opposite to the direction (+X axis direction) of the step movement of the substrate P. When the substrate P is positioned at the position d4.5, the second member 22 is disposed at the position shown in FIG. 12(F) with respect to the projection region PR (the optical path K of the exposure light EL). When the substrate P is positioned at the position d5, the second member 22 is disposed at the position shown in FIG. 12(G) with respect to the projection region PR (the optical path K of the exposure light EL). That is, during the step movement operation of the substrate P from the position d4 to the position d5, the second member 22 moves in the +X axis direction, which is the same as the direction (+X axis direction) of the step movement of the substrate P. When the substrate P is positioned at the position d6, the second member 22 is disposed at the position shown in FIG. 12(H) with respect to the projection region PR (the optical path K of the exposure light EL). That is, during the scan movement operation of the substrate P from the position d5 to the position d6, the second member 22 moves in the −X axis direction, which is opposite to the direction (+X axis direction) of the step movement of the substrate P.

In the present embodiment, the positions of the second member 22 shown in FIGS. 12(A), 12(D), and 12(G) include the second end part position. The positions of the second member 22 shown in FIGS. 12 (B), 12(E), and 12(H) include the first end part position. The positions of the second member 22 shown in FIGS. 12(C) and 12(F) include the center position.

In the descriptions below, the positions of the second member 22 shown in FIGS. 12(A), 12(D), and 12(G) are set to the second end part position, the positions of the second member 22 shown in FIGS. 12(B), 12(E), and 12(H) are set to the first end part position, and the positions of the second member 22 shown in FIGS. 12 (C) and 12(F) are set to the center position.

When the substrate P moves on the pathway Tp1, the second member 22 moves in the −X axis direction so as to be changed from the state shown in FIG. 12 (A) to the state shown in FIG. 12(B). That is, the second member 22 moves from the second end part position to the first end part position via the center position. When the substrate P moves on the pathway Tp2, the second member 22 moves in the +X axis direction so as to be changed from the state shown in FIG. 12(B) to the state shown in FIG. 12(D) via the state shown in FIG. 12(C). That is, the second member 22 moves from the first end part position to the second end part position via the center position. When the substrate P moves on the pathway Tp3, the second member 22 moves in the −X axis direction so as to be changed from the state shown in FIG. 12 (D) to the state shown in FIG. 12 (E). That is, the second member 22 moves from the second end part position to the first end part position via the center position. When the substrate P moves on the pathway Tp4, the second member 22 moves in the +X axis direction so as to be changed from the state shown in FIG. 12 (E) to the state shown in FIG. 12(G) via the state shown in FIG. 12(F). That is, the second member 22 moves from the first end part position to the second end part position via the center position. When the substrate P moves on the pathway Tp5, the second member 22 moves in the −X axis direction so as to be changed from the state shown in FIG. 12(G) to the state shown in FIG. 12(H). That is, the second member 22 moves from the second end part position to the first end part position via the center position.

That is, in the present embodiment, the second member 22 moves in the +X axis direction so that the relative movement between the second member and the substrate P is decreased in at least a part of a period in which the substrate P moves along the pathway Tp2. In other words, the second member 22 moves in the +X axis direction so that the relative speed between the second member and the substrate P with respect to the X axis direction is decreased in at least apart of a period in which the substrate P performs the step movement operation which includes the component in the +X axis direction. Similarly, the second member 22 moves in the +X axis direction so that the relative speed between the second member and the substrate P with respect to the X axis direction is decreased in at least a part of a period in which the substrate P moves along the pathway Tp4.

Moreover, in the present embodiment, the second member 22 moves in the −X axis direction in at least a part of a period in which the substrate P moves along the pathway Tp3. Accordingly, after the movement of the substrate P on the pathway Tp3, during in the movement of the pathway Tp4, even when the second member 22 moves in the +X axis direction, the exposure light EL is able to pass through the opening 35. Also in the case where the substrate P moves on the pathways Tp1 and Tp5, the exposure light is able to pass through the opening.

That is, when the substrate P repeats the scan movement operation and the step movement operation including the component in the +X axis direction, during the step movement operation, the second member 22 moves in the +X axis direction from the first end part position to the second end part position so that the relative speed between the second member and the substrate P is decreased, and during the scan movement operation, the second member 22 returns from the second end part position to the first end part position so that the second member 22 moves in the +X axis direction again in the next step movement operation. That is, since the second member 22 moves in −X axis direction in at least a part of a period in which the substrate P performs the vertical scan movement operation, the size of the opening 35 can be suppressed to the required minimum.

Moreover, in the embodiment, even when the second member 22 is disposed at the first end part position (second end part position), at least a portion of the fluid recovery part 27 is continuously opposite to the substrate P (object). Accordingly, for example, in the step movement operation, the fluid recovery part 27 is able to recover the liquid LQ on the substrate P (object).

In the above described explanation, the movement of the second member 22 in the step movement operation after the scanning exposure of the shot region (for example, S1) while moving the substrate P in the +Y axis direction and the movement of the second member 22 in the step movement operation after the scanning exposure of the shot region (for example, S2) while moving the substrate P in the −Y axis direction are the same as each other, but may be different from each other.

In the above described explanation, for example, the movement of the second member 22 when the substrate P is moving the pathway Tp2 (FIG. 12(B) to FIG. 12(C) to FIG. 12(D)) and the movement of the second member 22 when the substrate P is moving the pathway Tp4 (FIG. 12(E) to FIG. 12(F) to FIG. 12(G)) are the same as each other, but may be different from each other.

For example, the movement distance in +X axis direction of the second member 22 while the substrate P moves the pathway Tp2 and the movement distance in +X axis direction of the second member 22 while the substrate P moves the pathway Tp4 can be made different.

For example, in the step movement operation after the scanning exposure of the shot region (for example, S1) while moving the substrate P in +Y axis direction, the second member 22 may not be moved in +X axis direction, or the movement distance of the second member 22 in +X axis direction in the step movement operation after the scanning exposure of the shot region (for example, S1) while moving the substrate P in +Y axis direction may be made smaller than the movement of the second member 22 in +X axis direction during the step movement operation after the scanning exposure of the shot region (for example, S2) while moving the substrate P in −Y axis direction.

Additionally, in the above described explanations, the movement of the second member 22 in the scan movement operation when the substrate P moves in +Y axis direction and the movement of the second member 22 in the scan movement operation when the substrate P moves in −Y axis direction are the same as each other, but may be different from each other.

For example, the movement of the second member 22 when the substrate P moves the pathway Tp1 (FIG. 12(A) to FIG. 12(B)) and the movement of the second member 22 when the substrate P moves the pathway Tp3 (FIG. 12(G) to FIG. 12(H)) are the same as each other, but may be different from each other.

Figure 13:
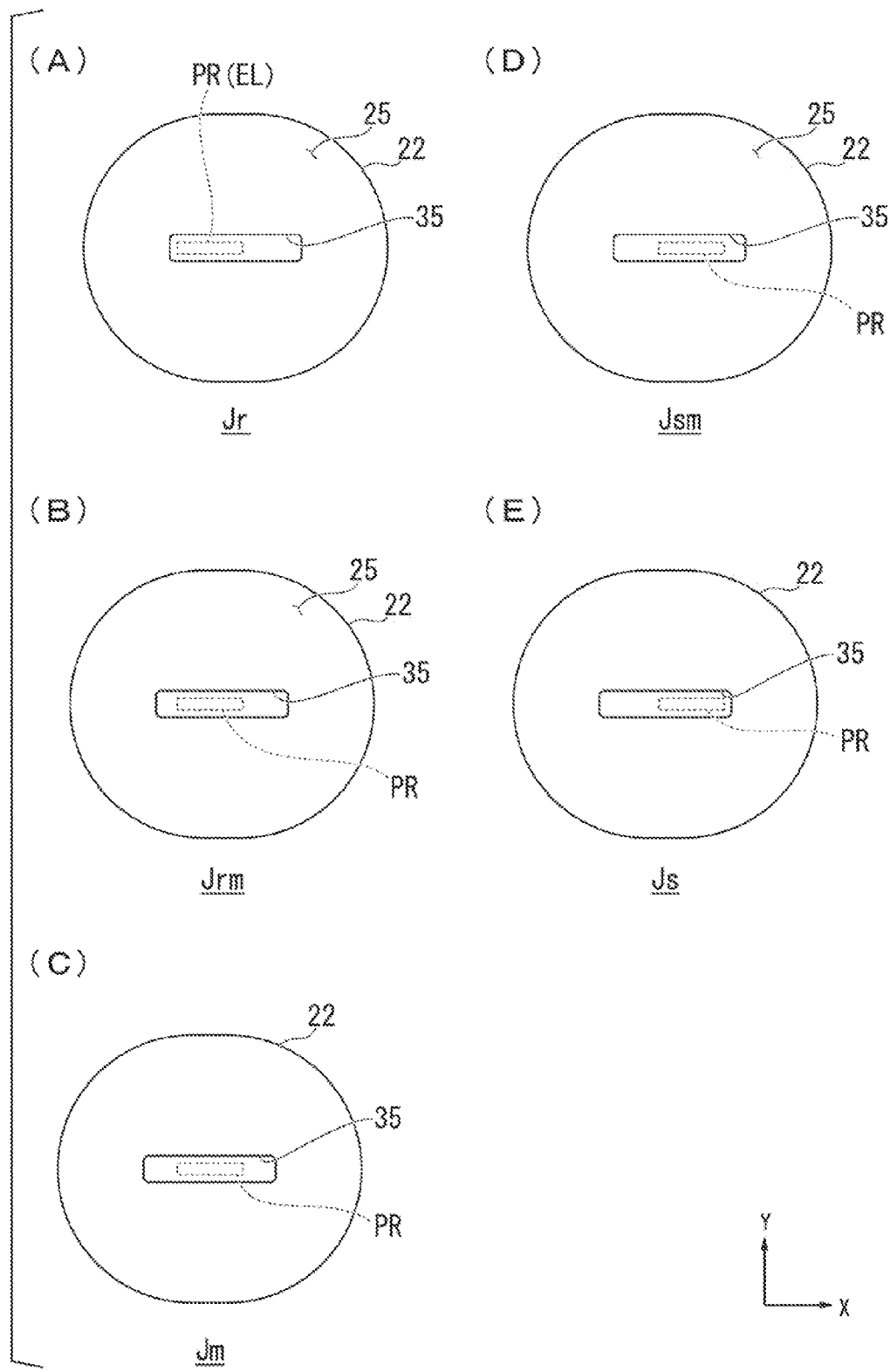
FIG. 13 is a view for explaining an example of the operation of the exposure apparatus according to the first embodiment.

FIG. 13 is a view showing an example of the position of the second member 22 with respect to the terminal optical element 13 (projection region PR). FIG. 13(A) shows an example in which the second member 22 is disposed at the second end part position. FIG. 13(B) shows an example in which the second member 22 is disposed at the position between the second end part position and the center position. FIG. 13(C) shows an example in which the second member 22 is disposed at the center position. FIG. 13(D) shows an example in which the second member 22 is disposed at the position between the first end part position and the center position. FIG. 13(E) shows an example in which the second member 22 is disposed at the first end part position.

In the descriptions below, the position of the second member 22 shown in FIG. 13(A) is appropriately referred to as a position Jr. The position of the second member 22 shown in FIG. 13(B) is appropriately referred to as a position Jrm. The position of the second member 22 shown in FIG. 13(C) is appropriately referred to as a position Jm. The position of the second member 22 shown in FIG. 13(D) is appropriately referred to as a position Jsm. The position of the second member 22 shown in FIG. 13(E) is appropriately referred to as a position Js.

The controller 6 controls the driving apparatus 32 and is able to move the second member 22 by the determined movement condition. The movement condition of the second member 22 includes at least one of the movement direction, the movement speed, the acceleration, and the movement distance. The controller 6 is able to control at least one of the movement direction, the movement speed, the acceleration, and the movement distance of the second member 22.

The controller 6 controls the driving apparatus 32 and is able to make the position of the second member 22 with respect to the terminal optical element 13 (projection region PR) be different. The controller 6 is able to stop the second member 22 in at least one of the position Jr, the position Jrm, the position Jm, the position Jsm, and the position Js. The controller 6 is able to move the second member 22 between two positions which are selected from the position Jr, the position Jrm, the position Jm, the position Jsm, and the position Js. Also, the controller 6 may be configured to capable of stopping the second member 22 at arbitrary positions which are different from the position Jr, the position Jrm, the position Jm, the position Jsm, and the position Js.

The second member 22 moves in the movable range which is determined with respect to the X axis direction.

The position Jr of the second member 22 shown in FIG. 13(A) is a position (second end part position) of the most +X side end in the movable range of the second member 22. The position is of the second member 22 shown in FIG. 13(E) is a position (first end part position) of the most −X side end in the movable range of the second member 22. The position Jm of the second member 22 shown in FIG. 13(C) is the center position in the movable range of the second member 22. The position Jrm of the second member 22 shown in FIG. 13(B) is the position between the position Jr and the position Jm in the movable range of the second member 22. The position Jsm of the second member 22 shown in FIG. 13(D) is the position between the position Js and the position Jm in the movable range of the second member 22.

The movement distance of the second member 22 between the position Jm and the position Jr is longer than the movement distance of the second member 22 between the position Jm and the position Jrm. The movement distance of the second member 22 between the position Jm and the position Js is longer than the movement distance of the second member 22 between the position Jm and the position Jsm.

Moreover, in the example described using FIGS. 11 and 12, when the substrate P is positioned at the positions d1, d3, and d5, the second member 22 is disposed at the position Jr (second end part position). When the substrate P is positioned at the positions d1, d3, and d5, the second member 22 may be disposed at the position Jrm, and may be disposed at the position Jm (center position).

Moreover, in the example described using FIGS. 11 and 12, when the substrate P is positioned at the positions d2, d4, and d6, the second member 22 is disposed at the position Js (first end part position). When the substrate P is positioned at the positions d2, d4, and d6, the second member 22 may be disposed at the position Jsm, and may be disposed at the position Jm (center position).

Moreover, in the present embodiment, when the substrate P is positioned at the positions d2.5 and d4.5, the second member 22 may be disposed at a position different from the position Jm (the center position). That is, when the substrate P is positioned at the positions d2.5 and d4.5, for example, the second member 22 may be disposed at the position Jsm, and may be disposed at the position Jrm.

As described above, in the present embodiment, after the plurality of shot regions S, which are included in one row (for example, the row Gc) on the substrate P and are disposed in the X axis direction, are sequentially exposed, the shot regions S of another row (for example, the row Gd) different from the row (for example, the row Gc) are exposed. In addition, before the plurality of shot regions S, which are included in one row (for example, the row Gc) on the substrate P and are disposed in the X axis direction, are sequentially exposed, the shot regions S of another row (for example, the row Gb) different from the row (for example, the row Gc) are exposed.

In the present embodiment, the controller 6 controls the driving apparatus 32 so that the operation (movement) of the second member 22 in the step movement period of the substrate P which is between the exposure termination of the shot region S included in the same row (for example, the row Gc) and the exposure start of another shot region S included in the row (for example, the row Gc) is different from the operation (movement) of the second member 22 in the step movement period of the substrate P which is between the exposure termination of the shot regions S of a row (for example, the row Gc) and the exposure start of the shot regions S of another row (for example, the row Gd).

In the descriptions below, the step movement period of the substrate P which is between the exposure termination of the shot region (for example, a shot region Sa3) included in the same row (for example, the row Ga) and the exposure start of another shot region (for example, a shot region Sa4) included in the row (for example, the row Ga) is appropriately referred to as a first step movement period between shot regions Sa3 and Sa4. Moreover, in the descriptions below, the step movement period of the substrate P which is between the exposure termination of the shot region (for example, a shot region Se12) of a row (for example, the row Ge) and the exposure start of the shot region (for example, a shot region Sf1) of another row (for example, the row Gf) is appropriately referred to as a second step movement period between shot regions Se12 and Sf1.

The first step movement period includes a so-called X step movement period. That is, the step movement operation performed during the first step movement period includes a so-called X step movement operation. The second step movement period includes a so-called Y step movement period. That is, the step movement operation performed during the second step movement period includes a so-called Y step movement operation. In most cases, the movement distance of the substrate P (substrate stage 2) in the XY plane in the Y step movement period is longer than the movement distance of the substrate P (substrate stage 2) in the XY plane in the X step movement period.

Moreover, the movement distance of the substrate P (substrate stage 2) in the Y step movement period may be shorter than the movement distance of the substrate P (substrate stage 2) in the X step movement period. In addition, the movement distance of the substrate P (substrate stage 2) in the Y step movement period may be substantially equal to the movement distance of the substrate P (substrate stage 2) in the X step movement period.

Figure 14:
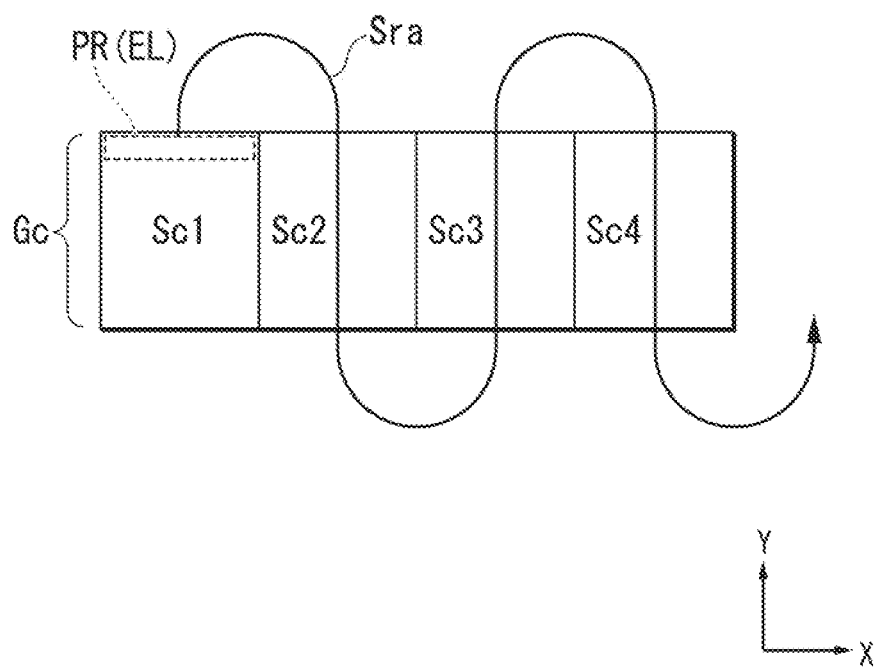
FIG. 14 is a view for explaining an example of the operation of the exposure apparatus according to the first embodiment.

FIG. 14 is a view schematically showing an example of a state where the plurality of shot regions Sc1 to Sc4 included in the same row (for example, the row Gc) is sequentially exposed. With respect to the X axis direction, the shot region Sc4 is disposed to be adjacent to the shot region Sc3. With respect to the X axis direction, the shot region Sc3 is disposed to be adjacent to the shot region Sc2. With respect to the X axis direction, the shot region Sc2 is disposed to be adjacent to the shot region Scd. The shot region Sc4 is disposed more on the +X side than the shot region Sc3. The shot region Sc3 is disposed more on the +X side than the shot region Sc2. The shot region Sc2 is disposed more on the +X side than the shot region Sc1.

In the state where the liquid immersion space LS of the liquid LQ is formed, the controller 6 sequentially exposes the plurality of shot regions Sc1 to Sc4 included in row Gc via the liquid LQ while repeating the scan movement operation and the step movement operation so that the substrate P relatively moves with respect to the projection region PR of the projection optical system PL along the movement locus shown in an arrow Sra in FIG. 14.

Figure 15:
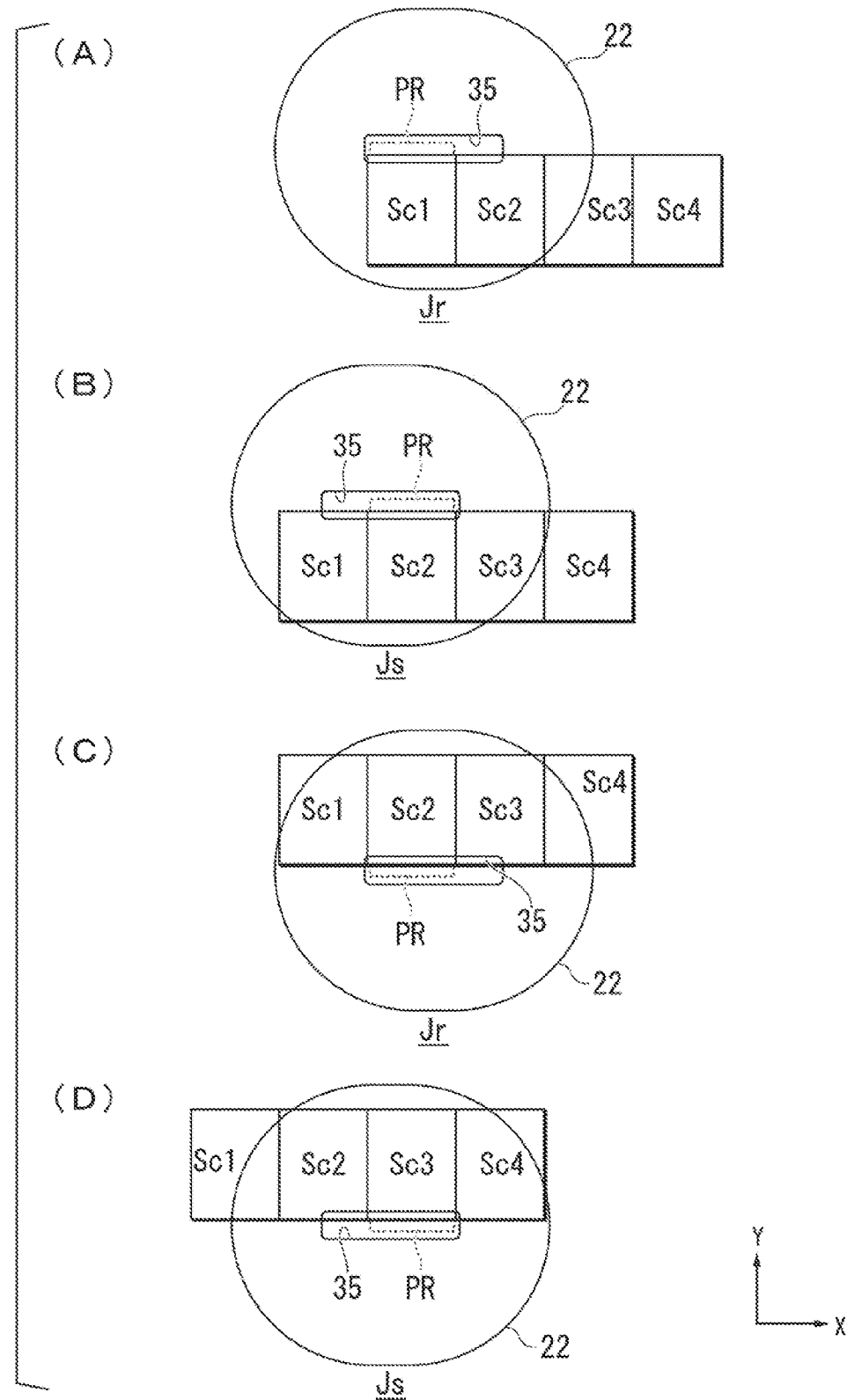
FIG. 15 is a view for explaining an example of a second member according to the first embodiment.

FIG. 15 is a view schematically showing an example of the operation (movement) of the second member 22 when the shot regions Sc1 to Sc4 are sequentially exposed.

FIG. 15(A) shows a state where the substrate P is disposed at the exposure termination position of the shot region Sc1 (the termination position of the scan movement operation of the shot region Sc1, the starting position of the step movement operation between the shot regions Sd1 and Sc2).

FIG. 15(B) shows a state where the substrate P is disposed at the exposure starting position of the shot region Sc2 (the starting position of the scan movement operation of the shot region Sc2, the termination position of the step movement operation between the shot regions Sc1 and Sc2).

FIG. 15(C) shows a state where the substrate P is disposed at the exposure termination position of the shot region Sc2 (the termination position of the scan movement operation of the shot region Sc2, the starting position of the step movement operation between the shot regions Sc2 and Sc3).

FIG. 15(D) shows a state where the substrate P is disposed at the exposure starting position of the shot region Sc3 (the starting position of the scan movement operation of the shot region Sc3, the termination position of the step movement operation between the shot regions Sc2 and Sc3).

The exposure of the shot region Sc1 will be described. In order to expose the shot region Sc1, the controller 6 performs the scan movement operation of the substrate P which includes at least the movement in the −Y axis direction in between of the exposure start of the shot region Sc1 and the exposure termination of the shot region Sc1. In the scan movement period of the substrate P for exposing the shot region Sc1, the second member 22 moves from the position Js to the position Jr. As shown in FIG. 15(A), in the exposure termination of the shot region Sc1, the second member 22 is disposed at the position Jr. In the scan movement period of the substrate P for exposing the shot region Sc1, the second member 22 moves in the +X axis direction from a start of the movement at the position Js until it reaches the position Js.

Next, the step movement between the shot regions Sc1 and Sc2 will be described. After the scan movement operation of the substrate P for exposing the shot region Sc1 is terminated, the step movement operation of the substrate P between the shot regions Sc1 and Sc2 is performed. In the present embodiment, the controller 6 performs the step movement operation of the substrate P which includes at least the movement in the −X axis direction in between of the exposure termination of the shot region Scd and the exposure start of the shot region Sc2. In at least a portion of the step movement period of the substrate P between the shot regions Sc1 and Sc2, the second member 22 is moved in the movement direction (−X axis direction) of the substrate P. The second member 22 is moved so that the relative speed between the second member and the substrate P is decreased.

In the present embodiment, during in the step movement period (the first step movement period) of the substrate P between the shot regions Sc1 and Sc2, the second member 22 moves from the position Jr to the position Js. As shown in FIG. 15(B), in the step movement termination between the shot regions Sc1 and Sc2, the second member 22 is disposed at the position Js. In the step movement period (the first step movement period) of the substrate P between the shot regions Sc1 and Sc2, the second member 22 moves in the +X axis direction from a start of the movement at the position Jr until it reaches the position Js.

Next, the exposure of the shot region Sc2 will be described. After the step movement operation of the substrate P between the shot regions Sc1 and Sc2 is terminated, the scan movement operation of the substrate P is performed for exposing the shot region Sc2. In order to expose the shot region Sc2, the controller 6 performs the scan movement operation of the substrate P which includes at least the movement in the +Y axis direction in between of the exposure start of the shot region Sc2 and the exposure termination of the shot region Sc2. In the scan movement period of the substrate P for exposing the shot region Sc2, the second member 22 moves from the position Js to the position Jr. As shown in FIG. 15(C), in the exposure termination of the shot region Sc2, the second member 22 is disposed at the position Jr. In the scan movement period of the substrate P for exposing the shot region Sc2, the second member 22 moves in the +X axis direction from a start of the movement at the position Js until it reaches the position Jr.

Next, the step movement between the shot regions Sc2 and Sc3 will be described. After the scan movement operation of the substrate P for exposing the shot region Sc2 is terminated, the step movement operation of the substrate P between the shot regions Sc2 and Sc3 is performed. In the present embodiment, the controller 6 performs the step movement operation of the substrate P which includes at least the movement in the −X axis direction in between of the exposure termination of the shot region Sc2 and the exposure start of the shot region Sc3. In at least a portion of the step movement period of the substrate P between the shot regions Sc2 and Sc3, the second member 22 is moved in the movement direction (−X axis direction) of the substrate P. The second member 22 is moved so that the relative speed between the second member and the substrate P is decreased. In the present embodiment, during the step movement period (the first step movement period) of the substrate P between the shot regions Sc2 and Sc3, the second member 22 moves from the position Jr to the position Js. As shown in FIG. 15(D), in the step movement termination between the shot regions Sc2 and Sc3, the second member 22 is disposed at the position Js. In the step movement period (the first step movement period) of the substrate P between the shot regions Sc2 and Sc3, the second member 22 moves in the −X axis direction from a start of the movement at the position Jr until it reaches the position Jr.

Next, the exposure of the shot region Sc3 will be described. In the present embodiment, the step movement operation of the substrate P and the operation (movement) of the second member 22 for exposing the shot region Sc3 are similar to the step movement operation of the substrate P and the operation (movement) of the second member 22 for exposing the shot region Sc1. That is, the scan movement operation of the substrate P which includes at least the movement in the −Y axis direction is performed in between of the exposure start of the shot region Sc3 and the exposure termination of the shot region Sc3. In addition, in the scan movement period of the substrate P for exposing the shot region Sc3, the second member 22 moves from the position Js to the position Jr.

Next, the step movement between the shot regions Sc3 and Sc4 will be described. In the present embodiment, the step movement operation between the shot regions Sc3 and Sc4 and the operation (movement) of the second member 22 are similar to the step movement between the shot regions Sc1 and Sc2 and the operation (movement) of the second member 22. That is, the step movement operation of the substrate P which includes at least the movement in the −X axis direction is performed in between of the exposure termination of the shot region Sc3 and the exposure start of the shot region Sc4. Moreover, in the step movement period of the substrate P between the shot regions Sc3 and Sc4, the second member 22 moves from the position Jr to the position Js.

Next, the exposure of the shot region Sc4 will be described. In the present embodiment, the step movement operation of the substrate P and the operation (movement) of the second member 22 for exposing the shot region Sc4 are similar to the step movement operation of the substrate P and the operation (movement) of the second member 22 for exposing the shot region Sc2. That is, the scan movement operation of the substrate P which includes at least the movement in the +Y axis direction is performed in between of the exposure start of the shot region Sc4 and the exposure termination of the shot region Sc4. In addition, in the scan movement period of the substrate P for exposing the shot region Sc4, the second member 22 moves from the position Js to the position Jr.

Hereinafter, when the plurality of shot regions Sc included in the same row Gc are sequentially exposed, the controller 6 performs operations similar to the operations, which are described referring to FIGS. 15(A) to 15(D), with respect to the substrate P (substrate stage 2) and the second member 22.

As described above, in the present embodiment, in the first step movement period of the substrate P1 between the shot regions Sc and Sc included in the same row Gc, the second member 22 moves to one side (+X side) with respect to the X axis direction. Moreover, in the first step movement period, the substrate P moves to one side (+X side) at least with respect to the X axis direction.

In the present embodiment, in the first step movement period of the substrate P1 between the shot regions Sc and Sc included in the same row Gc, the second member 22 may continuously move. That is, in the period in which the substrate P moves from the exposure termination position of the shot region Sc (for example Sc1) of the row Gc to the exposure starting position of the next shot region Sc (for example Sc2), the movement speed of the second member 22 with respect to the terminal optical element 13 (first member 21) may not be zero. In other words, in the first step movement period, the second member 22 may not stop with respect to the terminal optical element 13 (first member 21).

In the present embodiment, in the exposure period (the scan movement period for exposing the shot region Sc) which is between the exposure start of the shot region Sc (for example Sc1) and the exposure termination of the shot region Sc (Sc1), the second member 22 may continuously move.

In the present embodiment, the second member 22 may continuously move at each of the exposure periods (the scan movement period for exposing the shot region Sc) which is between the exposure start of the shot region Sc (for example Sc1) and the exposure termination of the shot region Sc (Sc1), the first step movement period of the substrate P between the shot regions Sc and Sc (for example, between Sc1 and Sc2), and the exposure period (the scan movement period for exposing the shot region Sc2) which is between the exposure start of the next shot region Sc (for example Sc2) and the exposure termination.

In addition, in at least a portion of the exposure period of the shot region Sc, the second member 22 may stop with respect to the terminal optical element 13 (first member 21).

Moreover, in at least a portion of the first step movement period of the substrate P between the shot regions Sc and Sc included in a row (for example, the row Gc), the second member 22 may stop with respect to the terminal optical element 13 (first member 21).

Figure 16:
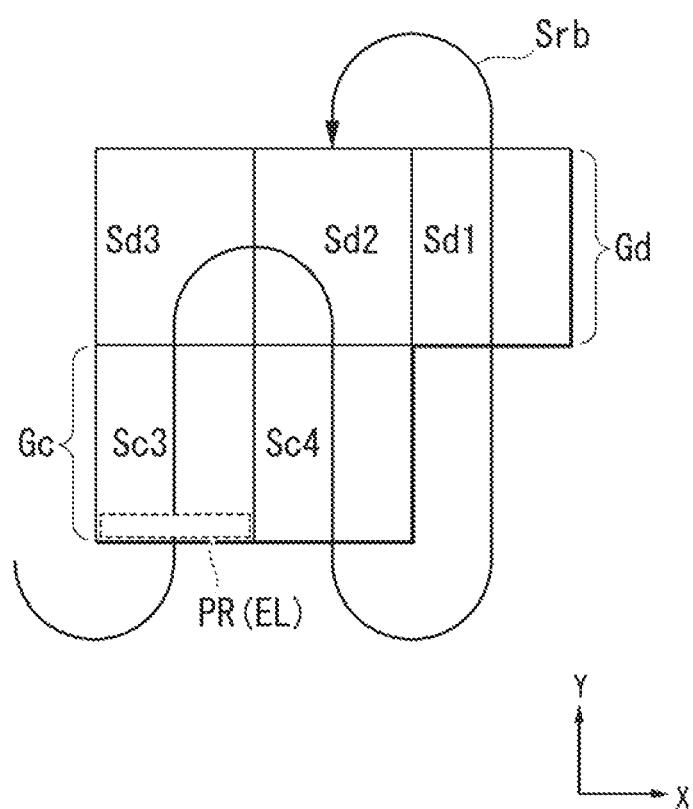
FIG. 16 is a view for explaining an example of the operation of the exposure apparatus according to the first embodiment.

FIG. 16 is a view schematically showing an example of a state in which after the shot region S (for example, the shot region Sc4) of a row (for example, the row Gc) is exposed, the exposure of the shot region S (for example, a shot region Sd1) of another row (for example, the row Gd) different from the row is performed. With respect to the Y axis direction, the row Gd including the shot region Sd1 is disposed to be adjacent to the row Gc including the shot region Sc4. The row Gd is disposed more on the +Y side than the row Gc.

With respect to the Y axis direction, the position of the shot region Sd1 is different from the position of the shot region Sc4. The shot region Sd1 is disposed more on the +Y side than the shot region Sc4. With respect to the X axis direction, the position of the shot region Sd1 is different from the position of the shot region Sc4. The shot region Sd1 is disposed more on the +X side than the shot region Sc4. Moreover, with respect to the X axis direction, the position of the shot region Sd1 may be the same as the position of the shot region Sc4, and the shot region Sd1 may be disposed more on the −X side than the shot region Sc4.

With respect to the X axis direction, the shot region Sd2 is disposed to be adjacent to the shot region Sd1. With respect to the X axis direction, the shot region Sd3 is disposed to be adjacent to the shot region Sd2. The shot region Sd2 is disposed more on the −X side than the shot region Sd1. The shot region Sd3 is disposed more on the −X side than the shot region Sd2.

In the state where the liquid immersion space LS of the liquid LQ is formed, after the controller 6 exposes the shot region Sc4 included in row Gc via the liquid LQ while repeating the scan movement operation and the step movement operation so that the substrate P relatively moves with respect to the projection region PR of the projection optical system PL along the movement locus shown in an arrow Srb in FIG. 16, the controller exposes the shot region Sd1 included in the row Gd via the liquid LQ. Moreover, after the shot region Sd1 included in the row Gd is exposed, a plurality of shot regions Sd2 and Sd3 included in the row Gd are sequentially exposed via the liquid LQ.

Figure 17:
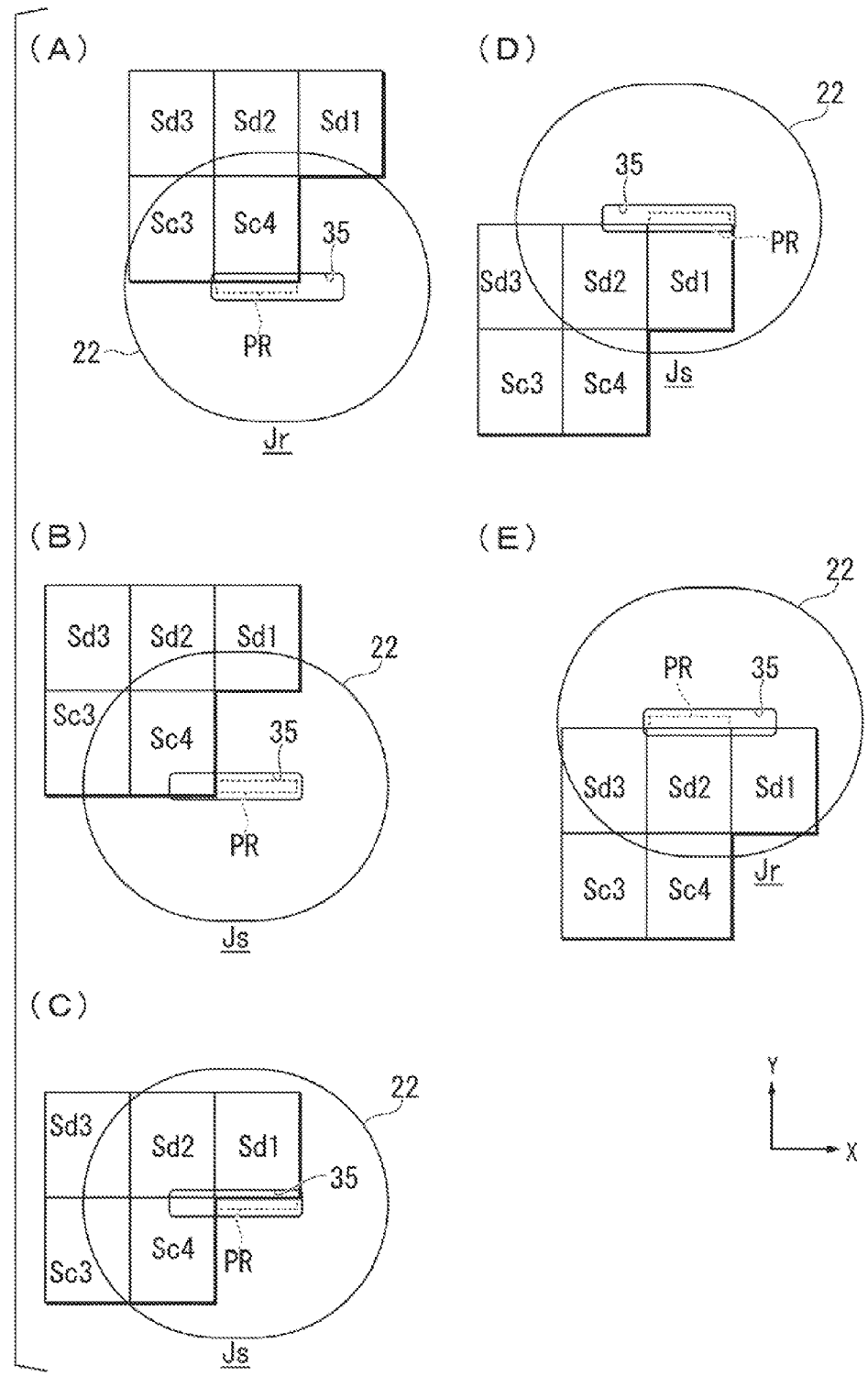
FIG. 17 is a view for explaining an example of an operation of the second member according to the first embodiment.

FIG. 17 is a view schematically showing an example of the operation (movement) of the second member 22 when the shot region Sd1 included in the row Gd is exposed after the shot region Sc4 included in the row Gc is exposed.

FIG. 17(A) shows a state where the substrate P is disposed at the exposure termination position of the shot region Sc4 (the termination position of the scan movement operation of the shot region Sc4, the starting position of the step movement operation between the shot regions Sc4 and Sd1).

FIG. 17(B) shows a state when the substrate P is moving from the exposure termination position of the shot region Sc4 to the exposure starting position of the shot region Sd1 (the starting position of the scan movement operation of the shot region Sd1).

FIG. 17(C) shows a state where the substrate P is disposed at the exposure starting position of the shot region Sd1 (the starting position of the scan movement operation of the shot region Sd1, the termination position of the step movement operation between the shot regions Sc4 and Sd1).

FIG. 17(D) shows a state where the substrate P is disposed at the exposure termination position of the shot region Sd1 (the termination position of the scan movement operation of the shot region Sd1, the starting position of the step movement operation between the shot regions Sd1 and Sd2).

FIG. 17(E) shows a state where the substrate P is disposed at the exposure starting position of the shot region Sd2 (the starting position of the scan movement operation of the shot region Sd2, the termination position of the step movement operation between the shot regions Sd1 and Sd2).

The exposure of the shot region Sc4 will be described. For example, as described referring to FIG. 15, the scan movement operation of the substrate P which includes at least the movement in the +Y axis direction is performed in between of the exposure start of the shot region Sc4 and the exposure termination of the shot region Sc4. In the scan movement period of the substrate P for exposing the shot region Sc4, the second member 22 moves from the position Js to the position Jr. As shown in FIG. 17(A), in the exposure termination of the shot region Sc4, the second member 22 is disposed at the position Jr. In the scan movement period of the substrate P for exposing the shot region Sc4, the second member 22 may continuously move. Moreover, in at least a portion of the scan movement period for exposing the shot region Sc4, the second member 22 may stop.

Next, the step movement between the shot regions Sc4 and Sd1 will be described. After the scan movement operation of the substrate P for exposing the shot region Sc4 is terminated, the step movement operation of the substrate P between the shot regions Sc4 and Sd1 is performed.

In the present embodiment, the step movement period (the second step movement period) of the substrate P which is between the exposure termination of the shot region Sc4 of the row Gc and the exposure start of the shot region Sd1 of the row Gd is longer than the step movement period (the first step movement period) of the substrate P which is between the exposure termination of the shot region Sc (for example, the shot region Sc2) included in the same row Gc and the exposure start of the next shot region Sc (for example, the shot region Sc3).

Moreover, in the present embodiment, the step movement distance of the substrate P which is between the exposure termination position of the shot region Sc4 of the row Gc and the exposure starting position of the shot region Sd1 of the row Gd is longer than the step movement distance of the substrate P which is between the exposure termination position of the shot region Sc (for example, the shot region Sc2) included in the same row Gc and the exposure starting position of the next shot region Sc (for example, the shot region Sc3).

In the present embodiment, the controller 6 performs the step movement operation of the substrate P which includes at least the movements in the −X axis direction and the −Y axis direction in between of the exposure termination of the shot region Sc4 and the exposure start of the shot region Sd1. In the present embodiment, the step movement operation of the substrate P between the shot regions Sc4 and Sd1 includes a first operation in which the substrate P moves in at least the X axis direction as shown in FIGS. 17(A) and 17(B), and a second operation in which the substrate P mainly moves in the Y axis direction as shown in FIGS. 17(B) and 17(C). In the first operation, the state shown in FIG. 17(A) is changed to the state shown in FIG. 17(B). In the second operation, the state shown in FIG. 17(B) is changed to the state shown in FIG. 17(C). The first operation includes the substrate P moving in at least the X axis direction. In the present embodiment, the first operation includes the substrate P moving in one or both of the +Y axis direction and the −Y axis direction while moving in the −X axis direction. The second operation includes the substrate P moving in the Y axis direction. In the second operation, the movement of the substrate P (at least one of the movement distance, the movement speed, and the acceleration of the substrate P) with respect to the X axis direction is smaller than the first operation. In the present embodiment, in the second operation, the substrate P moves in the −Y axis direction and does not substantially move in the X axis direction. Moreover, in the second operation, the substrate P may move in the X axis direction while moving in the Y axis direction. For example, the substrate P may be moved so that the movement of the substrate P with respect to the X axis direction in the second operation is smaller than the movement of the substrate P with respect to the X axis direction in the first operation.

That is, in the present embodiment, in the step movement period (the second step movement period) of the substrate P which is between the exposure termination of the shot region Sc4 and the exposure start of the shot region Sd1, the controller 6 performs the first operation which moves the substrate P in at least the −X axis direction and the second operation which mainly moves the substrate P in the −Y axis direction.

In the present embodiment, in the period in which the first operation of the substrate P is performed during the step movement period (the second step movement period) of the substrate P between the shot regions Sc4 and Sd1, the second member 22 is moved in the movement direction (−X axis direction) of the substrate P. The second member 22 is moved so that the relative speed between the second member and the substrate P is decreased. In the present embodiment, in the period in which the first operation of the substrate P is performed during the step movement period (the second step movement period) of the substrate P between the shot regions Sc4 and Sd1, the second member 22 moves from the position Jr to the position Js. As shown in FIG. 17(B), during (the termination of the first operation) the step movement operation between the shot regions Sc4 and Sd1, the second member 22 is disposed at the position Js. In other words, the second member 22 is disposed at the position Js before the exposure start of the shot region Sc1 and after the exposure termination of the shot region Sc4. In the period in which the first operation of the substrate P is performed, the second member 22 moves in the −X axis direction from a start of the movement at the position Jr until it reaches the position Js.

In the present embodiment, in the period in which the second operation of the substrate P is performed during the step movement period (the second step movement period) of the substrate P between the shot regions Sc4 and Sd1, the second member 22 does not move. In other words, in the period in which the second operation of the substrate P is performed, the second member 22 stops with respect to the terminal optical element 13 (first member 21). In the period in which the second operation of the substrate P is performed, the relative speed of the second member 22 with respect to the terminal optical element 13 (first member 21) becomes zero. That is, in the period in which the substrate P does not substantially move in the X axis direction (or the movement in the X axis direction is small) during the step movement period (second step movement period) of the substrate P, the second member 22 does not move in the X axis direction. In the period in which the second operation is performed, the position of the second member 22 is maintained at the position Js.

In at least a part of a period in which the first operation of the substrate P is performed, the second member 22 may stop. Moreover, in at least a part of a period in which the second operation of the substrate P is performed, the second member 22 may be moved.

Moreover, in the step movement period (the second step movement period) of the substrate P between the shot regions Sc4 and Sc1, the second operation may be performed after the first operation of the substrate P, and the first operation may be performed after the second operation of the substrate P. In addition, in the step movement period (the second step movement period) of the substrate P between the shot regions Sc4 and Sc1, the first operation and the second operation of the substrate P may be alternately performed. In addition, in the second step movement period, the movement of the substrate P may not be divided to the first operation and the second operation. For example, in the second step movement period, the substrate P may be continuously moved in X axis direction and Y axis direction. In this case, the second member 22 may be continuously moved in −X axis direction during the period of changing from the state shown in FIG. 17(A) to the state shown in FIG. 17(C).

Next, the exposure of the shot region Sd1 will be described. After the step movement operation of the substrate P between the shot regions Sc4 and Sd1 is terminated, the scan movement operation of the substrate P is performed to expose the shot region Sd1. In order to expose the shot region Sd1, the controller 6 performs the scan movement operation of the substrate P which includes at least the movement in the −Y axis direction in between of the exposure start of the shot region Sd1 and the exposure termination of the shot region Sd1.

In the present embodiment, in the scan movement period of the substrate P for exposing the shot region Sd1, the second member 22 does not move. In other words, in the scan movement period of the substrate P for exposing the shot region Sd1, the second member 22 stops with respect to the terminal optical element 13 (first member 21). In the scan movement period of the substrate P for exposing the shot region Sd1, the relative speed of the second member 22 with respect to the terminal optical element 13 (first member 21) becomes zero. That is, in the scan movement period of the substrate P for exposing the shot region Sd1 in which the substrate P does not substantially move in the X axis direction, the second member 22 does not move in the X axis direction. As shown in FIG. 17(C), in the exposure start of the shot region Sd1, the second member 22 is disposed at the position is. As shown in FIG. 17(D), at the exposure termination of the shot region Sd1, the second member 22 is disposed at the position Js. That is, in the scan movement period of the substrate P for exposing the shot region Sd1, the position of the second member 22 is maintained at the position is.

Moreover, in at least a portion of the scan movement period of the substrate P for exposing the shot region Sd1, the second member 22 may be moved.

Next, the step movement between the shot regions Sd1 and Sd2 will be described. After the scan movement operation of the substrate P for exposing the shot region Sd1 is terminated, the step movement operation of the substrate P between the shot regions Sd1 and Sd2 is performed. In the present embodiment, the controller 6 performs the step movement operation of the substrate P which includes at least the movement in the +X axis direction in between of the exposure termination of the shot region Sd1 and the exposure start of the shot region Sd2. In at least a portion of the step movement period of the substrate P between the shot regions Sd1 and Sd2, the second member 22 moves in the movement direction (+X axis direction) of the substrate P. The second member 22 is moved so that the relative speed between the second member and the substrate P is decreased. In the present embodiment, in the step movement period (the first step movement period) of the substrate P between the shot regions Sd1 and Sd2, the second member 22 moves from the position Js to the position Jr. As shown in FIG. 17(E), in the step movement termination between the shot regions Sd1 and Sd2, the second member 22 is disposed at the position Jr. In the step movement period (the first step movement period) of the substrate P between the shot regions Sd1 and Sd2, the second member 22 moves in the +X axis direction from a start of the movement at the position Js until it reaches the position Jr.

Next, the exposure of the shot region Sd2 will be described. After the step movement operation of the substrate P between the shot regions Sd1 and Sd2 is terminated, the scan movement operation of the substrate P is performed to expose the shot region Sd2. The scan movement operation of the substrate P which includes at least the movement in the +Y axis direction is performed in between of the exposure start of the shot region Sd2 and the exposure termination of the shot region Sd2. In addition, in the scan movement period of the substrate P for exposing the shot region Sd2, the second member 22 moves from the position Jr to the position Js.

Next, the step movement between the shot regions Sd2 and Sd3 will be described. The step movement operation of the substrate P which includes at least the movement in the +X axis direction is performed in between of the exposure termination of the shot region Sd2 and the exposure start of the shot region Sd3. Moreover, in the step movement period of the substrate P between the shot regions Sd2 and Sd3, the second member 22 moves from the position Js to the position Jr.

Hereinafter, when the plurality of shot regions Sd included in the same row Gd are sequentially exposed, the controller 6 performs operations similar to the operations, which are described referring to FIGS. 17(C) to 17(E), with respect to the substrate P (substrate stage 2) and the second member 22.

As described referring to FIGS. 15 to 17, in the present embodiment, the operation (movement) of the second member 22 in the first step movement period of the substrate P which is between the exposure termination of the shot region S (for example, the shot region Sc2) included in a row (for example, the row Gc) and the exposure start of the next shot region S (for example, the shot region Sc3) included in the same row (the row Gc) is different from the operation (movement) of the second member 22 in the second step movement period of the substrate P which is between the exposure termination of the shot region S (for example, the shot region Sc4) of a row (for example, the row Gc) and the exposure start of the shot region S (for example, the shot region Sd1) of another row (for example, the row Gd) different from the row.

In the present embodiment, as an example, the second member 22 continuously moves in the first step movement period, and the movement of the second member 22 stops at the period (the period in which the second operation is performed) in a portion of the second step movement period.

Moreover, in the present embodiment, at the start of the step movement period (the second step movement period) between the shot regions Sc4 and Sd1 and the start of the step movement period (the first step movement period) between the shot regions Sd1 and Sd2, the positions of the second members 22 with respect to the terminal optical element 13 (the first member 21) are different from each other. In the present embodiment, as shown in FIG. 17(A), at the start of the step movement period (the second step movement period) between the shot regions Sc4 and Sd1, the second member 22 is disposed at the position Jr. As shown in FIG. 17(D), at the start of the step movement period (the first step movement period) between the shot regions Sd1 and Sd2, the second member 22 is disposed at the position Js.

In addition, in the present embodiment, at the termination of the step movement period (the second step movement period) between the shot regions Sc4 and Sd1 and at the termination of the step movement period (the first step movement period) between the shot regions Sd1 and Sd2, the positions of the second members 22 with respect to the terminal optical element 13 (the first member 21) are different from each other. In the present embodiment, as shown in FIG. 17(C), at the termination of the step movement period (the second step movement period) between the shot regions Sc4 and Sd1, the second member 22 is disposed at the position Js. As shown in FIG. 17(E), at the termination of the step movement period (the first step movement period) between the shot regions Sd1 and Sd2, the second member 22 is disposed at the position Jr.

Moreover, in the present embodiment, in the step movement period (the second step movement period) between the shot regions Sc4 and Sd1 and the step movement period (the first step movement period) between the shot regions Sd1 and Sd2, the movement directions of the second members 22 are different from each other. In the present embodiment, as shown in FIGS. 17(A), 17(B), and 17(C), in the step movement period (the second step movement period) between the shot regions Sc4 and Sd1, the second member 22 moves from the position Jr to the position Js. That is, in the second step movement period, the second member 22 moves in the −X axis direction. As shown in FIGS. 17(D) and 17(E), in the step movement period (the first step movement period) between the shot regions Sd1 and Sd2, the second member 22 moves from the position Js to the position Jr. That is, in the first step movement period, the second member 22 moves in the +X axis direction.

In the present embodiment, in the step movement period (the second step movement period) between the shot regions Sc4 and Sd1 and the step movement period (the first step movement period) between the shot regions Sd1 and Sd2, the movement distances of the second members 22 may be substantially the same as each other or may be different from each other. The movement distance of the second member 22 in the first step movement period may be longer than or may be shorter than the movement distance of the second member 22 in the second step movement period. For example, when the second member 22 moves between the position Js and the position Jr in the first step movement period, in the second step movement period, the second member 22 may move between the position Jr and the position Jsm, may move between the position Jm and the position Jm, and may move between the position Jr and the position Jrm. Moreover, in the second step movement period, the second member 22 may move between the position Jrm and the position Js, may move between the position Jrm and the position Jsm, and may move between the position Jrm and the position Jm. In addition, for example, when the second member 22 moves between the position Jr and the position Js in the second step movement period, the second member 22 may move between the position Js and the position Jrm, may move between the position Js and the position Jm, and may move between the position Js and the position Jsm during the first step movement period. Moreover, in the second step movement period, the second member 22 may move between the position Jsm and the position Jr, may move between the position Jsm and the position Jrm, and may move between the position Jsm and the position Jm.

In addition, in the present embodiment, in the step movement period (the second step movement period) between the shot regions Sc4 and Sd1 and the step movement period (the first step movement period) between the shot regions Sd1 and Sd2, the movement speed of the second members 22 may be substantially the same as each other or may be different from each other. The movement speed of the second member 22 in the first step movement period may be higher than or may be lower than the movement speed of the second member 22 in the second step movement period.

Moreover, in the present embodiment, in the step movement period (the second step movement period) between the shot regions Sc4 and Sd1 and the step movement period (the first step movement period) between the shot regions Sd1 and Sd2, an acceleration (deceleration) of the second member 22 may be substantially the same as each other or may be different from each other. The acceleration of the second member 22 in the first step movement period may be higher than or may be lower than the acceleration of the second member 22 in the second step movement period.

In the present embodiment, the second member 22 is able to move in the X axis direction, and the movement directions of the second members 22 in the first and second step movement periods include the movement direction of the second member 22 with respect to the X axis direction. Similarly, in the present embodiment, the movement distances of the second members 22 in the first and second step movement periods include the movement distance of the second member 22 with respect to the X axis direction. The movement speeds of the second members 22 in the first and second step movement periods include the movement speed of the second member 22 with respect to the X axis direction. The movement acceleration of the second members 22 in the first and second step movement periods includes the acceleration of the second member 22 with respect to the X axis direction.

Moreover, the second member 22 may be movable in at least two directions in the XY plane. For example, the second member 22 may be movable in each of the X axis direction and the Y axis direction. In the first step movement period and the second step movement period, the movement directions of the second members 22 with respect to the terminal optical element 13 in the XY plane may be different from each other, the movement distances thereof may be different from each other, the movement speed thereof may be different from each other, and the acceleration (deceleration) thereof may be different from each other.

Moreover, the second member 22 may be movable in six directions of the X axis, the Y axis, the Z axis, the θX, the θY, and the θZ. In the first step movement period and the second step movement period, the movement directions of the second members 22 with respect to the terminal optical element 13 in six directions may be different, the movement distances thereof may be different, the movement speed thereof may be different, and the acceleration (deceleration) thereof may be different.

Moreover, in the second step movement period, the second member 22 may continuously move. That is, in the second step movement period, the movement speed of the second member 22 with respect to the terminal optical element 13 (first member 21) may not be zero. In other words, in the second step movement period, the second member 22 may not stop with respect to the terminal optical element 13 (first member 21).

Moreover, in both of the first step movement period and the second step movement period, the second member 22 may continuously move.

In addition, in the present embodiment, during the exposure period (the exposure period for exposing the shot region Sc4) which is between the exposure start of the shot region Sc4 and the exposure termination and during the second step movement period between the shot regions Sc4 and Sd1, the second member 22 may continuously move. Moreover, during the exposure period (the exposure period for exposing the shot region Sc4) which is between the exposure start of the shot region Sc4 and the exposure termination, during the second step movement period between the shot regions Sc4 and Sd1, and during the exposure period (the exposure period for exposing the shot region Sd1) which is between the exposure start of the shot region Sd1 and the exposure termination, the second member 22 may continuously move.

In addition, the movement of the second member 22 may be stopped during at least a portion of the first step movement period, and the movement of the second member 22 may be stopped during at least a portion of the second step movement period. Movement stop time of the second member 22 in the first step movement period may be different from the movement stop time of the second member 22 in the second step movement period. For example, the movement stop time of the second member 22 in the second step movement period may be longer than the movement stop time of the second member 22 in the first step movement period. In addition, the movement stop time of the second member 22 in the second step movement period may be shorter than the movement stop time of the second member 22 in the first step movement period.

Moreover, in the present embodiment, in the first step movement period of the substrate P between the shot regions Sc and Sc included in the same row Gc, the second member 22 moves in the −X axis direction. In addition, in the first step movement period of the substrate P between the shot regions Sd and Sd included in the same row Gd, the second member 22 moves in the +X axis direction. In the second step movement period of the substrate P which is between the exposure termination of the shot region Sc4 of the row Gc and the exposure start of the shot region Sd1 of the row Gd, for example, the second member 22 may move in the −X axis direction and may move in both of the −X axis direction and the +X axis direction.

As described above, according to the present embodiment, since the second member 22 which is movable below the first member 21 is provided, even when the object such as the substrate P moves in the XY plane in the state where the liquid immersion space LS is formed, for example, flowing-out of the liquid LQ from the space between the liquid immersion member 5 and the object, or remaining liquid of the liquid LQ on the object is suppressed. In addition, occurrence of bubbles (gas portions) in the liquid LQ of the liquid immersion space LS is suppressed.

Moreover, in the present embodiment, since the operation (movement) of the second member 22 in the first step movement period of the substrate P which is between the exposure termination of the shot region S included in the same row and the exposure start of the shot region S included in the row is different from the operation (movement) of the second member 22 in the second step movement period of the substrate P which is between the exposure termination of the shot region S of a row and the exposure start of the shot region S of the another row different from the row, at least one of the flowing-out of the liquid LQ from the liquid immersion space LS, the remaining liquid of the liquid LQ on the substrate P (object) and occurrence of bubbles in the liquid LQ is suppressed. When the first step movement operation of the substrate P (the movement of the substrate P in the first step movement period) is different from the second step movement operation (the movement of the substrate P in the second step movement period), the operation (the movement) of the second member 22 is determined based on the movement of the substrate P, and thus, flowing-out of the liquid LQ or the like is suppressed.

Accordingly, occurrence of exposure failure and occurrence of a defective device can be suppressed.

Moreover, in the present embodiment, since the second member 22 includes the fluid recovery part 27, a change in the shape of the second interface LG2, which is formed between the lower surface of the liquid recovery part 27 and the upper surface of the substrate P (object), is suppressed. Accordingly, flowing-out of the liquid LQ in the liquid immersion space LS from the space between the liquid immersion member 5 and the substrate P (object), or the remaining liquid of the liquid LQ on the substrate P (object) is suppressed.

Moreover, in the present embodiment, since the second member 22 moves so that the relative movement (the relative speed and the relative acceleration) between the substrate P (object) and the second member is decreased, even when the object moves in a high speed in the state where the liquid immersion space LS is formed, the flowing-out of the liquid LQ from the liquid immersion space LS, the remaining liquid of the liquid LQ on the substrate P (object), or the occurrence of the bubbles in the liquid LQ is suppressed.

In addition, in the present embodiment, since the first member 21 is disposed at at least a portion of the surrounding of the terminal optical element 13, even when the object moves in the state where the liquid immersion space LS is formed or the second member 22 moves, a change in the pressure between the terminal optical element 13 and the first member 21 or a large change in the shape of the third interface LG3 of the liquid LQ is suppressed. Accordingly, occurrence of bubbles in the liquid LQ or an excessive force acting on the terminal optical element 13 is suppressed. In addition, in the present embodiment, since the first member 21 does not substantially move, a large change in the pressure between the terminal optical element 13 and the first member 21, or a large change in the shape of the first interface LG1 of the liquid LQ is suppressed.

Moreover, the first member 21 may be movable. In addition, the first member 21 may move with respect to the terminal optical element 13. The first member 21 may move in at least one direction of six directions of the X axis, the Y axis, the Z axis, the θX, the θY, and the θZ. For example, in order to adjust the positional relationship between the terminal optical element 13 and the first member 21 or the positional relationship between the first member 21 and the second member 22, the first member 21 may move. Moreover, the first member 21 may move in parallel with at least a portion of the movement of the substrate P (object). For example, the first member may move by a shorter distance than the second member 22 in the XY plane. Moreover, the first member 21 may move at a lower speed than the second member 22. In addition, the first member 21 may move at a lower acceleration than the second member 22.

In addition, in the present embodiment, the liquid supply part 31, which supplies the liquid LQ to form the liquid immersion space LS, is disposed at the first member 21, and the fluid recovery part 27 which recovers the liquid LQ on the substrate P (object) is disposed at the second member 22 which is disposed via the gap with the first member 21. Accordingly, since the fluid (one or both of liquid LQ and gas) is recovered from the fluid recovery part 27, even when the temperature of the second member 22 is changed, the change in the temperature of the first member 21 is suppressed. Therefore, the change in temperature of the liquid LQ supplied from the liquid supply part 31 is suppressed.

Moreover, in the present embodiment, the liquid LQ supplied from the liquid supply part 31 flows so as to contact the inner surface 28 and the lower surface 23 of the first member 21. The temperature change of the first member 21 is suppressed by the liquid LQ. Moreover, the temperature of the first member 21 is adjusted by the liquid LQ. In addition, the liquid LQ supplied from the liquid supply part 31 flows so as to contact the upper surface 25 and the lower surface 26 of the second member 22. The temperature change of the second member 22 is suppressed by the liquid LQ. Moreover, the temperature of the second member 22 is adjusted by the liquid LQ.

In addition, a first temperature adjustment apparatus, which adjusts the temperature of the first member 21, may be disposed. For example, the first temperature adjustment apparatus may include a peltier element which is disposed at the outer surface of the first member 21. The first temperature adjustment apparatus may also include a supply apparatus which supplies a fluid (one or both of liquid and gas) for adjusting the temperature to a channel formed at the inner portion of the first member 21. Moreover, a second temperature adjustment apparatus, which adjusts the temperature of the second member 22, may be disposed. The second temperature adjustment apparatus may include a peltier element which is disposed at the outer surface of the second member 22, and may also include a supply apparatus which supplies a fluid for adjusting the temperature to a channel which is formed at the inner portion of the second member 22.

In addition, in the present embodiment, a liquid supply amount from the liquid supply part 31 may be adjusted based on the movement condition of the second member 22. Moreover, the liquid supply amount from the liquid supply part 31 may be adjusted based on the position of the second member 22. For example, the liquid supply amount from the liquid supply part 31 when the second member 22 is disposed at at least one of the first end part position and the second end part position may be adjusted to be larger than the liquid supply amount from the liquid supply part 31 when the second member 22 is disposed at the center position. Moreover, when the second member 22 moves from the second end part position to the first end part position, the liquid supply amount from the liquid supply part 31 which is disposed at the +X side with respect to the optical path K may be larger than the liquid supply amount from the liquid supply part 31 which is disposed at the −X side. In addition, when the second member 22 moves from the first end part position to the second end part position, the liquid supply amount from the liquid supply part 31 which is disposed at the −X side with respect to the optical path K may be larger than the liquid supply amount from the liquid supply part 31 which is disposed at the +X side. Accordingly, occurrence of bubbles in the liquid LQ is suppressed.

Moreover, in the present embodiment, in order to suppress the remaining liquid, the flowing-out, or the like of the liquid LQ due to the step movement operation of the substrate P, the second member 22 moves in the step direction (the X axis direction) at the step movement operation of the substrate P. However, in at least one of the scan movement operation and the step movement operation of the substrate P, the second member 22 may move in the scan direction (the Y axis direction) so that the relative speed difference between the second member and the substrate P (object) is decreased in the scan direction (the Y axis direction).

<Second Embodiment>

A second embodiment will be described. In the descriptions below, the same reference numerals are attached to the same or similar components as those of the above-described embodiment, and the descriptions thereof are simplified or omitted here.

Figure 18:
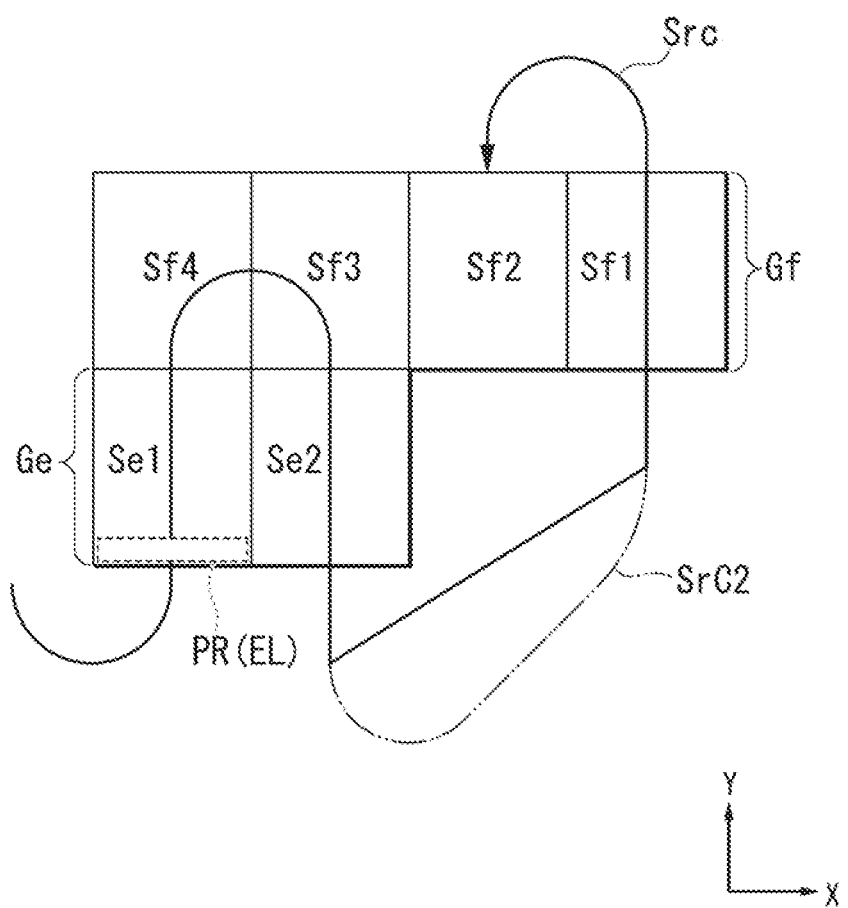
FIG. 18 is a view for explaining an example of an operation of an exposure apparatus according to a second embodiment.

FIG. 18 is a view schematically showing an example of a state in which after the shot region S (for example, a shot region Se2) of a row (for example, the row Ge) is exposed, the exposure of the shot region S (for example, a shot region Sf1) of another row (for example, the row Gf) different from the row is performed. With respect to the Y axis direction, the row Of including the shot region Sf1 is disposed to be adjacent to the row Ge including the shot region Se2. The row Gf is disposed more on the +Y side than the row Ge.

With respect to the Y axis direction, the position of the shot region Sf1 is different from the position of the shot region Se2. The shot region Sf1 is disposed more on the +Y side than the shot region Se2. With respect to the X axis direction, the position of the shot region Sf1 is different from the position of the shot region Se2. The shot region Sf1 is disposed more on the +X side than the shot region Se2. In the present embodiment, the distance between the −X side edge of the shot region Se2 and the −X side edge of the shot region Sf1 with respect to the X axis direction is larger than the size of a shot region Sf2 (shot regions Se2 and Sf1) with respect to the X axis direction.

With respect to the X axis direction, the shot region Sf2 is disposed to be adjacent to the shot region Sf1. With respect to the X axis direction, a shot region Sf3 is disposed to be adjacent to the shot region Sf2. With respect to the X axis direction, a shot region Sf4 is disposed to be adjacent to the shot region Sf3. The shot region Sf2 is disposed more at the −X side than the shot region Sf1. The shot region Sf3 is disposed more at the −X side than the shot region Sf2. The shot region Sf4 is disposed more at the −X side than the shot region Sf3.

In the state where the liquid immersion space LS of the liquid LQ is formed, after the controller 6 exposes the shot regions Se1 and Se2 included in the row Ge via the liquid LQ while repeating the scan movement operation and the step movement operation so that the substrate P relatively moves with respect to the projection region PR of the projection optical system PL along the movement locus shown in an arrow Src in FIG. 18, the controller exposes the shot region Sf1 included in the row Gf via the liquid LQ. Moreover, after the shot region Sf1 included in the row Gf is exposed, a plurality of shot regions Sf2, Sf3, and Sf4 included in the row Gf are sequentially exposed via the liquid LQ. In addition, the substrate P may relatively move with respect to the projection region PR of the projection optical system PL along the movement locus shown in an arrow Src2 in FIG. 18.

Figure 19:
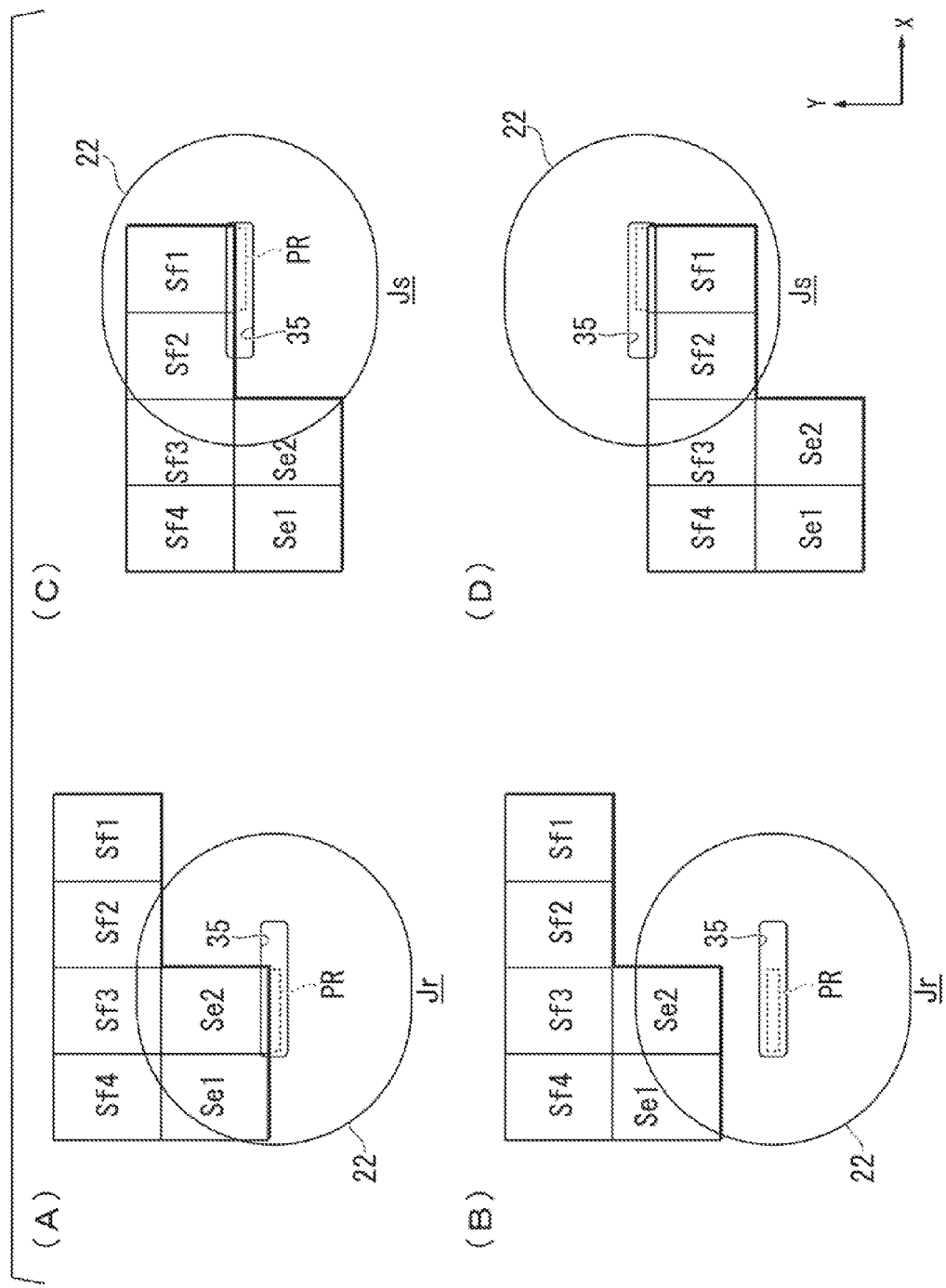
FIG. 19 is a view for explaining an example of an operation of a second member according to the second embodiment.

FIG. 19 is a view schematically showing an example of the operation (movement) of the second member 22 when the shot region Sf1 included in the row Of is exposed after the shot region Se2 included in the row Ge is exposed.

FIG. 19(A) shows a state where the substrate P is disposed at the exposure termination position of the shot region Se2 (the termination position of the scan movement operation of the shot region Se2, the starting position of the step movement operation between the shot regions Se2 and Sf1).

FIG. 19(B) shows a state when the substrate P is moving from the exposure termination position of the shot region Se2 to the exposure starting position of the shot region Sf1 (the starting position of the scan movement operation of the shot region Sf1).

FIG. 19(C) shows a state where the substrate P is disposed at the exposure starting position of the shot region Sf1 (the starting position of the scan movement operation of the shot region Sf1, the termination position of the step movement operation between the shot regions Se2 and Sf1).

FIG. 19(D) shows a state where the substrate P is disposed at the exposure termination position of the shot region Sf1 (the termination position of the scan movement operation of the shot region Sf1, the starting position of the step movement operation between the shot regions Sf1 and Sf2).

The exposure of the shot region Se2 will be described. In order to expose the shot region Se2, the controller 6 performs the scan movement operation of the substrate P which includes at least the movement in the +Y axis direction in between of the exposure start of the shot region Se2 and the exposure termination of the shot region Se2. In the scan movement period of the substrate P for exposing the shot region Se2, the second member 22 moves from the position Js to the position Jr. As shown in FIG. 19(A), in the exposure termination of the shot region Se2, the second member 22 is disposed at the position Jr.

Next, the step movement between the shot regions Se2 and Sf1 will be described. After the scan movement operation of the substrate P for exposing the shot region Se2 is terminated, the step movement operation of the substrate P between the shot regions Se2 and Sf1 is performed.

The step movement period (the second step movement period) of the substrate P which is between the exposure termination of the shot region Se2 of the row Ge and the exposure start of the shot region Sf1 of the row Gf is longer than the step movement period (the first step movement period) of the substrate P which is between the exposure termination of the shot region Se (for example, the shot region Se1) included in the same row Ge and the exposure start of the next shot region Se (for example, the shot region Se2).

In addition, the step movement distance of the substrate P which is between the exposure termination position of the shot region Se2 of the row Ge and the exposure starting position of the shot region Sf1 of the row Gf is longer than the step movement distance of the substrate P which is between the exposure termination position of the shot region Se (for example, the shot region Se1) included in the same row Ge and the exposure starting position of the next shot region Se (for example, the shot region Se2).

The step movement operation of the substrate P between the shot regions Se2 and Sf1 includes an operation in which the substrate P moves in at least the X axis direction. The step movement operation of the substrate P between the shot regions Se2 and Sf1 includes an operation in which the substrate P moves in the +Y axis direction while moving in the −X axis direction and an operation in which the substrate P moves in the −Y axis direction while moving in the −X axis direction.

In at least a portion of the step movement period (second step movement period) of the substrate P between the shot regions Se2 and Sf1, the second member 22 is moved in the movement direction (−X axis direction) of the substrate P. The second member 22 is moved so that the relative speed between the second member and the substrate P is decreased. In the present embodiment, in the step movement period (the second step movement period) of the substrate P between the shot regions Se2 and Sf1, the second member 22 moves from the position Jr to the position Js. In the step movement period (the second step movement period) of the substrate P, the second member 22 moves in the −X axis direction from a start of the movement at the position Jr until it reaches the position Jr.

In the present embodiment, the step movement operation of the substrate P between the shot regions Se2 and Sf1 includes a second operation in which the substrate P mainly moves in the Y axis direction as shown in FIGS. 19(A) and 19(B), and a first operation in which the substrate P moves in both of the X axis direction and the Y axis direction as shown in FIGS. 19(B) and 19(C). The second operation includes the operation in which the substrate P mainly moves in the +Y axis direction. The first operation includes the operation in which the substrate P moves in the −Y axis direction while moving in the −X axis direction. The movement distance of the substrate P with respect to the X axis direction in the first operation is longer than the movement distance of the substrate P with respect to the X axis direction in the second operation. As shown in FIG. 19(B), during (the termination of the second operation) the step movement operation between the shot regions Se2 and Sf1, the second member 22 is disposed at the position Jr. As shown in FIG. 19(C), at the termination of the step movement operation between the shot regions Se2 and Sf1 (the exposure start of the shot region Sf1), the second member 22 is disposed at the position Js.

Moreover, the step movement operation of the substrate P between the shot regions Se2 and Sf1 may include an operation in which the substrate P moves in one or both of the +Y axis direction and the −Y axis direction while moving in the −X axis direction, and an operation in which the substrate P moves in one or both of the +Y axis direction and the −Y axis direction while moving in the +X axis direction.

When the substrate P moves in the −X axis direction and the +X axis direction in the second step movement period between the shot regions Se2 and Sf1, the second member 22 may move in only the −X axis direction and may move in both of the −X axis direction and the +X axis direction. For example, when the substrate P moves in the −X axis direction and the +X axis direction in the second step movement period between the shot regions Se2 and Sf1, the second member 22 may move in both of the −X axis direction and the +X axis direction so that the relative speed between the second member and the substrate P is decreased.

In the step movement period (the second step movement period) of the substrate P between the shot regions Se2 and Sf1, the second member 22 may continuously move. In at least a portion of the step movement period (the second step movement period) of the substrate P between the shot regions Se2 and Sf1, the movement of the second member 22 may be stopped.

Next, the exposure of the shot region Sf1 will be described. In order to expose the shot region Sf1, the controller 6 performs the scan movement operation of the substrate P which includes at least the movement in the −Y axis direction in between of the exposure start of the shot region Sf1 and the exposure termination of the shot region Sf2.

In the present embodiment, in the scan movement period of the substrate P for exposing the shot region Sf1, the second member 22 does not move. In the scan movement period of the substrate P for exposing the shot region Sf1, the position of the second member 22 is maintained at the position Js. As shown in FIG. 19(C), in the exposure start of the shot region Sf1, the second member 22 is disposed at the position Js. As shown in FIG. 19(D), also in the exposure termination of the shot region Sf1, the second member 22 is disposed at the position Js.

In addition, in at least a portion of the scan movement period of the substrate P for exposing the shot region Sf1, the second member 22 may move. Moreover, in the scan movement period of the substrate P for exposing the shot region Sf1, the second member 22 may continuously move. The controller 6 may control the driving apparatus 32 so that the second member 22 is moved with respect to the X axis direction in the scan movement period of the substrate P for exposing the shot region Sf1 and the second member 22 is disposed at the position Js at the exposure termination of the shot region Sf1.

Next, the step movement between the shot regions Sf1 and Sf2 will be described. The step movement operation of the substrate P which includes at least the movement in the +X axis direction is performed in between of the exposure termination of the shot region Sf1 and the exposure start of the shot region Sf2. Moreover, in the step movement period of the substrate P between the shot regions Sf1 and Sf2, the second member 22 moves from the position Js to the position Jr.

Next, the exposure of the shot region Sf2 will be described. After the step movement operation of the substrate P between the shot regions Sf1 and Sf2 is terminated, the scan movement operation of the substrate P is performed for exposing the shot region Sf2. In between of the exposure start of the shot region Sf2 and the exposure termination of the shot region Sf2, the scan movement operation of the substrate P, which includes at least the movement in the +Y axis direction, is performed. In addition, in the scan movement period of the substrate P for exposing the shot region Sf2, the second member 22 moves from the position Jr to the position Js.

Hereinafter, when the plurality of shot regions Sf included in the same row Gf are sequentially exposed, operations similar to the above-described operations are performed with respect to the substrate P (substrate stage 2) and the second member 22.

Also in the present embodiment, at the start of the step movement period (the second step movement period) between the shot regions Se2 and Sf1 and the start of the step movement period (the first step movement period) between the shot regions Sf1 and Sf2, the positions of the second members 22 with respect to the terminal optical element 13 (the first member 21) are different from each other. In the present embodiment, as shown in FIG. 19(A), at the start of the step movement period (the second step movement period) between the shot regions Se2 and Sf1, the second member 22 is disposed at the position Jr. As shown in FIG. 19(D), at the start of the step movement period (the first step movement period) between the shot regions Sf1 and Sf2, the second member 22 is disposed at the position Js.

In addition, in the present embodiment, at the termination of the step movement period (the second step movement period) between the shot regions Se2 and Sf1 and the termination of the step movement period (the first step movement period) between the shot regions Sf1 and Sf2, the positions of the second members 22 with respect to the terminal optical element 13 (the first member 21) are different from each other. In the present embodiment, as shown in FIG. 19(C), at the termination of the step movement period (the second step movement period) between the shot regions Se2 and Sf1, the second member 22 is disposed at the position is. At the termination of the step movement period (the first step movement period) between the shot regions Sf1 and Sf2, the second member 22 is disposed at the position Jr.

Also in the present embodiment, the operation (movement) of the second member 22 in the first step movement period of the substrate P which is between the exposure termination of the shot region Sf1 included in a row Gf and the exposure start of the next shot region Sf2 included in the same row Gf is different from the operation (movement) of the second member 22 in the second step movement period of the substrate P which is between the exposure termination of the shot region Se2 of another row Ge and the exposure start of the shot region Sf1 of the row Gf different from the row.

For example, the second member 22 continuously moves in the first step movement period, and the movement of the second member 22 may stop in at least a portion of the second step movement period.

In addition, in the first step movement period and the second step movement period, the movement directions of the second members 22 may be different from each other. In the present embodiment, in the step movement period (the second step movement period) between the shot regions Se2 and Sf1, the second member 22 moves from the position Jr to the position Js. That is, in the second step movement period, the second member 22 moves in the −X axis direction. In the step movement period (the first step movement period) between the shot regions Sf1 and Sf2, the second member 22 moves from the position Js to the position Jr. That is, in the first step movement period, the second member 22 moves in the +X axis direction.

Moreover, in the first step movement period and the second step movement period, the movement distances of the second members 22 may be different from each other. The movement distance of the second member 22 with respect to the terminal optical element 13 in the second step movement period may be longer or may be shorter than the movement distance of the second member 22 with respect to the terminal optical element 13 in the first step movement period. For example, the second member 22 is moved between the position Jr and the position Js in the second step movement period, and the second member 22 may be moved between the position Jrm and the position Jsm in the first step movement period. The second member 22 is moved between the position Jrm and the position Jsm in the second step movement period, and the second member 22 may be moved between the position Jr and the position Js in the first step movement period.

Moreover, in the first step movement period and the second step movement period, the movement speed of the second members 22 may be different from each other. The movement speed of the second member 22 with respect to the terminal optical element 13 in the second step movement period may be higher or may be lower than the movement speed of the second member 22 with respect to the terminal optical element 13 in the first step movement period.

In addition, in the first step movement period and the second step movement period, the acceleration (deceleration) of the second members 22 may be different from each other. The acceleration of the second member 22 with respect to the terminal optical element 13 in the second step movement period may be higher or may be lower than the acceleration of the second member 22 with respect to the terminal optical element 13 in the first step movement period.

Moreover, in the first step movement period between shot regions Se1 and Se2, the second member 22 may continuously move. In addition, in the second step movement period between shot regions Se2 and Sf1, the second member 22 may continuously move. Moreover, in the first step movement period between shot regions Sf1 and Sf2, the second member 22 may continuously move. In addition, in both of the first step movement period and the second step movement period, the second member 22 may continuously move.

Moreover, during the exposure period from the exposure start to the exposure termination of the shot region Se2 and the second step movement period between of the shot regions Se2 and Sf1, the second member 22 may continuously move.

In addition, in the exposure period (scan movement operation period) which is between the exposure start and the exposure termination of the shot region Se2, the second step movement period between of the shot regions Se2 and Sf1, and the exposure period (scan movement operation period) which is between the exposure start and the exposure termination of the shot region Sf1, the second member 22 may continuously move.

Moreover, the movement of the second member 22 may stop in at least a portion of the first step movement period between the shot regions Se1 and Se2. In addition, the movement of the second member 22 may be stopped in at least a portion of the second step movement period between the shot regions Se2 and Sf1. Moreover, the movement of the second member 22 may be stopped in at least a portion of the first step movement period between the shot regions Sf1 and Sf2.

In addition, when the movement of the second member 22 is stopped in at least a portion of the second step movement period between the shot regions Se2 and Sf1, the movement of the second member 22 may be stopped in at least a part of a period, in which the substrate P is moved in the Y axis direction, during the second step movement period.

Moreover, in the exposure period (scan movement period) from the exposure start to the exposure termination of the shot region Se2, the second member 22 may continuously move, and the movement of the second member 22 may be stopped in at least a portion of the second step movement period between the shot regions Se2 and Sf1.

In addition, in the exposure period (scan movement period) which is between the exposure start and the exposure termination of the shot region Se2 and the exposure period (scan movement period) which is between the exposure start and the exposure termination of the shot region Sf1, the second member 22 may continuously move, and the movement of the second member 22 may be stopped in at least a portion of the second step movement period between the shot regions Se2 and Sf1.

As described above, also in the present embodiment, the driving apparatus 32 is controlled so that the operation (movement) of the second member 22 in the first step movement period of the substrate P and the operation (movement) of the second member 22 in the second step movement period of the substrate P are different from each other, and thus, flowing-out or the like of the liquid LQ from the liquid immersion space LS is suppressed. Accordingly, occurrence of exposure failure and occurrence of a defective device can be suppressed.

<Third Embodiment>

A third embodiment will be described. In the descriptions below, the same reference numerals are attached to the same or similar components as those of the above-described embodiments, and the descriptions thereof are simplified or omitted here.

Figure 20:
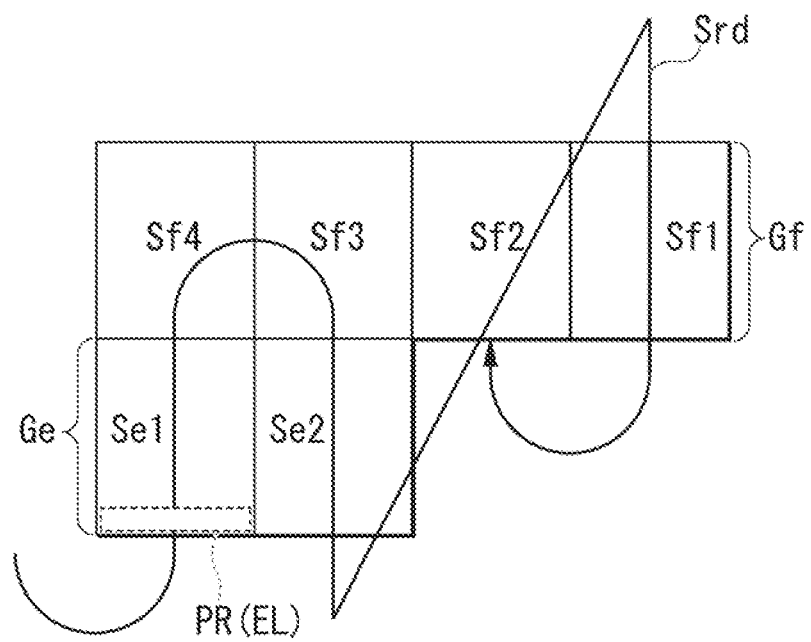
FIG. 20 is a view for explaining an example of an operation of an exposure apparatus according to a third embodiment.

FIG. 20 is a view schematically showing an example of a state in which after the shot region S (for example, a shot region Se2) of a row (for example, the row Ge) is exposed, the exposure of the shot region S (for example, a shot region Sf1) of another row (for example, the row Gf) different from the row is performed. With respect to the Y axis direction, the row Gf including the shot region Sf1 is disposed to be adjacent to the row Ge including the shot region Se2.

The row Gf is disposed more on the +Y side than the row Ge.

In the state where the liquid immersion space LS of the liquid LQ is formed, after the controller 6 exposes the shot regions Se1 and Se2 included in the row Ge via the liquid LQ while repeating the scan movement operation and the step movement operation so that the substrate P relatively moves with respect to the projection region PR of the projection optical system PL along the movement locus shown in an arrow Srd in FIG. 20, the controller exposes the shot region Sf1 included in the row Gf via the liquid LQ. Moreover, after the shot region Sf1 included in the row Gf is exposed, a plurality of shot regions Sf2, Sf3, and Sf4 included in the row Gf are sequentially exposed via the liquid LQ.

Figure 21:
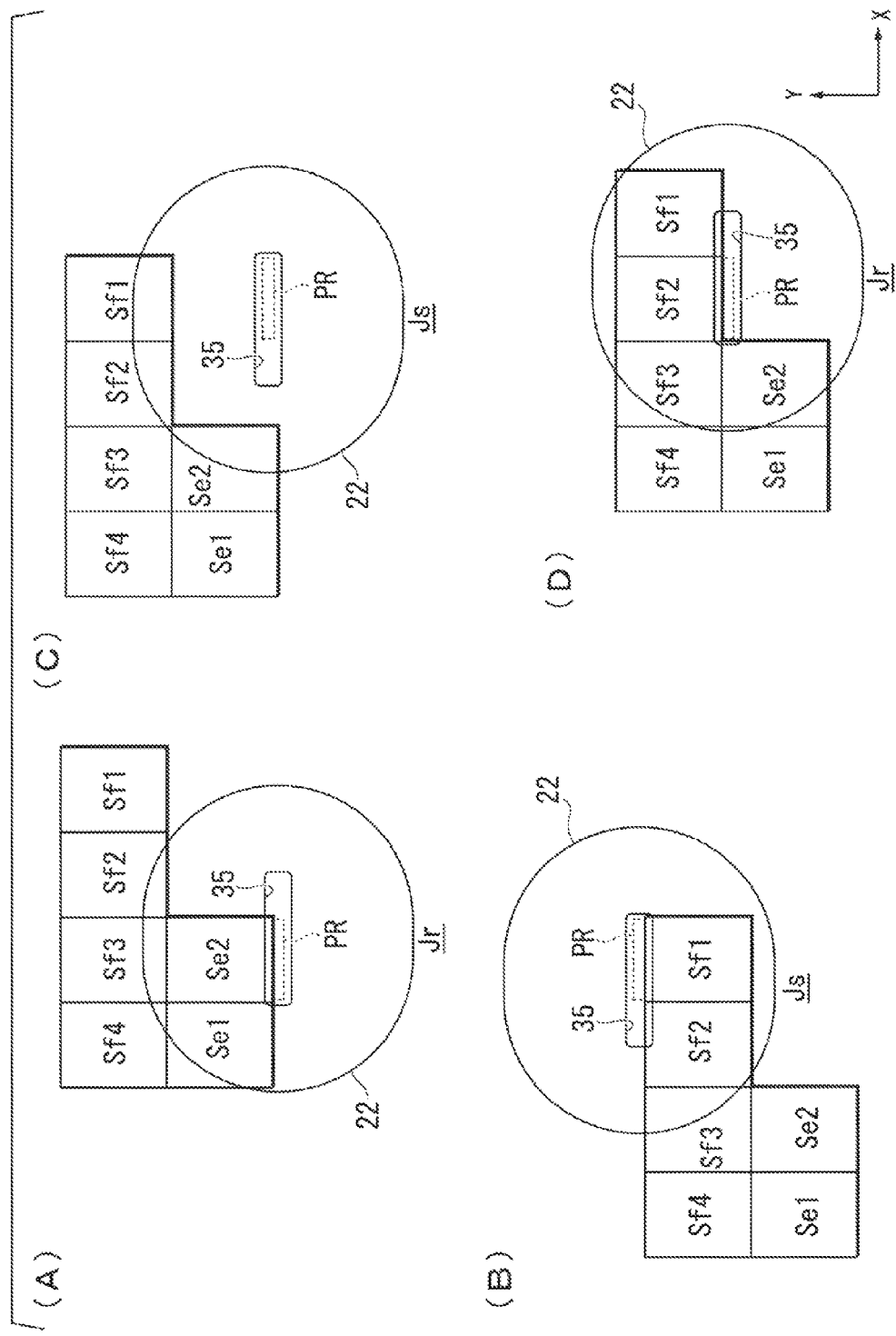
FIG. 21 is a view for explaining an example of an operation of a second member according to the third embodiment.

FIG. 21 is a view schematically showing an example of the operation (movement) of the second member 22 when the shot region Sf1 included in the row Gf is exposed after the shot region Se2 included in the row Ge is exposed.

FIG. 21(A) shows a state where the substrate P is disposed at the exposure termination position of the shot region Se2 (the termination position of the scan movement operation of the shot region Se2, the starting position of the step movement operation between the shot regions Se2 and Sf1).

FIG. 21(B) shows a state where the substrate P is disposed at the exposure starting position of the shot region Sf1 (the starting position of the scan movement operation of the shot region Sf1, the termination position of the step movement operation between the shot regions Se2 and Sf1).

FIG. 21(C) shows a state when the substrate P is moving from the exposure termination position of the shot region Sf1 to the exposure starting position of the shot region Sf2 (the starting position of the scan movement operation of the shot region Sf2).

FIG. 21(D) shows a state where the substrate P is disposed at the exposure starting position of the shot region Sf2 (the starting position of the scan movement operation of the shot region Sf2, the termination position of the step movement operation between the shot regions Sf1 and Sf2).

The exposure of the shot region Se2 will be described. In order to expose the shot region Se2, the controller 6 performs the scan movement operation of the substrate P which includes at least the movement in the +Y axis direction in between of the exposure start of the shot region Se2 and the exposure termination of the shot region Se2. In the scan movement period of the substrate P for exposing the shot region Se2, the second member 22 moves from the position Js to the position Jr. As shown in FIG. 21(A), in the exposure termination of the shot region Se2, the second member 22 is disposed at the position Jr.

Next, the step movement of the substrate P between the shot regions Se2 and Sf1 will be described. After the scan movement operation of the substrate P for exposing the shot region Se2 is terminated, the step movement operation of the substrate P between the shot regions Se2 and Sf1 is performed.

The step movement period (the second step movement period) of the substrate P which is between the exposure termination of the shot region Se2 of the row Ge and the exposure start of the shot region Sf1 of the row Gf is longer than the step movement period (the first step movement period) of the substrate P which is between the exposure termination of the shot region Se (for example, the shot region Se1) included in the same row Ge and the exposure start of the next shot region Se (for example, the shot region Se2).

In addition, the step movement distance of the substrate P which is between the exposure termination position of the shot region Se2 of the row Ge and the exposure starting position of the shot region Sf1 of the row Of is longer than the step movement distance of the substrate P which is between the exposure termination position of the shot region Se (for example, the shot region Se1) included in the same row Ge and the exposure starting position of the next shot region Se (for example, the shot region Se2).

The step movement operation of the substrate P between the shot regions Se2 and Sf1 includes an operation in which the substrate P moves in at least the X axis direction. The step movement operation of the substrate P between the shot regions Se2 and Sf1 includes an operation in which the substrate P moves in the +Y axis direction while moving in the −X axis direction and an operation in which the substrate P moves in the −Y axis direction while moving in the −X axis direction.

In at least a portion of the step movement period (second step movement period) of the substrate P between the shot regions Se2 and Sf1, the second member 22 is moved in the movement direction (−X axis direction) of the substrate P. The second member 22 is moved so that the relative speed between the second member and the substrate P is decreased. In the present embodiment, in the step movement period (the second step movement period) of the substrate P between the shot regions Se2 and Sf1, the second member 22 moves from the position Jr to the position Js. As shown in FIG. 21(B), in the step movement termination (the exposure start of the shot region Sf1) between the shot regions Se2 and Sf1, the second member 22 is disposed at the position is.

Moreover, the step movement operation of the substrate P between the shot regions Se2 and Sf1 may include an operation in which the substrate P moves in one or both of the +Y axis direction and the −Y axis direction while moving in the −X axis direction, and an operation in which the substrate P moves in one or both of the +Y axis direction and the −Y axis direction while moving in the +X axis direction.

When the substrate P moves in the −X axis direction and the +X axis direction in the second step movement period between the shot regions Se2 and Sf1, the second member 22 may move in only the −X axis direction and may move in both of the −X axis direction and the +X axis direction. For example, when the substrate P moves in the −X axis direction and the +X axis direction in the second step movement period between the shot regions Se2 and Sf1, the second member 22 may move in both of the −X axis direction and the +X axis direction so that the relative speed between the second member and the substrate P is decreased.

In the step movement period (the second step movement period) of the substrate P between the shot regions Se2 and Sf1, the second member 22 may continuously move. In at least a portion of the step movement period (the second step movement period) of the substrate P between the shot regions Se2 and Sf1, the movement of the second member 22 may be stopped.

Next, the exposure of the shot region Sf1 will be described. In order to expose the shot region Sf1, the controller 6 performs the scan movement operation of the substrate P which includes at least the movement in the +Y axis direction in between of the exposure start of the shot region Sf1 and the exposure termination of the shot region Sf1. In the scan movement period of the substrate P for exposing the shot region Sf1, the second member 22 does not move. In the scan movement period of the substrate P for exposing the shot region Sf1, the position of the second member 22 is maintained at the position Js. As shown in FIGS. 21(B) and 21(C), in both of the exposure start and the exposure termination of the shot region Sf1, the second member 22 is disposed at the position Js.

In addition, in at least a portion of the scan movement period of the substrate P for exposing the shot region Sf1, the second member 22 may move. Moreover, in the scan movement period of the substrate P for exposing the shot region Sf1, the second member 22 may continuously move. The controller 6 may control the driving apparatus 32 so that the second member 22 is moved with respect to the X axis direction in the scan movement period of the substrate P for exposing the shot region Sf1 and the second member 22 is disposed at the position Js at the exposure termination of the shot region Sf1.

Next, the step movement of the substrate P between the shot regions Sf1 and Sf2 will be described. After the scan movement operation of the substrate P for exposing the shot region Sf1 is terminated, the step movement operation of the substrate P between the shot regions Sf1 and Sf2 is performed.

The controller 6 performs the step movement operation of the substrate P which includes at least the movement in the +X axis direction in between of the exposure termination of the shot region Sf1 and the exposure start of the shot region Sf2. In at least a portion of the step movement period of the substrate P between the shot regions Sf1 and Sf2, the second member 22 is moved in the movement direction (+X axis direction) of the substrate P. The second member 22 is moved so that the relative speed between the second member and the substrate P is decreased. In the present embodiment, as shown in FIGS. 21(C) and 21(D), in the step movement period (the first step movement period) of the substrate P between the shot regions Sf1 and Sf2, the second member 22 moves from the position Js to the position Jr.

Next, the exposure of the shot region Sf2 will be described. As shown in FIG. 21(D), in the exposure start of the shot region Sf2, the second member 22 is disposed at the position Jr. The controller 6 performs the scan movement operation of the substrate P which includes at least the movement in the -Y axis direction in between of the exposure start of the shot region Sf2 and the exposure termination of the shot region Sf2. In the present embodiment, in the scan movement period of the substrate P for exposing the shot region Sf2, the second member 22 moves from the position Jr to the position Js.

Hereinafter, when the plurality of shot regions Sf included in the same row Gf are sequentially exposed, the controller 6 performs operations similar to the above-described operations with respect to the substrate P (substrate stage 2) and the second member 22.

Also in the present embodiment, at the start of the step movement period (the second step movement period) between the shot regions Se2 and Sf1 and the start of the step movement period (the first step movement period) between the shot regions Sf1 and Sf2, the positions of the second members 22 with respect to the terminal optical element 13 (the first member 21) are different from each other. In the present embodiment, as shown in FIG. 21(A), at the start of the step movement period (the second step movement period) between the shot regions Se2 and Sf1, the second member 22 is disposed at the position Jr. As shown in FIG. 21(C), at the start of the step movement period (the first step movement period) between the shot regions Sf1 and Sf2, the second member 22 is disposed at the position Js.

In addition, at the termination of the step movement period (the second step movement period) between the shot regions Se2 and Sf1 and the termination of the step movement period (the first step movement period) between the shot regions Sf1 and Sf2, the positions of the second members 22 with respect to the terminal optical element 13 (the first member 21) are different from each other. In the present embodiment, as shown in FIG. 21(B), at the termination of the step movement period (the second step movement period) between the shot regions Se2 and Sf1, the second member 22 is disposed at the position Js. As shown in FIG. 21(D), at the termination of the step movement period (the first step movement period) between the shot regions Sf1 and Sf2, the second member 22 is disposed at the position Jr.

Also in the present embodiment, the operation (movement) of the second member 22 in the first step movement period of the substrate P which is between the exposure termination of the shot region Sf1 included in a row Gf and the exposure start of the next shot region Sf2 included in the same row Gf is different from the operation (movement) of the second member 22 in the second step movement period of the substrate P which is between the exposure termination of the shot region Se2 of a row Ge and the exposure start of the shot region Sf1 of the another row Gf different from the row.

Moreover, the second member 22 may continuously be moved in the first step movement period, and the movement of the second member 22 may be stopped in at least a portion of the second step movement period.

In addition, in the first step movement period and the second step movement period, the movement directions of the second members 22 may be different from each other. In the present embodiment, in the second step movement period between the shot regions Se2 and Sf1, the second member 22 moves in at least the -X axis direction. In the first step movement period between the shot regions Se1 and Se2, the second member 22 moves in the -X axis direction. In the first step movement period between the shot regions Sf1 and Sf2, the second member 22 moves in the +X axis direction.

Moreover, in the first step movement period and the second step movement period, the movement distances of the second members 22 may be different from each other. The movement distance of the second member 22 with respect to the terminal optical element 13 in the second step movement period may be longer or may be shorter than the movement distance of the second member 22 with respect to the terminal optical element 13 in the first step movement period.

In addition, in the first step movement period and the second step movement period, the movement speed of the second members 22 may be different from each other. The movement speed of the second member 22 with respect to the terminal optical element 13 in the second step movement period may be higher or may be lower than the movement speed of the second member 22 with respect to the terminal optical element 13 in the first step movement period.

In addition, in the first step movement period and the second step movement period, the acceleration (deceleration) of the second members 22 may be different from each other. The acceleration of the second member 22 with respect to the terminal optical element 13 in the second step movement period may be higher or may be lower than the acceleration of the second member 22 with respect to the terminal optical element 13 in the first step movement period.

Moreover, in the first step movement period between shot regions Se1 and Se2, the second member 22 may continuously move. In addition, in the second step movement period between shot regions Se2 and Sf1, the second member 22 may continuously move. Moreover, in the first step movement period between shot regions Sf1 and Sf2, the second member 22 may continuously move. In addition, in both of the first step movement period and the second step movement period, the second member 22 may continuously move.

Moreover, in the exposure period which is between the exposure start and the exposure termination of the shot region Se2 and the second step movement period of the shot regions Se2 and Sf1, the second member 22 may continuously move.

In addition, in the exposure period (scan movement operation period) which is between the exposure start and the exposure termination of the shot region Se2, the second step movement period between the shot regions Se2 and Sf1, and the exposure period (scan movement operation period) which is between the exposure start and the exposure termination of the shot region Sf1, the second member 22 may continuously move.

Moreover, the movement of the second member 22 may be stopped in at least a portion of the first step movement period between the shot regions Se and Se2. In addition, the movement of the second member 22 may be stopped in at least a portion of the second step movement period between the shot regions Se2 and Sf1. Moreover, the movement of the second member 22 may be stopped in at least a portion of the first step movement period between the shot regions Sf1 and Sf2.

In addition, when the movement of the second member 22 stops in at least a portion of the second step movement period between the shot regions Se2 and Sf1, the movement of the second member 22 may be stopped in at least a part of a period, in which the substrate P is moved in the Y axis direction, during the second step movement period.

Moreover, in the exposure period (scan movement period) which is between the exposure start and the exposure termination of the shot region Se2, the second member 22 may continuously move, and the movement of the second member 22 may be stopped in at least a portion of the second step movement period between the shot regions Se2 and Sf1.

In addition, in the exposure period (scan movement period) which is between the exposure start and the exposure termination of the shot region Se2 and the exposure period (scan movement period) which is between the exposure start and the exposure termination of the shot region Sf1, the second member 22 may continuously move, and the movement of the second member 22 may be stopped in at least a portion of the second step movement period between the shot regions Se2 and Sf1.

As described above, also in the present embodiment, the driving apparatus 32 is controlled so that the operation (movement) of the second member 22 in the first step movement period of the substrate P and the operation (movement) of the second member 22 in the second step movement period of the substrate P are different from each other, and thus, flowing-out or the like of the liquid LQ from the immersion liquid space LS is suppressed. Accordingly, occurrence of exposure failure and occurrence of a defective device can be suppressed.

In the above described second and third embodiments, the second member 22 may be moved so as to block the optical path of the exposure light EL during the step movement operation of the substrate P between the shot regions Se2 and Sf1.

In the above described second and third embodiments, because the movement distance in −X axis direction of the substrate P is long during the step movement operation of the substrate P between the shot regions Se2 and Sf1, the second member 22 may be moved so that a +X side end portion of the opening 35 of the second member 22 locates at the more −X side position than a +X side end portion of the projection region PR. However, the second member 22 must be moved to a position where the optical path of the exposure light EL is not blocked before the exposure of the shot region Sf1 starts.

<Fourth Embodiment>

A fourth embodiment will be described. In the descriptions below, the same reference numerals are attached to the same or similar components as those of the above-described embodiments, and the descriptions thereof are simplified or omitted here.

Figure 22:
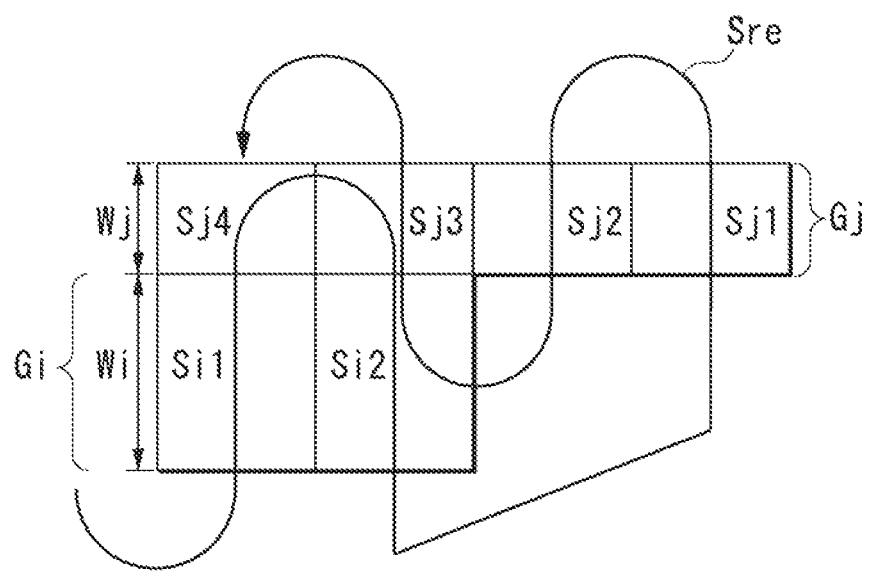
FIG. 22 is a view for explaining an example of an operation of an exposure apparatus according to a fourth embodiment.
Figure 22:
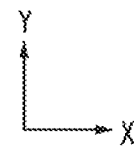

FIG. 22 is a view schematically showing an example of a state in which after the shot region S (for example, a shot region Si2) of a row (for example, the row Gi) is exposed, the exposure of the shot region S (for example, a shot region Sj1) of another row (for example, the row Gj) different from the row is performed. With respect to the Y axis direction, the row Gj including the shot region Sj1 is disposed to be adjacent to the row Gi including the shot region Si2. The row Gj is disposed more on the +Y side than the row Gi.

With respect to the Y axis direction, the position of the shot region Sj1 is different from the position of the shot region Si2. The shot region Sj1 is disposed more on the +Y side than the shot region Si2. With respect to the X axis direction, the position of the shot region Sj1 is different from the position of the shot region Si2. The shot region Sj1 is disposed more on the 4−X side than the shot region Si2. In the present embodiment, the distance between the +X side edge of the shot region Si2 and the −X side edge of the shot region Sj with respect to the X axis direction is larger than the size of a shot region Sj2 (shot regions Si2 and Sj1) with respect to the X axis direction.

With respect to the X axis direction, the shot region Sj2 is disposed to be adjacent to the shot region Sj1. With respect to the X axis direction, a shot region Sj3 is disposed to be adjacent to the shot region Sj2. With respect to the X axis direction, a shot region Sj4 is disposed to be adjacent to the shot region Sj3. The shot region Sj2 is disposed more at the −X side than the shot region Sj1. The shot region Sj3 is disposed more at the −X side than the shot region Sj2. The shot region Sj4 is disposed more at the −X side than the shot region Sj3.

In the state where the liquid immersion space LS of the liquid LQ is formed, after the controller 6 sequentially exposes the shot regions Si1 and Si2, which are included in the row Gi, via the liquid LQ while repeating the scan movement operation and the step movement operation so that the substrate P relatively moves with respect to the projection region PR of the projection optical system PL along the movement locus shown in an arrow Sre in FIG. 22, the controller exposes the shot region Sj1 included in the row Gj via the liquid LQ. Moreover, after the shot region Sj1 included in the row Gj is exposed, a plurality of shot regions Sj2, Sj3, and Sj4 included in the row Gj are sequentially exposed via the liquid LQ.

In the present embodiment, a size Wi of the shot region S1 (Si1 and Si2) of the row Gi with respect to the Y axis direction is different from a size Wj of the shot region Sj (Sj1 to Sj4) of the row Gj with respect to the Y axis direction. In the present embodiment, the size Wj is smaller than the size Wi. After the shot regions S1 (Si1 and Si2) having the size Wi are sequentially exposed, the shot regions Sj (shot regions Sj1 to Sj4) having the size Wj are sequentially exposed.

In the present embodiment, the controller 6 controls the driving apparatus 32 so that the operation (movement) of the second member 22 in the step movement period of the substrate P which is between the exposure termination of the shot region Si1 and the exposure start of the shot region Si2 is different from the operation (movement) of the second member 22 in the step movement period of the substrate P which is between the exposure termination of the shot region Sj1 and the exposure start of the shot region Sj2.

In addition, in the present embodiment, the controller 6 controls the driving apparatus 32 so that the operation (movement) of the second member 22 in the step movement period of the substrate P which is between the exposure termination of the shot region Si1 and the exposure start of the shot region Si2 is different from the operation (movement) of the second member 22 in the step movement period of the substrate P which is between the exposure termination of the shot region Si2 and the exposure start of the shot region Sj1.

Moreover, in the present embodiment, the controller 6 controls the driving apparatus 32 so that the operation (movement) of the second member 22 in the step movement period of the substrate P which is between the exposure termination of the shot region Si2 and the exposure start of the shot region Sj1 is different from the operation (movement) of the second member 22 in the step movement period of the substrate P which is between the exposure termination of the shot region Sj and the exposure start of the shot region Sj2.

Figure 23:
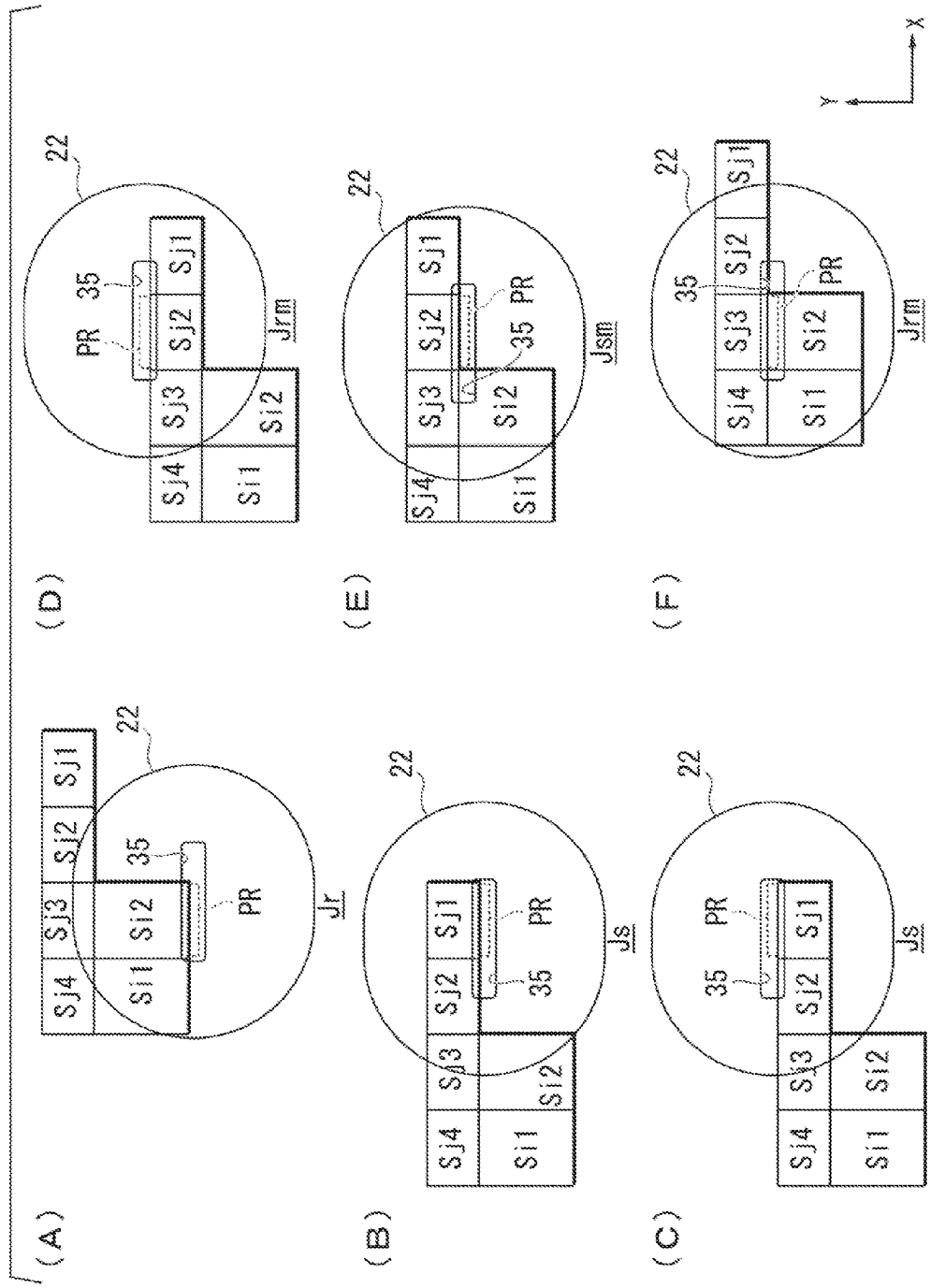
FIG. 23 is a view for explaining an example of an operation of a second member according to the fourth embodiment.

FIG. 23 is a view schematically showing an example of the operation (movement) of the second member 22 when the shot regions Sj1 to Sj4 included in the row Gj are exposed after the shot regions Si1 and Si2 included in the row Gi are exposed.

FIG. 23(A) shows a state where the substrate P is disposed at the exposure termination position of the shot region Si2 (the termination position of the scan movement operation of the shot region Si2, the starting position of the step movement operation between the shot regions Si2 and Sj1).

FIG. 23(B) shows a state where the substrate P is disposed at the exposure starting position of the shot region Sj1 (the starting position of the scan movement operation of the shot region Sj1, the termination position of the step movement operation between the shot regions Si2 and Si1).

FIG. 23(C) shows a state where the substrate P is disposed at the exposure termination position of the shot region Sj1 (the termination position of the scan movement operation of the shot region Sj1, the starting position of the step movement operation between the shot regions Sj1 and Sj2).

FIG. 23(D) shows a state where the substrate P is disposed at the exposure starting position of the shot region Sj2 (the starting position of the scan movement operation of the shot region Sj2, the termination position of the step movement operation between the shot regions Sj1 and Sj2).

FIG. 23(E) shows a state where the substrate P is disposed at the exposure termination position of the shot region Sj2 (the termination position of the scan movement operation of the shot region Sj2, the starting position of the step movement operation between the shot regions Sj2 and Sj3).

FIG. 23(F) shows a state where the substrate P is disposed at the exposure starting position of the shot region Sj3 (the starting position of the scan movement operation of the shot region Sj3, the termination position of the step movement operation between the shot regions Sj2 and Sj3).

The exposure of the shot region Si1 will be described. In order to expose the shot region Si1, the controller 6 performs the scan movement operation of the substrate P which includes at least the movement in the −Y axis direction in between of the exposure start of the shot region Si1 and the exposure termination of the shot region Si1. In the scan movement period of the substrate P for exposing the shot region Si1, the second member 22 moves from the position Js to the position Jr.

Next, the step movement operation between the shot regions Si1 and Si2 will be described. After the scan movement operation of the substrate P for exposing the shot region Si1 is terminated, the step movement operation of the substrate P between the shot regions Si1 and Si2 is performed.

The step movement operation of the substrate P between the shot regions Si1 and Si2 includes an operation in which the substrate P moves in at least the X axis direction. The step movement operation of the substrate P between the shot regions Si1 and Si2 includes an operation in which the substrate P moves in the −Y axis direction while moving in the −X axis direction and an operation in which the substrate P moves in the +Y axis direction while moving in the −X axis direction.

In at least a portion of the step movement period (second step movement period) of the substrate P between the shot regions Si1 and Si2, the second member 22 is moved in the movement direction (−X axis direction) of the substrate P. The second member 22 is moved so that the relative speed between the second member and the substrate P is decreased. In the step movement period (the second step movement period) of the substrate P between the shot regions Si1 and Si2, the second member 22 moves from the position Jr to the position Js.

Next, the exposure of the shot region Si2 will be described. In order to expose the shot region Si2, the controller 6 performs the scan movement operation of the substrate P which includes at least the movement in the +Y axis direction in between of the exposure start of the shot region Si2 and the exposure termination of the shot region Si2. In the scan movement period of the substrate P for exposing the shot region Si2, the second member 22 moves from the position Js to the position Jr. As shown in FIG. 23(A), at the exposure termination of the shot region Si2, the second member 22 is disposed at the position Jr.

Next, the step movement between the shot regions Si2 and Sj1 will be described. After the scan movement operation of the substrate P for exposing the shot region Si2 is terminated, the step movement operation of the substrate P between the shot regions Si2 and Sj1 is performed.

The step movement period (the second step movement period) of the substrate P which is between the exposure termination of the shot region Si2 of the row Gi and the exposure start of the shot region Sj1 of the row Gj is longer than the step movement period (the first step movement period) of the substrate P which is between the exposure termination of the shot region Si (for example, the shot region Si1) included in the same row Gi and the exposure start of the next shot region Si (for example, the shot region Si2).

In addition, the step movement period (the second step movement period) of the substrate P which is between the exposure termination of the shot region Si2 of the row Gi and the exposure start of the shot region Sj1 of the row Gj is longer than the step movement period (the first step movement period) of the substrate P which is between the exposure termination of the shot region Sj (for example, the shot region Sj1) included in the same row Gj and the exposure start of the next shot region Sj (for example, the shot region Sj2).

Moreover, the step movement distance of the substrate P which is between the exposure termination position of the shot region Si2 of the row Gi and the exposure starting position of the shot region Sj1 of the row Gj is longer than the step movement distance of the substrate P which is between the exposure termination position of the shot region Si (for example, the shot region Si1) included in the same row Gi and the exposure starting position of the next shot region Si (for example, the shot region Si2).

In addition, the step movement distance of the substrate P which is between the exposure termination position of the shot region Si2 of the row Gi and the exposure starting position of the shot region Sj1 of the row Gj is longer than the step movement distance of the substrate P which is between the exposure termination position of the shot region Sj (for example, the shot region Sj1) included in the same row Gj and the exposure starting position of the next shot region Sj (for example, the shot region Sj2).

The step movement operation of the substrate P between the shot regions Si2 and Sj1 includes an operation in which the substrate P moves in at least the X axis direction. The step movement operation of the substrate P between the shot regions Si2 and Sj1 includes an operation in which the substrate P moves in the +Y axis direction while moving in the −X axis direction and an operation in which the substrate P moves in the −Y axis direction while moving in the −X axis direction.

In at least a portion of the step movement period (second step movement period) of the substrate P between the shot regions Si2 and Sj1, the second member 22 is moved in the movement direction (−X axis direction) of the substrate P. The second member 22 is moved so that the relative speed between the second member and the substrate P is decreased. In the step movement period (the second step movement period) of the substrate P between the shot regions Si2 and Sj1, the second member 22 moves from the position Jr to the position Js. As shown in FIG. 23(B), in the step movement termination between the shot regions Si2 and Sj1 (the exposure start of the shot region Sj1), the second member 22 is disposed at the position Js.

Moreover, the step movement operation of the substrate P between the shot regions Si2 and Sj1 may include an operation in which the substrate P moves in one or both of the +Y axis direction and the −Y axis direction while moving in the −X axis direction, and an operation in which the substrate P moves in one or both of the +Y axis direction and the −Y axis direction while moving in the +X axis direction.

When the substrate P moves in the −X axis direction and the +X axis direction in the second step movement period between the shot regions Si2 and Sj1, the second member 22 may move in only the −X axis direction and may move in both of the −X axis direction and the +X axis direction. For example, when the substrate P moves in the −X axis direction and the +X axis direction in the second step movement period between the shot regions Si2 and Sj1, the second member 22 may move in both of the −X axis direction and the +X axis direction so that the relative speed between the second member and the substrate P is decreased.

In the step movement period (the second step movement period) of the substrate P between the shot regions Si2 and Sj1, the second member 22 may continuously move. In at least a portion of the step movement period (the second step movement period) of the substrate P between the shot regions Si2 and Sj1, the movement of the second member 22 may be stopped.

In the present embodiment, the second member 22 may be moved so as to block the optical path of the exposure light EL during the step movement operation of the substrate P between the shot regions Si2 and Sj1.

In the present embodiment, because the movement distance in −X axis direction of the substrate P is long during the step movement operation of the substrate P between the shot regions Si2 and Sj1, the second member 22 may be moved so that a +X side end portion of the opening 35 of the second member 22 locates at the more −X side position than a +X side end portion of the projection region PR. However, the second member 22 must be moved to a position where the optical path of the exposure light EL is not blocked before the exposure of the shot region Sj1 starts.

Next, the exposure of the shot region Sj1 will be described. The scan movement operation of the substrate P for exposing the shot region Sj1 is performed after the step movement operation of the substrate P between the shot regions Si2 and Sj1 is terminated.

The scan movement period of the substrate P which is between the exposure start of the shot region Sj (for example, the shot region Sj1) of the row Gj and the exposure termination of the shot region Sj (the shot region Sj1) is shorter than the scan movement period of the substrate P which is between the exposure start of the shot region Si (for example, the shot region Si1) of the row Gi and the exposure termination of the shot region Si (the shot region Si1).

Moreover, the scan movement distance of the substrate P which is between the exposure starting position of the shot region Sj (for example, the shot region Sj1) of the row Gj and the exposure termination position of the shot region Sj (the shot region Sj1) is shorter than the scan movement distance of the substrate P which is between the exposure starting position of the shot region Si (for example, the shot region Si1) included in the row Gi and the exposure termination position of the shot region Si (the shot region Si1).

In the present embodiment, in the scan movement period of the substrate P for exposing the shot region Sj1, the second member 22 does not move. In other words, in the scan movement period of the substrate P for exposing the shot region Sj1, the second member 22 stops with respect to the terminal optical element 13 (first member 21). In the scan movement period of the substrate P for exposing the shot region Sj1, the relative speed of the second member 22 with respect to the terminal optical element 13 (first member 21) becomes zero. That is, in the scan movement period of the substrate P for exposing the shot region Sj1 in which the substrate P does not substantially move in the X axis direction, the second member 22 does not move in the X axis direction. In the scan movement period of the substrate P for exposing the shot region Sj1, the position of the second member 22 is maintained at the position Js. As shown in FIG. 23(B) and FIG. 23(C), in both of the exposure start and the exposure termination of the shot region Sj1, the second member 22 is disposed at the position Js.

Moreover, in at least a portion of the scan movement period of the substrate P for exposing the shot region Sj1, the second member 22 may move. In addition, in the scan movement period of the substrate P for exposing the shot region Sj1, the second member 22 may continuously move. The controller 6 may control the driving apparatus 32 so that the second member 22 is moved with respect to the X axis direction in the scan movement period of the substrate P for exposing the shot region Sj1 and the second member 22 is disposed at the position Js at the exposure termination of the shot region Sj1.

Next, the step movement of the substrate P between the shot regions Sj1 and Sj2 will be described. In the present embodiment, the controller 6 performs the step movement operation of the substrate P which includes at least the movement in the +X axis direction in between of the exposure termination of the shot region Sj1 and the exposure start of the shot region Sj2. In at least a portion of the step movement period of the substrate P between the shot regions Sj1 and Sj2, the second member 22 moves in the movement direction (+X axis direction) of the substrate P. The second member 22 is moved so that the relative speed between the second member and the substrate P is decreased.

As shown in FIG. 23(C), in the step movement start between the shot regions Sj1 and Sj2, the second member 22 is disposed at the position Js. In the present embodiment, in the step movement period (the first step movement period) of the substrate P between the shot regions Sj1 and Sj2, the second member 22 moves from the position Js to the position Jrm. As shown in FIG. 23(D), in the step movement operation termination between the shot regions Sj1 and Sj2, the second member 22 is disposed at the position Jrm. In the step movement period (the first step movement period) of the substrate P between the shot region Sj1 and Sj2, the second member 22 moves in the +X axis direction from a start of the movement at the position Js until it reaches the position Jrm.

Next, the exposure of the shot region Sj2 will be described. After the step movement operation of the substrate P between the shot regions Sj1 and Sj2 is terminated, the scan movement operation of the substrate P is performed for exposing the shot region Sj2. In the present embodiment, the controller 6 performs the scan movement operation of the substrate P which includes at least the movement in the +Y axis direction in between of the exposure start of the shot region Sj2 and the exposure termination of the shot region Sj2.

In the present embodiment, in the scan movement period of the substrate P for exposing the shot region Sj2, the second member 22 moves from the position Jnn to the position Jsm. As shown in FIG. 23(E), at the exposure termination of the shot region Sj2, the second member 22 is disposed at the position Jsm. During the scan movement period of the substrate P for exposing the shot region Sj2, the second member 22 moves in the −X axis direction from a start of the movement at the position Jrm until it reaches the position Jsm.

In the scan movement period of the substrate P for exposing the shot region Sj2, the second member 22 may continuously move. In at least a portion of the scan movement period of the substrate P for exposing the shot region Sj2, the movement of the second member 22 may be stopped.

Next, the step movement of the substrate P between the shot regions Sj2 and Sj3 will be described. In the present embodiment, the controller 6 performs the step movement operation of the substrate P which includes at least the movement in the +X axis direction in between of the exposure termination of the shot region Sj2 and the exposure start of the shot region Sj3. In at least a portion of the step movement period of the substrate P between the shot regions Sj2 and Sj3, the second member 22 is moved in the movement direction (+X axis direction) of the substrate P. The second member 22 is moved so that the relative speed between the second member and the substrate P is decreased.

In the present embodiment, in the step movement period (the first step movement period) of the substrate P between the shot regions Sj2 and Sj3, the second member 22 moves from the position Jsm to the position Jrm. As shown in FIG. 23(F), in the step movement termination between the shot regions Sj2 and Sj3 (the exposure start of the shot region Sj3), the second member 22 is disposed at the position Jrm. In the step movement period (the first step movement period) of the substrate P between the shot regions Sj2 and Sj3, the second member 22 moves in the +X axis direction from a start of the movement at the position Jsm until it reaches the position Jrm.

Next, the exposure of the shot region Sj3 will be described. After the step movement operation of the substrate P between the shot regions Sj2 and Sj3 is terminated, the scan movement operation of the substrate P is performed for exposing the shot region Sj3. In the present embodiment, the controller 6 performs the scan movement operation of the substrate P which includes at least the movement in the −Y axis direction in between of the exposure start of the shot region Sj3 and the exposure termination of the shot region Sj3.

In the present embodiment, in the scan movement period of the substrate P for exposing the shot region Sj3, the second member 22 moves from the position Jrm to the position Jsm. In the scan movement period of the substrate P for exposing the shot region Sj3, the second member 22 moves in the −X axis direction from a start of the movement at the position Jrm until it reaches the position Jsm.

Next, the step movement of the substrate P between the shot regions Sj3 and Sj4 will be described. In the step movement operation start between the shot regions Sj3 and Sj4, the second member 22 is disposed at the position Jsm. In the step movement operation termination between the shot regions Sj3 and Sj4, the second member 22 is disposed at the position Jrm.

The controller 6 performs the step movement operation of the substrate P which includes at least the movement in the +X axis direction in between of the exposure termination of the shot region Sj3 and the exposure start of the shot region Sj4. In at least a portion of the step movement period of the substrate P between the shot regions Sj3 and Sj4, the second member 22 moves in the movement direction (+X axis direction) of the substrate P. The second member 22 is moved so that the relative speed between the second member and the substrate P is decreased.

In the step movement period (the first step movement period) of the substrate P between the shot regions Sj3 and Sj4, the second member 22 moves from the position Jsm to the position Jrm. In the step movement period (the first step movement period) of the substrate P between the shot regions Sj3 and Sj4, the second member 22 moves in the +X axis direction from a start of the movement at the position Jsm until it reaches the position Jrm.

Hereinafter, when the plurality of shot regions Sj included in the same row Gj are sequentially exposed, the controller 6 performs operations similar to the above-described operations with respect to the substrate P (substrate stage 2) and the second member 22.

In the present embodiment, at the start of the step movement period (the first step movement period) between the shot regions Si1 and Si2 and the start of the step movement period (the first step movement period) between the shot regions Sj2 and Sj3, the positions of the second members 22 with respect to the terminal optical element 13 (the first member 21) are different from each other. In the present embodiment, at the start of the step movement period (the first step movement period) between the shot regions Si1 and Si2, the second member 22 is disposed at the position Jr. At the start of the step movement period (the first step movement period) between the shot regions Sj2 and Sj3, the second member 22 is disposed at the position Jsm. In the present embodiment, at the start of the step movement period (the first step movement period) between the shot regions Si1 and Si2 and the start of the step movement period (the first step movement period) between the shot regions Sj2 and Sj3, the distances between the origins (center positions Jm) and the second members 22 are different from each other.

In addition, in the present embodiment, at the termination of the step movement period (the first step movement period) between the shot regions Si1 and Si2 and the termination of the step movement period (the first step movement period) between the shot regions Sj2 and Sj3, the positions of the second members 22 with respect to the terminal optical element 13 (the first member 21) are different from each other. In the present embodiment, at the termination of the step movement period (the first step movement period) between the shot regions Si1 and Si2, the second member 22 is disposed at the position is. At the termination of the step movement period (the first step movement period) between the shot regions Sj2 and Sj3, the second member 22 is disposed at the position Jrm. In the present embodiment, at the start of the step movement period (the first step movement period) between the shot regions Si1 and Si2 and the start of the step movement period (the first step movement period) between the shot regions Sj2 and Sj3, the distances between the origins (center positions Jm) and the second members 22 are different from each other.

In addition, in the present embodiment, at the start of the step movement period (the second step movement period) between the shot regions Si2 and Sj1 and the start of the step movement period (the first step movement period) between the shot regions Sj2 and Sj3, the positions of the second members 22 with respect to the terminal optical element 13 (the first member 21) are different from each other. In the present embodiment, at the start of the step movement period (the second step movement period) between the shot regions Si2 and Sj1, the second member 22 is disposed at the position Jr. At the start of the step movement period (the first step movement period) between the shot regions Sj2 and Sj3, the second member 22 is disposed at the position Jsm. In the present embodiment, at the start of the step movement period (the second step movement period) between the shot regions Si2 and Sj1 and the start of the step movement period (the first step movement period) between the shot regions Sj2 and Sj3, the distances between the origins (center positions Jm) and the second members 22 are different from each other.

In addition, in the present embodiment, at the termination of the step movement period (the second step movement period) between the shot regions Si2 and Sj and the termination of the step movement period (the first step movement period) between the shot regions Sj2 and Sj3, the positions of the second members 22 with respect to the terminal optical element 13 (the first member 21) are different from each other. In the present embodiment, at the termination of the step movement period (the second step movement period) between the shot regions Si2 and Sj1, the second member 22 is disposed at the position Js. At the termination of the step movement period (the first step movement period) between the shot regions Sj2 and Sj3, the second member 22 is disposed at the position Jrm. In the present embodiment, at the termination of the step movement period (the second step movement period) between the shot regions Si2 and Sj1 and the termination of the step movement period (the first step movement period) between the shot regions Sj2 and Sj3, the distances between the origins (center positions Jm) and the second members 22 are different from each other.

As described above, in the present embodiment, the operation (movement) of the second member 22 in the step movement period of the substrate P which is between the exposure termination of the shot region Si1 having the size Wi and the exposure start of the shot region Si2 having the size Wi is different from the operation (movement) of the second member 22 in the step movement period of the substrate P which is between the exposure termination of the shot region Sj1 (or Sj2) having the size Wj and the exposure start of the shot region Sj2 (or Sj3) having the size Wj.

In addition, in the present embodiment, the operation (movement) of the second member 22 in the step movement period of the substrate P which is between the exposure termination of the shot region Si2 having the size Wi and the exposure start of the shot region Sj1 having the size Wj is different from the operation (movement) of the second member 22 in the step movement period of the substrate P which is between the exposure termination of the shot region Sj1 (or Sj2) having the size Wj and the exposure start of the shot region Sj2 (or Sj3) having the size Wj.

In the present embodiment, the movement distance of the second member 22 in the step movement period of the substrate P which is between the exposure termination of the shot region Si1 having the size Wi and the exposure start of the shot region Si2 having the size Wi is different from the movement distance of the second member 22 in the step movement period of the substrate P which is between the exposure termination of the shot region Sj1 (or Sj2) having the size Wj and the exposure start of the shot region Sj2 (or Sj3) having the size Wj. In the present embodiment, in the step movement period of the substrate P which is between the exposure termination of the shot region Si1 having the size Wi and the exposure start of the shot region Si2 having size Wi, the second member 22 moves between the position Jr and the position Jm. In the step movement period of the substrate P which is between the exposure termination of the shot region Sj2 having the size Wj and the exposure start of the shot region Sj3 having the size Wj, the second member 22 moves between the position Jrm and the position Jsm. In the present embodiment, the movement distance of the second member 22 in the step movement period of the substrate P which is between the exposure termination of the shot region Sj1 (or Sj2) having the size Wj and the exposure start of the shot region Sj2 (or Sj3) having the size Wj is shorter than the movement distance of the second member 22 in the step movement period of the substrate P which is between the exposure termination of the shot region Si1 having the size Wi and the exposure start of the shot region Si2 having the size Wi. In addition, the movement distance of the second member 22 in the step movement period between shot regions Sj1 and Sj2 (between Sj2 and Sj3) may be longer than or may be substantially equal to the movement distance of the second member 22 in the step movement period between the shot regions Si1 and Si2.

In addition, the movement distance of the second member 22 in the step movement period of the substrate P which is between the exposure termination of the shot region Si2 having the size Wi and the exposure start of the shot region Sj1 having the size Wj is different from the movement distance of the second member 22 in the step movement period of the substrate P which is between the exposure termination of the shot region Sj1 (or Sj2) having the size Wj and the exposure start of the shot region Sj2 (or Sj3) having the size Wj. In the present embodiment, in the step movement period of the substrate P which is between the exposure termination of the shot region Si2 having the size Wi and the exposure start of the shot region Sj1 having the size Wj, the second member 22 moves between the position Jr and the position Jm. In the step movement period of the substrate P which is between the exposure termination of the shot region Sj2 having the size Wj and the exposure start of the shot region Sj3 having size Wj, the second member 22 moves between the position Jrm and the position Jsm. In the present embodiment, the movement distance of the second member 22 in the step movement period of the substrate P which is between the exposure termination of the shot region Sj1 (or Sj2) having the size Wj and the exposure start of the shot region Sj2 (or Sj3) having the size Wj is shorter than the movement distance of the second member 22 in the step movement period of the substrate P which is between the exposure termination of the shot region Si2 having the size Wi and the exposure start of the shot region Sj1 having the size Wj. In addition, the movement distance of the second member 22 in the step movement period between shot regions Sj1 and Sj2 (between Sj2 and Sj3) may be longer than or may be substantially equal to the movement distance of the second member 22 in the step movement period between the shot regions Si2 and Si1.

Moreover, the second member 22 may move in not only the X axis direction but also the X axis direction and the Y axis direction. The movement distance of the second member 22 may be the movement distance in the XY plane. Moreover, when the second member 22 is movable in six directions of the X axis, the Y axis, the Z axis, the θX, the θY, and the θZ, the movement distances of the second members 22 may be the movement distances in six directions.

In addition, in the present embodiment, the movement direction of the second member 22 in the step movement period of the substrate P which is between the exposure termination of the shot region Si1 and the exposure start of the shot region Si2 may be different from the movement direction of the second member 22 in the step movement period of the substrate P which is between the exposure termination of the shot region Sj1 (or Sj2) and the exposure start of the shot region Sj2 (or Sj3).

Moreover, in the present embodiment, the movement direction of the second member 22 in the step movement period of the substrate P which is between the exposure termination of the shot region Si2 and the exposure start of the shot region Sj1 may be different from the movement direction of the second member 22 in the step movement period of the substrate P which is between the exposure termination of the shot region Sj1 (or Sj2) and the exposure start of the shot region Sj2 (or Sj3).

In addition, in the present embodiment, the movement speed of the second member 22 in the step movement period of the substrate P which is between the exposure termination of the shot region Si1 and the exposure start of the shot region Si2 may be different from the movement speed of the second member 22 in the step movement period of the substrate P which is between the exposure termination of the shot region Sj1 (or Sj2) and the exposure start of the shot region Sj2 (or Sj3).

For example, the movement speed of the second member 22 in the step movement period between shot regions Si1 and Si2 may be lower than or may be higher than the movement speed of the second member 22 in the step movement period between the shot regions Sj2 and Sj3.

Moreover, in the present embodiment, the movement speed of the second member 22 in the step movement period of the substrate P which is between the exposure termination of the shot region Si2 and the exposure start of the shot region Sj1 may be different from the movement speed of the second member 22 in the step movement period of the substrate P which is between the exposure termination of the shot region Sj1 (or Sj2) and the exposure start of the shot region Sj2 (or Sj3).

For example, the movement speed of the second member 22 in the step movement period between shot regions Si2 and Sj1 may be lower than or may be higher than the movement speed of the second member 22 in the step movement period between the shot regions Sj2 and Sj3.

In addition, the second member 22 may move in not only the X axis direction but also the X axis direction and the Y axis direction. The movement speed of the second member 22 may be the movement speed in the XY plane. Moreover, when the second member 22 is movable in six directions of the X axis, the Y axis, the Z axis, the θX, the θY, and the θZ, the movement speed of the second members 22 may be the movement speed in six directions.

In addition, in the present embodiment, the acceleration (deceleration) of the second member 22 in the step movement period of the substrate P which is between the exposure termination of the shot region Si1 and the exposure start of the shot region Si2 may be different from the acceleration (deceleration) of the second member 22 in the step movement period of the substrate P which is between the exposure termination of the shot region Sj1 (or Sj2) and the exposure start of the shot region Sj2 (or Sj3). For example, the acceleration (deceleration) of the second member 22 in the step movement period between shot regions Si1 and Si2 may be lower than or may be higher than the acceleration (deceleration) of the second member 22 in the step movement period between the shot regions Sj2 and Sj3.

Moreover, in the present embodiment, the acceleration (deceleration) of the second member 22 in the step movement period of the substrate P which is between the exposure termination of the shot region Si2 and the exposure start of the shot region Sj1 may be different from the acceleration (deceleration) of the second member 22 in the step movement period of the substrate P which is between the exposure termination of the shot region Sj1 (or Sj2) and the exposure start of the shot region Sj2 (or Sj3). For example, the acceleration (deceleration) of the second member 22 in the step movement period between shot regions Si2 and Sj1 may be lower than or may be higher than the acceleration (deceleration) of the second member 22 in the step movement period between the shot regions Sj2 and Sj3.

In addition, the second member 22 may move in not only the X axis direction but also the X axis direction and the Y axis direction. The acceleration (deceleration) of the second member 22 may be the acceleration (deceleration) in the XY plane. Moreover, when the second member 22 is movable in six directions of the X axis, the Y axis, the Z axis, the θX, the θY, and the θZ, the acceleration (deceleration) of the second members 22 may be the acceleration (deceleration) in six directions.

In addition, in one step movement period of the step movement period between the shot regions Si1 and Si2 and the step movement period between the shot regions Sj2 and Sj3, the second member 22 may continuously move, and in at least a portion of the another step movement period, the movement of the second member 22 may stop.

Moreover, in one step movement period of the step movement period between the shot regions Si2 and Sj1 and the step movement period between the shot regions Sj2 and Sj3, the second member 22 may continuously move, and in at least a portion of the other step movement period, the movement of the second member 22 may stop.

As described above, in the present embodiment, the driving apparatus 32 is controlled so that the operation (movement) of the second member 22 in the step movement period of the substrate P which is between the exposure termination of the shot region Si1 having the size Wi and the exposure start of the shot region Si2 having the size Wi is different from the operation (movement) of the second member 22 in the step movement period of the substrate P which is between the exposure termination of the shot region Sj1 having the size Wj and the exposure start of the shot region Sj2 having the size Wj, and thus, flowing-out or the like of the liquid LQ from the immersion liquid space LS is suppressed. Accordingly occurrence of exposure failure and occurrence of a defective device can be suppressed.

Moreover, in the present embodiment, the driving apparatus 32 is controlled so that the operation (movement) of the second member 22 in the step movement period of the substrate P which is between the exposure termination of the shot region Si2 having the size Wi and the exposure start of the shot region Sj1 having the size Wj is different from the operation (movement) of the second member 22 in the step movement period of the substrate P which is between the exposure termination of the shot region Sj1 having the size Wj and the exposure start of the shot region Sj2 having the size Wj, and thus, flowing-out or the like of the liquid LQ from the immersion liquid space LS is suppressed. Accordingly, occurrence of exposure failure and occurrence of a defective device can be suppressed.

Figure 24:
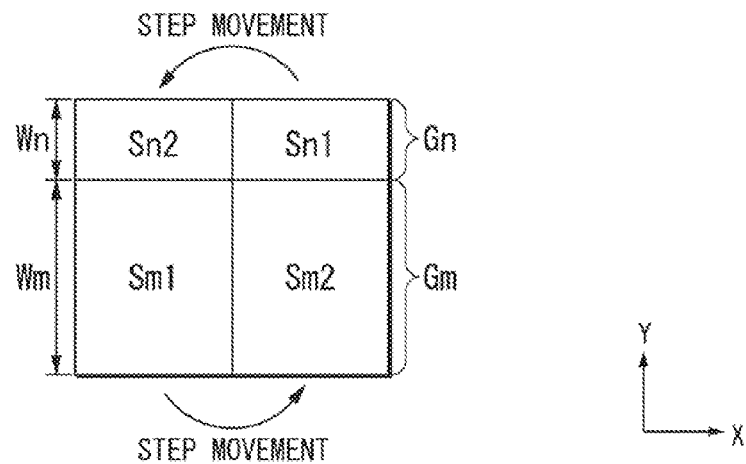
FIG. 24 is a view for explaining an example of the operation of the exposure apparatus according to the fourth embodiment.

FIG. 24 schematically shows an example in which shot regions Sm1 and Sm2 having sizes Wm respect to the Y axis direction are sequentially exposed and shot regions Sn1 and Sn2 having sizes Wn with respect to the Y axis direction are sequentially exposed. In FIG. 24, the size Wn is smaller than the size Wm. The shot regions Sm1 and Sm2 are included in a row Gm. The shot regions Sn1 and Sn2 are included in a row Gn. The row Gn is disposed on the +Y side of the row Gm. Moreover, the row Gn may be disposed on the −Y side of the row Gm.

After the shot regions Sm1 and Sm2 of the row Gm are sequentially exposed, the shot regions Sn1 and Sn2 of the row Gn are sequentially exposed. In addition, after the shot regions Sn1 and Sn2 of the row Gn are sequentially exposed, the shot regions Sm1 and Sm2 of the row Gm may be sequentially exposed.

In the example shown in FIG. 24, the driving apparatus 32 is controlled so that the operation (movement) of the second member 22 in the step movement period of the substrate P which is between the exposure termination of the shot region Sm1 and the exposure start of the shot region Sm2 is different from the operation (movement) of the second member 22 in the step movement period of the substrate P which is between the exposure termination of the shot region Sn1 and the exposure start of the shot region Sn2.

Figure 25:
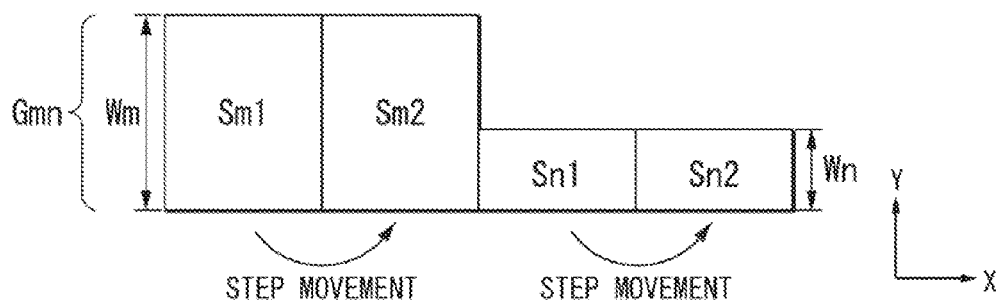
FIG. 25 is a view for explaining an example of the operation of the exposure apparatus according to the fourth embodiment.

FIG. 25 schematically shows an example in which the shot regions Sm1 and Sm2 having sizes Wm with respect to the Y axis direction are sequentially exposed and the shot regions Sn1 and Sn2 having sizes Wn with respect to the Y axis direction are sequentially exposed. In FIG. 25, the size Wn is smaller than the size Wm. The shot regions Sm1 and Sm2 and the shot regions Sn1 and Sn2 are included in a row Gmn. After the shot regions Sm1 and Sm2 are sequentially exposed, the shot regions Sn1 and Sn2 are sequentially exposed. In addition, after the shot regions Sn1 and Sn2 are sequentially exposed, the shot regions Sm1 and Sm2 may be sequentially exposed.

In the example shown in FIG. 25, the driving apparatus 32 is controlled so that the operation (movement) of the second member 22 in the step movement period of the substrate P which is between the exposure termination of the shot region Sm1 and the exposure start of the shot region Sm2 is different from the operation (movement) of the second member 22 in the step movement period of the substrate P which is between the exposure termination of the shot region Sn1 and the exposure start of the shot region Sn2.

Figure 26:
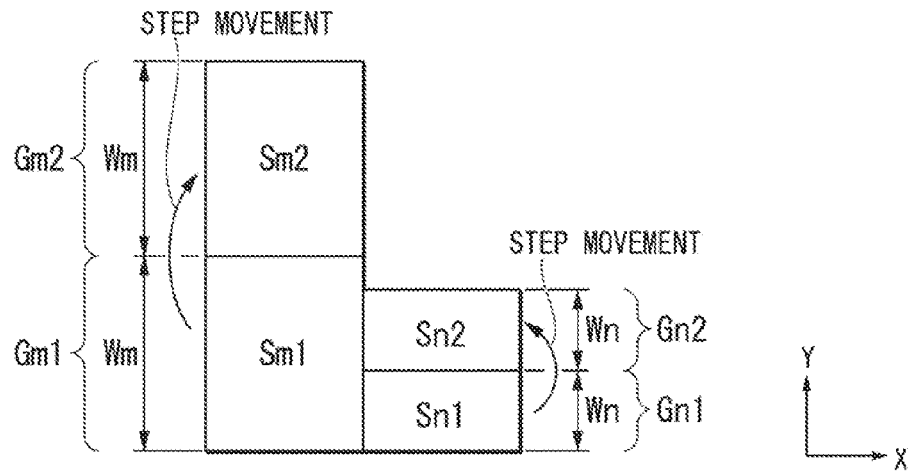
FIG. 26 is a view for explaining an example of the operation of the exposure apparatus according to the fourth embodiment.

FIG. 26 schematically shows an example in which shot regions Sm1 and Sm2 having sizes Wm with respect to the Y axis direction are sequentially exposed and shot regions Sn1 and Sn2 having sizes Wn with respect to the Y axis direction are sequentially exposed. In FIG. 26, the size Wn is smaller than the size Wm. The shot region Sn1 is included in a row Gm1. The shot region Sm2 is included in a row Gm2. The row Gm1 is different from the row Gm2. The row Gm2 is disposed on the +Y side of the row Gm. Moreover, the row Gm2 may be disposed on the −Y side of the row Gm1. The shot region Sn1 is included in a row Gn1. The shot region Sn2 is included in a row Gn2. The row Gn1 is different from the row Gn2. The row Gn2 is disposed on the +Y side of the row Gn1. Moreover, the row Gn2 may be disposed on the −Y side of the row Gn1. Also in the example shown in FIG. 26, the scan movement direction is the Y axis direction. After the shot regions Sm1 and Sm2 are sequentially exposed, the shot regions Sn1 and Sn2 are sequentially exposed. Moreover, after the shot regions Sn1 and Sn2 of the row Gn are sequentially exposed, the shot regions Sm1 and Sm2 of the row Gm may be sequentially exposed.

In the example shown in FIG. 26, the driving apparatus 32 is controlled so that the operation (movement) of the second member 22 in the step movement period of the substrate P which is between the exposure termination of the shot region Sm1 and the exposure start of the shot region Sm2 is different from the operation (movement) of the second member 22 in the step movement period of the substrate P which is between the exposure termination of the shot region Sn1 and the exposure start of the shot region Sn2.

In the examples shown in FIGS. 24, 25, and 26, for example, the movement distance of the second member 22 in the step movement period between the shot regions Sm1 and Sm2 may be longer than the movement distance of the second member 22 in the step movement period between the shot regions Sn1 and Sn2. For example, in the step movement period between the shot regions Sm1 and Sm2, the second member 22 may move between the position Jr and the position Js, and in the step movement period between the shot regions Sn1 and Sn2, the second member 22 may move between the position Jrm and the position Jsm.

Figure 27:
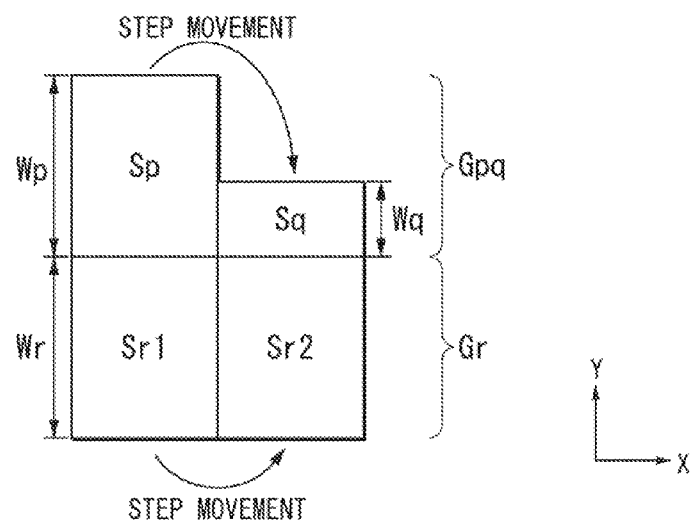
FIG. 27 is a view for explaining an example of the operation of the exposure apparatus according to the fourth embodiment.

FIG. 27 schematically shows an example in which shot regions Sp and Sq each having sizes Wp and Wq with respect to the Y axis direction are sequentially exposed, and shot regions Sr1 and Sr2 having sizes Wr with respect to the Y axis direction are sequentially exposed. In FIG. 27, the size Wq is smaller than the size Wp. In addition, the size Wq may be larger than the size Wp. In the example shown in FIG. 27, the size Wr is substantially the same as the size Wp. Moreover, the size Wr may be substantially the same as the size Wq. In addition, the size Wr may be different from the sizes Wp and Wq. The size Wr may be smaller than or may be larger than the sizes Wp and Wq. The size Wr may be larger than one of the sizes Wp and Wq and may be smaller than the another one of the sizes Wp and Wq.

The shot regions Sp and Sq are included in a row Gpq. The shot regions Sr1 and Sr2 are included in a row Gr. The row Gpq is disposed on the +Y side of the row Gr. Moreover, the row Gpq may be disposed on the −Y side of the row Gr. After the shot regions Sp and Sq of the row Gpq are sequentially exposed, the shot regions Sr1 and Sr2 of the row Gr are sequentially exposed. In addition, after the shot regions Sr1 and Sr2 of the row Gr are sequentially exposed, the shot regions Sp and Sq of the row Gpq are sequentially exposed.

In the example shown in FIG. 27, the driving apparatus 32 is controlled so that the operation (movement) of the second member 22 in the step movement period of the substrate P between the exposure termination of the shot region Sp and the exposure start of the shot region Sq is different from the operation (movement) of the second member 22 in the step movement period of the substrate P between the exposure termination of the shot region Sr1 and the exposure start of the shot region Sr2.

Figure 28:
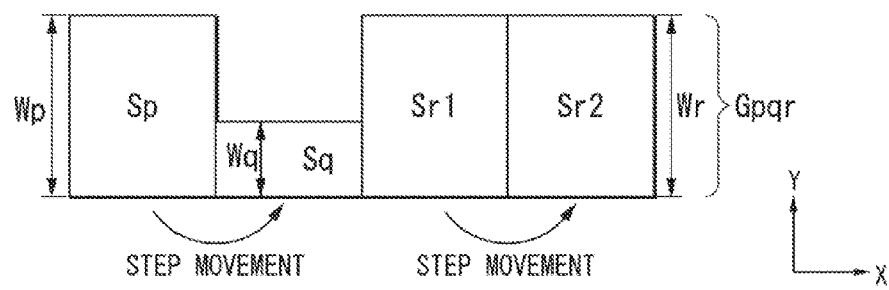
FIG. 28 is a view for explaining an example of the operation of the exposure apparatus according to the fourth embodiment.

FIG. 28 schematically shows an example in which the shot regions Sp and Sq each having sizes Wp and Wq with respect to the Y axis direction are sequentially exposed and the shot regions Sr1 and Sr2 having sizes Wr with respect to the Y axis direction are sequentially exposed. In FIG. 28, the size Wq is smaller than the size Wp. Moreover, the size Wq may be larger than the size Wp. In the example shown in FIG. 28, the size Wr is substantially the same as the size Wp. In addition, the size Wr may be substantially the same as the size Wq. Moreover, the size Wr may be different from the sizes Wp and Wq. The size Wr may be smaller or may be larger than the sizes Wp and Wq. The size Wr may be larger than one of the sizes Wp and q and may be smaller than the other of the sizes Wp and q.

The shot regions Sp and Sq and the shot regions Sr1 and Sr2 are included in a row Gpqr. In the row Gpqr, after the shot regions Sp and Sq are sequentially exposed, the shot regions Sr1 and Sr2 are sequentially exposed. Moreover, after the shot regions Sr1 and Sr2 are sequentially exposed, the shot regions Sp and Sq may be sequentially exposed.

In the example shown in FIG. 28, the driving apparatus 32 is controlled so that the operation (movement) of the second member 22 in the step movement period of the substrate P which is between the exposure termination of the shot region Sp and the exposure start of the shot region Sq is different from the operation (movement) of the second member 22 in the step movement period of the substrate P which is between the exposure termination of the shot region Sr1 and the exposure start of the shot region Sr2.

Figure 29:
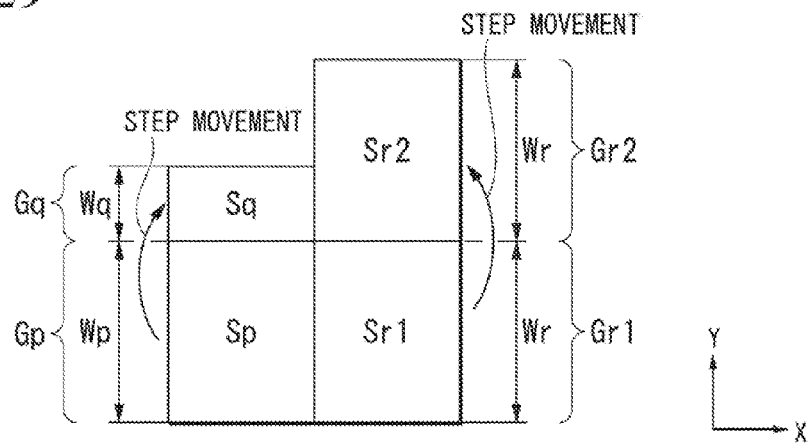
FIG. 29 is a view for explaining an example of the operation of the exposure apparatus according to the fourth embodiment.

FIG. 29 schematically shows an example in which shot regions Sp and Sq each having sizes Wp and Wq with respect to the Y axis direction are sequentially exposed and shot regions Sr1 and Sr2 having sizes Wr with respect to the Y axis direction are sequentially exposed. In FIG. 29, the size Wq is smaller than the size Wp. Moreover, the size Wq may be larger than the size Wp. In the example shown in FIG. 29, the size Wr is substantially the same as the size Wp. In addition, the size Wr may be substantially the same as the size Wq. Moreover, the size Wr may be different from the sizes Wp and Wq. The size Wr may be smaller or may be larger than the sizes Wp and Wq. The size Wr may be larger than one of the sizes Wp and q and may be smaller than the another one of the sizes Wp and q.

The shot regions Sp are included in the row Gp. The shot regions Sq are included in the row Gq. The row Gp is different from the row Gq. The row Gq is disposed on the +Y side of the row Gp. Moreover, the row Gq may be disposed on the −Y side of the row Gp. The shot region Sr1 is included in a row Gr1. The shot region Sr2 is included in a row Gr2. The row Gr1 is different from the row Gr2. The row Gr2 is disposed on the +Y side of the row Gr1. In addition, the row Gr2 may be disposed on the −Y side of the row Gr1. In the example shown in FIG. 29, the scan movement direction is the Y axis direction. After the shot regions Sp and Sq are sequentially exposed, the shot regions Sr1 and Sr2 are sequentially exposed. In addition, after the shot regions Sr1 and Sr2 are sequentially exposed, the shot regions Sp and Sq may be sequentially exposed.

In the example shown in FIG. 29, the driving apparatus 32 is controlled so that the operation (movement) of the second member 22 in the step movement period of the substrate P which is between the exposure termination of the shot region Sp and the exposure start of the shot region Sq is different from the operation (movement) of the second member 22 in the step movement period of the substrate P which is between the exposure termination of the shot region Sr1 and the exposure start of the shot region Sr2.

In the examples shown in FIGS. 27, 28, and 29, for example, the movement distance of the second member 22 in the step movement period between the shot regions Sr1 and Sr2 may be longer than the movement distance of the second member 22 in the step movement period between the shot regions Sp and Sq. For example, in the step movement period between the shot regions Sr1 and Sr2, the second member 22 may move between the position Jr and the position Js, and in the step movement period between the shot regions Sp and Sq, the second member 22 may move between the position Jrm and the position Jsm.

<Fifth Embodiment>

A fifth embodiment will be described. In the descriptions below, the same reference numerals are attached to the same or similar components as those of the above-described embodiments, and descriptions thereof are simplified or omitted here.

Figure 30:
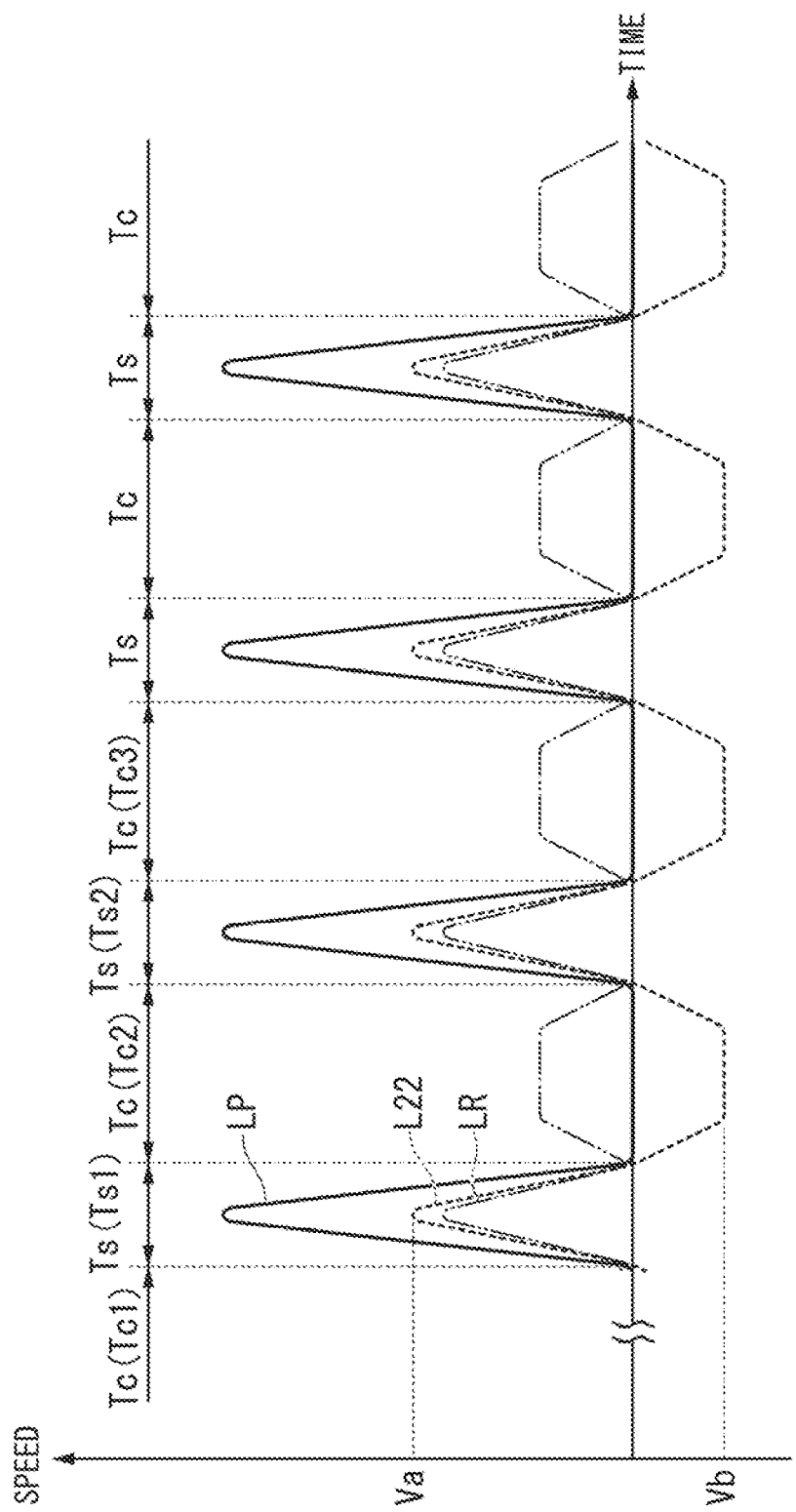
FIG. 30 is a view for explaining an example of an operation of an exposure apparatus according to a fifth embodiment.

FIG. 30 is a view showing examples of relationships between the speed of the substrate P (substrate stage 2) and the speed of the second member 22 with respect to the X axis direction, and time. In the graph shown in FIG. 30, a horizontal axis indicates the time, and a vertical axis indicates the speed. In FIG. 30, a line LP indicates the speed of the substrate P (substrate stage 2), and a line L22 indicates the speed of the second member 22. A line LR indicates the relative speed between the substrate P (substrate stage 2) and the second member 22.

In FIG. 30, a period Tc indicates the period in which the scan movement operation is performed. For example, in the example shown in FIG. 11, a period Tc1 corresponds to the scan movement period of the substrate P from the position d1 to the position d2, a period Tc2 corresponds to the scan movement period of the substrate P from the position d3 to the position d4, and a period Tc3 corresponds to the scan movement period of the substrate P from the position d5 to the position d6. Moreover a period Ts indicates the period in which the step movement operation is performed. For example, in the example shown in FIG. 11, a period Ts1 corresponds to the step movement period of the substrate P from the position d2 to the position d3, and a period Ts2 corresponds to the step movement period of the substrate P from the position d4 to the position d5.

As shown in FIG. 30, in the present embodiment, the movement speed of the second member 22 with respect to the X axis direction in the step movement period Ts is lower than the movement speed of the substrate P (substrate stage 2).

Moreover, the movement speed of the second member 22 may be substantially the same as the movement speed of the substrate P (substrate stage 2) or may be higher than the movement speed of the substrate P (substrate stage 2). That is, the substrate P (substrate stage 2) may move at a higher speed than the second member 22, may move at a lower speed than the second member 22, or may move at the same speed as the second member 22.

Moreover, as shown in FIG. 30, in the present embodiment, the acceleration of the second member 22 with respect to the X axis direction in the step movement period Ts is lower than the acceleration of the substrate P (substrate stage 2). Moreover, the acceleration of the second member 22 may be the same as the acceleration of the substrate P (substrate stage 2), or may be higher than the acceleration of the substrate P (substrate stage 2).

In addition, as shown in FIG. 30, in the present embodiment, the controller 6 controls the driving apparatus 32 so that the second member 22 moves at a first movement condition in the +X axis direction in the step movement period of the substrate P which is between the exposure termination of the shot region S (for example, the shot region S1) and the exposure start of the next shot region S (for example, the shot region S2), and the second member 22 moves at a second movement condition different from the first movement condition in the −X axis direction in the exposure period (scan movement period) of the substrate P which is between the exposure start of the shot region S2 and the exposure termination.

The first and second movement conditions include the movement speed of the second member 22. In the present embodiment, the first and second movement conditions include the movement speed of the second member 22 with respect to the X axis direction.

In addition, the first and second movement conditions include the acceleration (deceleration) of the second member 22. In the present embodiment, the first and second movement conditions include the acceleration (deceleration) of the second member 22 with respect to the X axis direction.

For example, as shown in FIG. 30, in the step movement period Ts, the second member 22 moves at a speed (maximum speed) Va. In the scan movement period (exposure period) Tc, the second member 22 moves at a speed (maximum speed) Vb.

In the present embodiment, the movement speed Vb of the second member 22 in the scan movement period (exposure period) Tc is lower than the movement speed Va of the second member 22 in the step movement period Ts. Moreover, in the present embodiment, the movement speed of the second member 22 includes an absolute value of the speed (relative speed) with respect to the terminal optical element 13.

In addition, in the present embodiment, the acceleration of the second member 22 in the scan movement period (exposure period) Tc is lower than the acceleration of the second member 22 in the step movement period Ts. Moreover, in the present embodiment, the acceleration of the second member 22 includes the absolute value of the acceleration with respect to the terminal optical element 13.

In the present embodiment, the second member 22 moves at a constant speed in at least a portion of the scan movement speed (exposure period) Tc. In the present embodiment, the second member 22 moves at the constant speed Vb in at least a portion of the scan movement speed (exposure period) Tc. The second member 22 may move at a constant speed in at least a portion of the step movement speed Ts. A time Tcc when the second member 22 moves at a constant speed in the scan movement period (exposure period) Tc is longer than a time when the second member 22 moves at a constant speed in the step movement period Ts.

Moreover, the second member 22 may not move at a constant speed in the step movement period Ts. In addition, the second member 22 may not move at a constant speed in the scan movement period (exposure period) Tc.

Moreover, in the present embodiment, the movement distance of the second member 22 with respect to the X axis direction in the step movement period Ts is shorter than the movement distance of the substrate P (substrate stage 2). For example, the movement distance of the second member 22 in the step movement period Ts may be 45% to 65% of the movement distance of the substrate P (substrate stage 2). For example, the movement distance of the second member 22 may be any one of 45%, 50%, 55%, 60%, and 65% of the movement distance of the substrate P (substrate stage 2). In the present embodiment, the movement distance of the second member 22 in the step movement period Ts is the distance from the position Jr to the position Jm. Moreover, in the present embodiment, the movement distance of the second member 22 with respect to the X axis direction in the step movement period Ts is shorter than a distance (a distance A) between the center of a predetermined shot region S and the center of the shot region S adjacent to the predetermined shot region S with respect to the X axis direction. For example, the movement distance of the second member 22 in the step movement period Ts may be 45% to 65% of the distance A. For example, the movement distance of the second member 22 in the step movement period Ts may be any one of 45%, 50%, 55%, 60%, and 65% of the distance A. Moreover, the movement distance of the second member 22 with respect to the X axis direction in the step movement period Ts shorter than the size (a size B) of one shot region S with respect to the X axis direction. For example, the movement distance of the second member 22 in the step movement operation may be 45% to 65% of the size B. For example, the movement distance of the second member 22 in the step movement operation may be any one of 45%, 50%, 55%, 60%, and 65% of the size B. For example, when the size (size B) of the shot region S with respect to the X axis direction is 26 mm, the movement distance of the second member 22 may be approximately 14 mm.

For example, the movement distance of the second member 22 may be determined based on a surface condition of the substrate P. The surface condition of the substrate P includes a contact angle (a receding contact angle or the like) of the liquid LQ at the surface of a photosensitive film which forms the surface of the substrate P. The surface condition of the substrate P includes a contact angle (a receding contact angle or the like) of the liquid LQ at the surface of a protective film (a top coat film) which forms the surface of the substrate P. Moreover, for example, the surface of the substrate P may be formed of an antireflection film. In addition, the movement distance of the second member 22 may be obtained by a preliminary experiment or simulation so that flowing-out (remaining liquid) of the liquid LQ from the liquid immersion space LS is suppressed in the step movement operation.

As described above, according to the present embodiment, the second member 22 is moved so that the movement condition of the second member 22 in the step movement period Ts is different from the movement condition of the second member 22 in the scan movement period (exposure period) Tc, and thus, the flowing-out or the like of the liquid LQ from the liquid immersion space LS can be suppressed.

In the present embodiment, the movement of the substrate P (substrate stage 2) in the step movement period Ts is different from the movement of the substrate P (substrate stage 2) in the scan movement period (exposure period) Tc. Accordingly, the movement condition of the second member 22 is determined based on the movement of the substrate P (substrate stage 2), and thus, the flowing-out or the like of the liquid LQ is suppressed. Therefore, occurrence of exposure failure and occurrence of a defective device are suppressed.

Figure 31A:
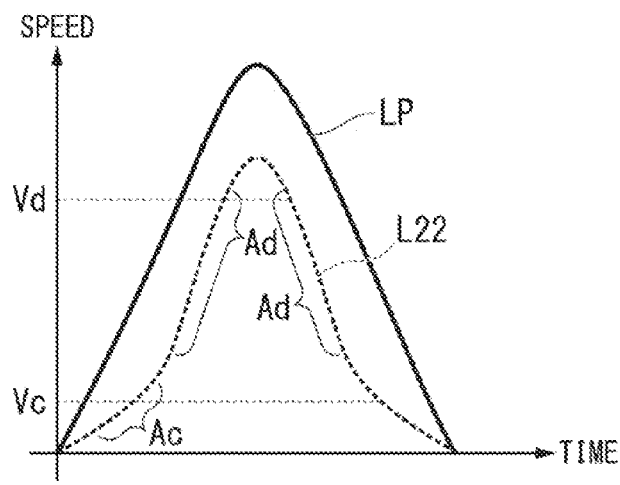
FIG. 31A is a view for explaining an example of the operation of the exposure apparatus according to the fifth embodiment.
Figure 31B:
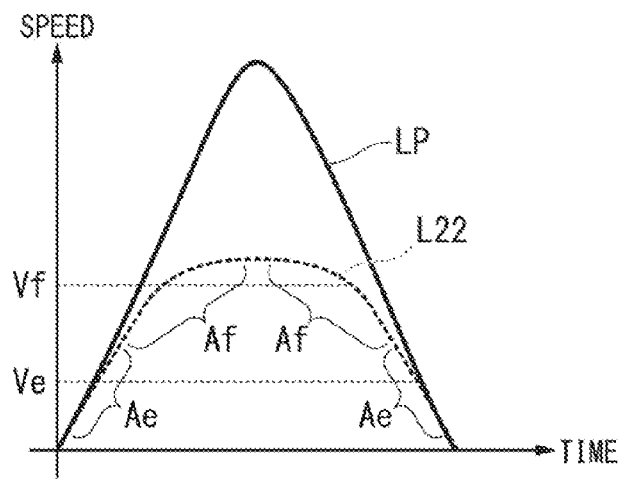
FIG. 31B is a view for explaining an example of the operation of the exposure apparatus according to the fifth embodiment.
Figure 31C:
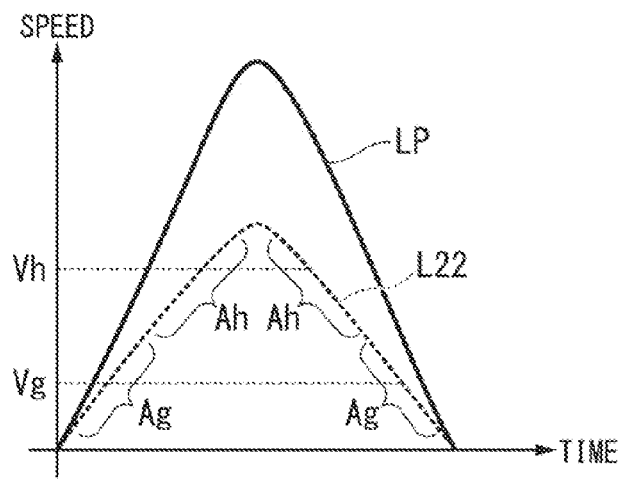
FIG. 31C is a view for explaining an example of the operation of the exposure apparatus according to the fifth embodiment.

FIGS. 31A to 31C are a view showing examples of relationships between the speed of the substrate P (substrate stage 2) and the speed of the second member 22 with respect to the X axis direction, and time, in the step movement period Ts. In the graphs shown in FIGS. 31A to 31C, a horizontal axis indicates the time, and a vertical axis indicates the speed. In FIGS. 31A to 31C, the line LP indicates the speed of the substrate P (substrate stage 2), and the line L22 indicates the speed of the second member 22.

FIG. 31A shows examples of states where the substrate P moves at a speed Vc and a speed Vd to one side (for example, in the +X axis direction) in the X axis direction in the step movement period Ts. The speed Vd is higher than the speed Vc. In the example shown in FIG. 31A, in the state where the substrate P moves at the speed Vc in the +X axis direction, the second member 22 moves at an acceleration Ac in the +X axis direction. In the state where the substrate P moves at the speed Vd in the +X axis direction, the second member 22 moves at an acceleration Ad in the +X axis direction. The acceleration Ad is higher than the acceleration Ac. FIG. 31A shows the example in which the second member 22 moves at a low acceleration in a low speed movement region of the substrate P, and the second member 22 moves at a high acceleration in a high speed movement region of the substrate P.

FIG. 31B shows examples of states where the substrate P moves at a speed Ve and a speed Vf to one side (for example, in the +X axis direction) in the X axis direction in the step movement period Ts. The speed Vf is higher than the speed Ve. In the example shown in FIG. 31B, in the state where the substrate P moves at the speed Ve in the +X axis direction, the second member 22 moves at an acceleration Ae in the +X axis direction. In the state where the substrate P moves at the speed Vf in the +X axis direction, the second member 22 moves at an acceleration Af in the +X axis direction. The acceleration Af is lower than the acceleration Ae. FIG. 31B shows the example in which the second member 22 moves at high acceleration in a low speed movement region of the substrate P, and the second member 22 moves at low acceleration in a high speed movement region of the substrate P.

FIG. 31C shows examples of states where the substrate P moves at a speed Vg and a speed Vh to one side (for example, in the +X axis direction) in the X axis direction in the step movement period Ts. The speed Vh is higher than the speed Vg. In the example shown in FIG. 31C, in the state where the substrate P moves at the speed Vg in the +X axis direction, the second member 22 moves at an acceleration Ag in the +X axis direction. In the state where the substrate P moves at the speed Vh in the +X axis direction, the second member 22 moves at an acceleration Ah in the +X axis direction. In the present embodiment, the acceleration Ag is substantially the same as the acceleration Ah. In the present embodiment, the second member 22 moves at a substantial constant acceleration from one of a state where the speed of the second member with respect to the X axis direction is zero and a state where the speed is the fastest value (maximum speed) to the other.

Moreover, relationships between the speed of the substrate P (substrate stage 2) and the speed of the second member 22, and the time shown in FIGS. 31A to 31C is able to be applied not only to the step movement periods described referring to FIGS. 11, 14, and 15 but also to the step movement periods (first and second step movement periods) described referring to FIGS. 16 to 21 and the step movement period described with reference to the FIGS. 22 to 29.

For example, in the second step movement period of the embodiment described referring to FIGS. 16 to 21, for example, when the substrate P moves to be changed from a speed Vj to a speed Vk higher than the speed Vj in the +X axis direction, the second member 22 may move at an acceleration Aj in the +X axis direction in a state where the substrate P moves at the speed Vj in the +X axis direction, and the second member 22 may move at an acceleration Ak lower than the acceleration Aj in the +X axis direction in a state where the substrate P moves at the speed Vk in the +X axis direction. Moreover, the acceleration Ak may be higher than the acceleration Aj. Moreover, for example, in one or both of the step movement period between the shot regions Si2 and Sj1 and the step movement period between the shot regions Sj2 and Sj3 described with reference to FIGS. 22 and 23, the relationships between the speed of the substrate P (substrate stage 2) and the speed of the second member 22 and the time described with reference to FIGS. 31A to 31C is able to be applied.

Figure 32A:
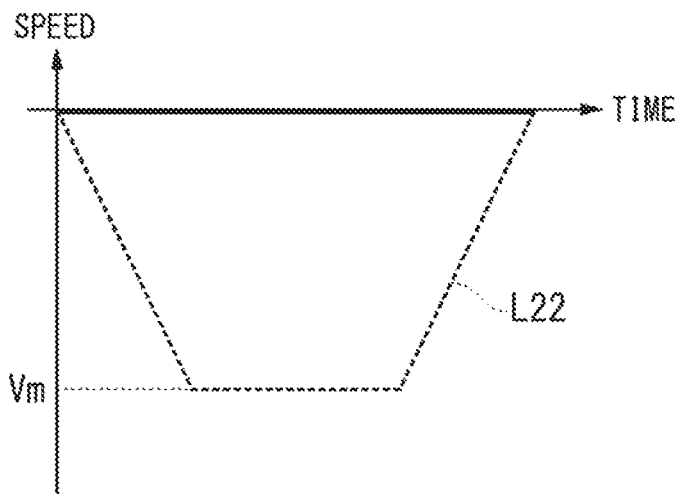
FIG. 32A is a view for explaining an example of the operation of the exposure apparatus according to the fifth embodiment.
Figure 32B:
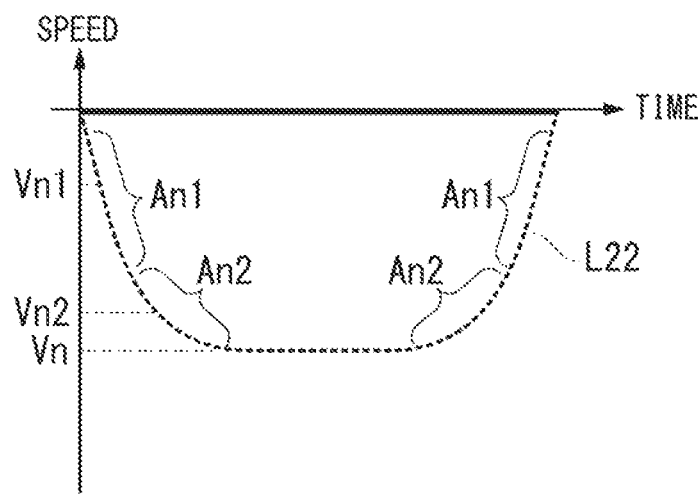
FIG. 32B is a view for explaining an example of the operation of the exposure apparatus according to the fifth embodiment.

FIGS. 32A and 32B are views showing examples of the relationships between the speed of the second member 22 with respect to the X axis direction and time, in the scan movement period Tc. In the graphs shown in FIGS. 32A and 32B, the horizontal axis indicates the time, and the vertical axis indicates the speed. In FIGS. 32A and 32B, the line L22 indicates the speed of the second member 22.

FIG. 32A shows an example in which the second member 22 moves at a constant speed Vm in the period of a portion of the scan movement period Tc. In the period of a portion of the scan movement period Tc, the second member 22 moves at a constant speed which is the speed Vm. In the present embodiment, the speed Vm is the maximum speed of the second member 22 in the scan movement period Tc. In the example shown in FIG. 32A, the second member 22 moves at a substantial constant acceleration until the state of the second member 22 changes from one of the state where the speed of the second member with respect to the X axis direction is zero and the state where the speed is the fastest value (maximum speed) to the other. Moreover, in a period of a portion of the scan movement period Tc, the second member 22 may move at a constant speed which is lower than the maximum speed in the scan movement period Tc.

FIG. 32B shows an example in which the second member 22 moves at a constant speed Vn in the period of a portion of the scan movement period Tc. In the period of a portion of the scan movement period Tc, the second member 22 moves at a constant speed which is the speed Vn. In the present embodiment, the speed Vn is the maximum speed of the second member 22 in the scan movement period Tc. In the example shown in FIG. 32B, the second member 22 is changed from a state where the second member moves at a speed Vn1 with respect to the X axis direction to a state where the second member moves at the speed (maximum speed) Vn via a state where the second member moves at a speed Vn2. The speed Vn1 is lower than the speed Vn2. In the present embodiment, an acceleration An2 of the second member 22 in the period in which the second member 22 moves at the speed Vn2 is lower than an acceleration An1 of the second member 22 in the period in which the second member 22 moves at the speed Vn1. In other words, the second member 22 moves at a high acceleration in the low speed movement region and moves at a low acceleration in the high speed movement region.

Figure 33:
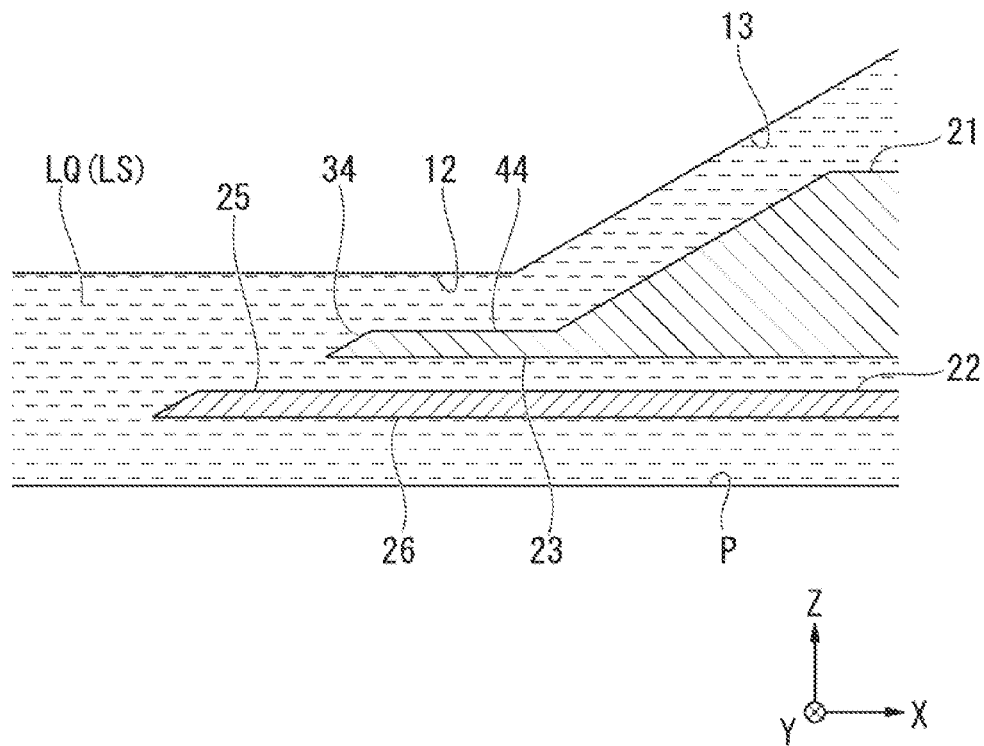
FIG. 33 is a view showing an example of the liquid immersion member.

Moreover, in the first to fifth embodiments, as shown in FIG. 33, at least a portion of the first member 21 may be opposite to the emitting surface 12 of the terminal optical element 13. In the modified example shown in FIG. 33, the first member 21 includes an upper surface 44 which is disposed at the surrounding of the opening 34. The upper surface 44 is disposed at the surrounding of the upper end of the opening 34. The lower surface 23 is disposed at the surrounding of the lower end of the opening 34. A portion of the upper surface 44 is opposite to the emitting surface 12. Moreover, in the example shown in FIG. 33, a portion of the upper surface 25 of the second member 22 is also opposite to the emitting surface 12.

Figure 34:
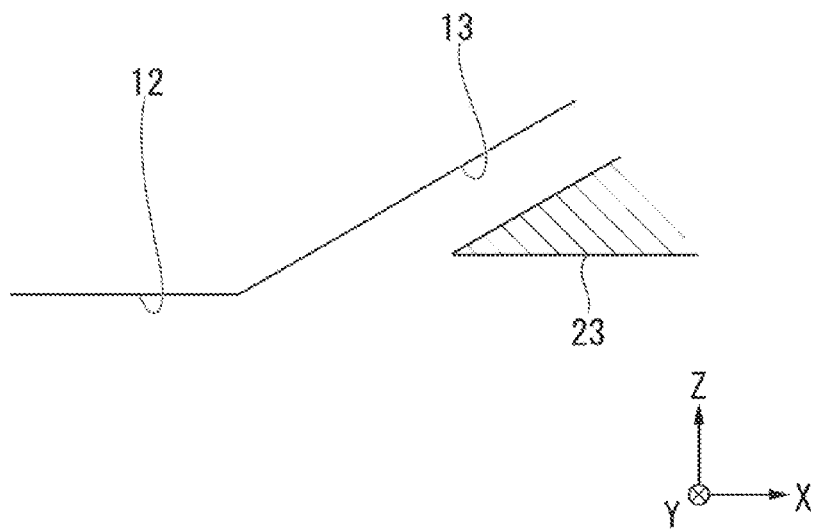
FIG. 34 is a view showing an example of the liquid immersion member.

Moreover, as shown in FIG. 34, the lower surface 23 of the first member may be disposed more on the +Z side than the emitting surface 12. In addition, the position (height) of the lower surface 23 with respect to the Z axis direction may be substantially the same as the position (height) of the emitting surface 12. The lower surface 23 of the first member may be disposed more on the −Z side than the emitting surface 12.

In addition, in each of the above-described embodiments, the liquid immersion member 5 does not include a channel, which fluidly connects the first space SP1 and the second space SP2, except for the opening 35. However, an opening (hole), which fluidly connects the first space SP1 and the second space SP2, may be formed outside the opening 35 with respect to the optical path K.

In the above described embodiments, the immersion liquid member 5 has a configuration in which the upper surface 25 of the second member 22 is facing the lower surface 23 via gap. The upper surface 25 of the second member 22 is facing +Z axis direction of the second member 22. The lower surface is facing −Z axis direction and is extending in surrounding of the opening 34 of the first member 21.

In the modified examples, the liquid immersion member 5 can have a different embodiment from the above mentioned embodiments.

As an example, the immersion member 5S includes a first member 21S disposed at at least a portion of surrounding of the optical member (terminal optical element 13) and a movable second member 22S that is disposed at at least a portion of surrounding of the optical member (terminal optical element 13) and that has a fluid recovery part 27S. As shown in the FIG. 35, the first member 21S and the second member 22S can be arranged at surrounding of the opening 34S of the first member 21S through which the exposure light EL of the first member 21S is able to pass so that the lower surface 23S extending in the vicinity of the opening 34S does not face the second member 22S.

As another example, the immersion member 5T includes a first member 21T that is disposed at at least a portion of surrounding of the optical member (terminal optical element 13) and that has a fluid recovery part 27T, and a movable second member 22T disposed at at least a portion of surrounding of the optical member (terminal optical element 13). As shown in the FIG. 36, the first member 21S and the second member 22S can be arranged at surrounding of the opening 34T of the first member 21T through which the exposure light EL of the first member 21T is able to pass so that the lower surface 23S spreading in the vicinity of the opening 34S faces the upper surface 25T of the second member 22T.

Figure 36:
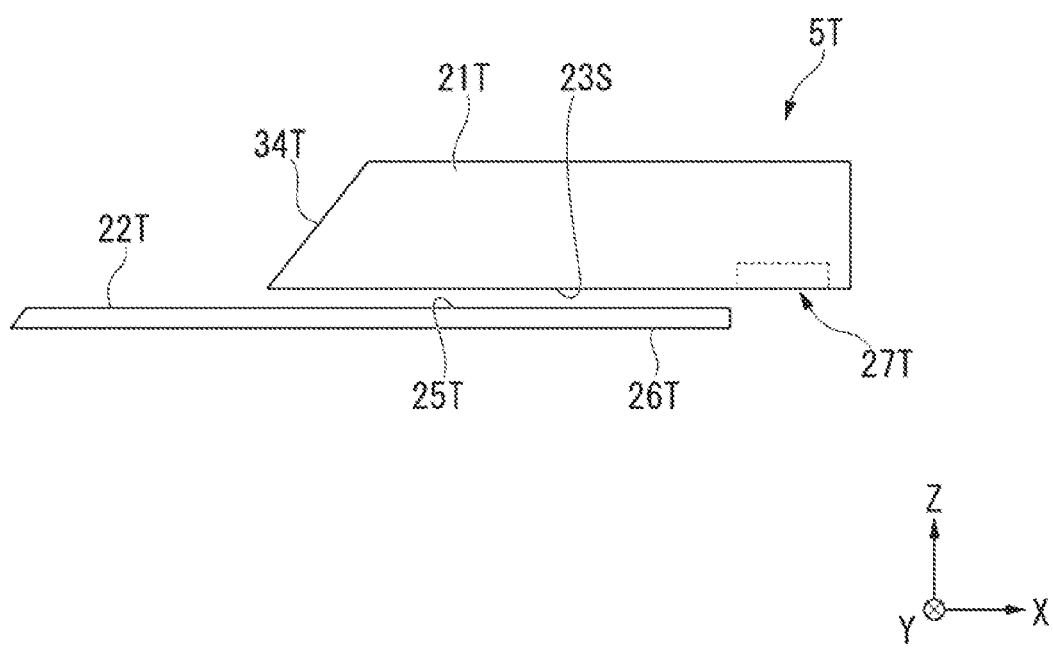
FIG. 36 is a view showing an example of the liquid immersion member.
Figure 37:
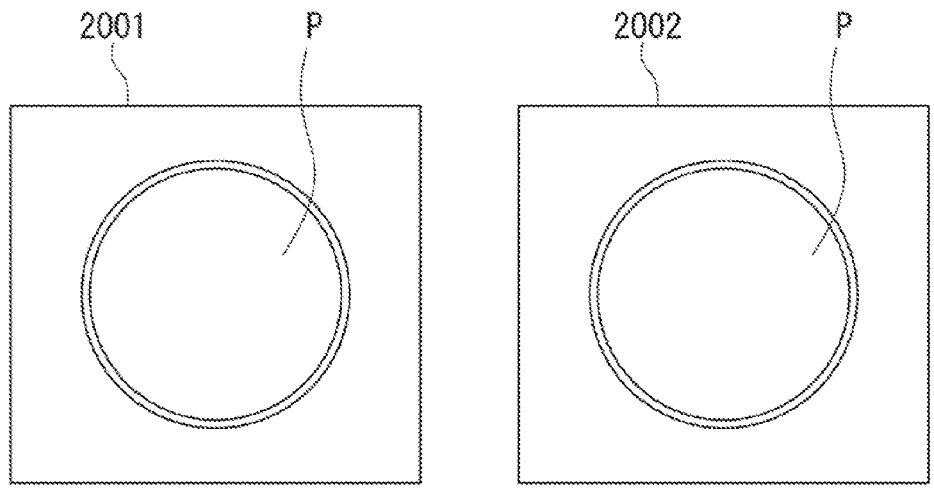
FIG. 37 is a view showing an example of a substrate stage.

In the example shown in FIG. 36, the liquid LQ from the space between the lower surface 23T of the first member 21T and the object (substrate P), and the liquid LQ from the space between the lower surface 26T of the second member 22T and the object (substrate P) is recovered by the fluid recovery part 27T of the first member 21T In the another examples, the liquid immersion member 5 may have a configuration in which the lower surface 23 and/or the upper surface 25 include a surface that is inclined with respect to the Z axis.

In addition, in each of the above-described embodiments, a suction port, which sucks at least one of the liquid LQ and the gas from the space between the first member 21 and the terminal optical element 13, may be provided at the first member 21.

Moreover, in each of the above-described embodiments, the supply port, which supplies the liquid LQ to the first space SP1, may be provided on at least one of the first member 21 and the second member 22. For example, a supply port supplying the liquid LQ may be provided on the lower surface 23 of the first member 21 between the opening 34 and the liquid recovery part 24.

Moreover, in each of the above-described embodiments, the controller 6 includes a computer system which includes a CPU or the like. In addition, the controller 6 includes an interface which is able to perform communication with a computer system and an external apparatus. For example, the storage apparatus 7 includes a memory such as a RAM, a hard disk, and a recording medium such as a CD-ROM. In the storage apparatus 7, an operating system (OS) which controls the computer system is installed and a program for controlling the exposure apparatus EX is stored.

Moreover, an input apparatus which is able to input signals may be connected to the controller 6. The input apparatus includes input equipment such as a keyboard or a mouse, a communication apparatus or the like which is able to input data from the external apparatus, and the like. Moreover, a display apparatus such as a liquid crystal display may be also provided.

The controller (computer system) 6 is able to read various information which includes the programs which are recorded in the storage apparatus 7. Programs are recorded in the storage apparatus 7, and the programs make the controller 6 perform the control of the liquid immersion exposure apparatus which exposes the substrate by the exposure light via the liquid filled in the optical path of the exposure light between the emitting surface of the optical member from which the exposure light is emitted and the substrate.

According to the above-described embodiments, the programs which are recorded in the storage apparatus 7 may make the controller 6 perform: forming a liquid immersion space of the liquid by using a liquid immersion member that includes a first member and a second member, the first member having a first lower surface and being disposed at at least a portion of surrounding of the optical member, the second member having a second upper surface opposite to the first lower surface via a gap and a second lower surface which is capable of opposing to the substrate and the second member being disposed at at least a portion of surrounding of an optical path of the exposure light: sequentially exposing each of a plurality of shot regions by the exposure light emitted from the emitting surface via the liquid of the liquid immersion space, the plurality of shot regions being included in one row on the substrate and being disposed in a direction which intersects with a scanning direction; exposing shot regions of another row different from the one row via the liquid of the liquid immersion space before or after exposing the shot regions included in the one row; and moving the second member with respect to the first member in at least a portion of an exposure of the substrate so that a first operation of the second member in a first movement period of the substrate which is between exposure termination of a first shot region and exposure start of a second shot region is different from a second operation of the second member in a second movement period of the substrate which is between exposure termination of a third shot region and exposure start of a fourth shot region, the first and second shot regions being included in the same row, the third and fourth shot regions being arranged in different rows.

In addition, according to the above-described embodiments, the programs which are recorded in the storage apparatus 7 may make the controller 6 perform: forming a liquid immersion space of the liquid by using a liquid immersion member that includes a first member and a second member, the first member having a first lower surface and being disposed at at least a portion of surrounding of the optical member, the second member having a second upper surface opposite to the first lower surface via a gap and a second lower surface which is capable of opposing to the substrate and the second member being disposed at at least a portion of surrounding of an optical path of the exposure light; sequentially exposing first and second shot regions by the exposure light emitted from the emitting surface via the liquid of the liquid immersion space, the first and second shot regions having a first size with respect to the scanning direction; sequentially exposing third and fourth shot regions by the exposure light emitted from the emitting surface via the liquid of the liquid immersion space before or after exposures of the first and second shot regions, the third and fourth shot regions having a second size different from the first size with respect to the scanning direction; and moving the second member with respect to the first member in at least a portion of an exposure of the substrate so that a first operation of the second member in a first movement period of the substrate which is between exposure termination of the first shot region and exposure start of the second shot region is different from a second operation of the second member in a second movement period of the substrate which is between exposure termination of the third shot region and exposure start of the fourth shot region.

Moreover, according to the above-described embodiments, the programs which are recorded in the storage apparatus 7 may make the controller 6 perform: forming a liquid immersion space of the liquid by using a liquid immersion member that includes a first member and a second member, the first member having a first lower surface and being disposed at at least a portion of surrounding of the optical member, the second member having a second upper surface opposite to the first lower surface via a gap and a second lower surface which is capable of opposing to the substrate and the second member being disposed at at least a portion of surrounding of an optical path of the exposure light; sequentially exposing first and second shot regions by the exposure light emitted from the emitting surface via the liquid of the liquid immersion space, the first shot region having a first size with respect to the scanning direction and the second shot region having a second size with respect to the scanning direction; sequentially exposing third and fourth shot regions by the exposure light emitted from the emitting surface via the liquid of the liquid immersion space before or after exposures of the first and second shot regions, the third and fourth shot regions having a third size with respect to the scanning direction; and moving the second member with respect to the first member in at least a portion of an exposure of the substrate so that a first operation of the second member in a first movement period of the substrate which is between exposure termination of the first shot region and exposure start of the second shot region is different from a second operation of the second member in a second movement period of the substrate which is between exposure termination of the third shot region and exposure start of the fourth shot region.

In addition, according to the above-described embodiments, the programs which are recorded in the storage apparatus 7 may make the controller 6 perform: forming a liquid immersion space of the liquid by using a liquid immersion member that includes a first member and a second member, the first member having a first lower surface and being disposed at at least a portion of surrounding of the optical member, the second member having a second upper surface opposite to the first lower surface via a gap and a second lower surface which is capable of opposing to the substrate and the second member being disposed at at least a portion of surrounding of an optical path of the exposure light: sequentially exposing first and second shot regions of the substrate by the exposure light emitted from the emitting surface via the liquid of the liquid immersion space: and moving the second member with respect to the first member in at least a portion of an exposure of the substrate so that the second member is moved at a first movement condition to one side of the direction which intersects with the scanning direction in a first movement period of the substrate which is between exposure termination of the first shot region and exposure start of the second shot region, and the second member is moved at a second movement condition to the other side of the direction which intersects with the scanning direction in a second exposure period of the substrate which is between exposure start and exposure termination of the second shot region, the second movement condition being different from the first movement condition.

Moreover, according to the above-described embodiments, the programs which are recorded in the storage apparatus 7 may make the controller 6 perform: forming a liquid immersion space of the liquid by using a liquid immersion member that includes a first member and a second member, the first member having a first lower surface and being disposed at at least a portion of surrounding of the optical member, the second member having a second upper surface opposite to the first lower surface via a gap and a second lower surface which is capable of opposing to the substrate and the second member being disposed at at least a portion of surrounding of an optical path of the exposure light; sequentially exposing a plurality of shot regions by the exposure light emitted from the emitting surface via the liquid of the liquid immersion space, the plurality of shot regions being included in one row on the substrate and being disposed in a direction which intersects with the scanning direction; exposing shot regions of another row different from the one row via the liquid of the liquid immersion space before or after of exposure of the shot regions included in the one row; and moving the second member with respect to the first member in a movement period of the substrate which is between exposure termination of a shot region of a row and exposure start of a shot region of different row to be exposed next.

The programs which are stored in the storage apparatus 7 are read by the controller 6, and thus, various apparatuses of the exposure apparatus EX such as the substrate stage 2, the measurement stage 3, and the liquid immersion member 5 cooperate with one another and perform various processing such as the liquid immersion exposure of the substrate P in the state where the liquid immersion space LS is formed.

Moreover, in each of the above-described embodiments, the optical path K at the emitting surface 12 side (image surface side) of the terminal optical element 13 of the projection optical system PL is filled with the liquid LQ. However, for example, the projection optical system PL may be the projection optical system in which the optical path of the incident side (object surface side) at the terminal optical element 13 is also filled with the liquid LQ as disclosed in PCT International Publication No. WO 2004/019128.

In addition, in each of the above-described embodiments, the liquid LQ is water. However, the liquid may be liquid other than the water. It is preferable that the liquid LQ be transparent with respect to the exposure light EL, have high refractive index with respect to the exposure light EL, and be stable with respect to the projection optical system PL or the film of a photosensitive material (photoresist) which forms the surface of the substrate P or the like. For example, the liquid LQ may be fluorinated liquid such as hydrofluoroether (HFE), perfluorinated polyether (PFPE), and Fomblin® oil. Moreover, the liquid LQ may be various fluids, for example, supercritical liquid.

Moreover, in each of the above-described embodiment, the substrate P includes a semiconductor wafer for manufacturing a semiconductor device. However, for example, the substrate may include a glass substrate for a display device, a ceramic wafer for a thin film magnetic head, a mask or an original plate (synthetic quartz, silicon wafer) of a reticle which is used in an exposure apparatus, or the like.

Moreover, in each of the above-described embodiments, the exposure apparatus EX is a scanning type exposure apparatus (scanning stepper) of a step-and-scan system in which the mask M and the substrate P synchronously move and the patterns of the mask M are scanned and exposed. However, for example, the exposure apparatus may be a projection exposure apparatus (stepper) of a step-and-repeat system in which patterns of the mask M are collectively exposed in a state where the mask M and the substrate P are stationary and the substrate P is sequentially step-moved.

In addition, the exposure apparatus EX may be an exposure apparatus (a collective exposure apparatus of a stitch system) in which, in the exposure of a step-and-repeat system, after the reduced image of a first pattern is transferred on the substrate P using the projection optical system in a state where the first pattern and the substrate P are substantially stationary, the reduced image of a second pattern is partially overlapped with the first pattern using the projection optical system and is collectively exposed on the substrate P in a state where the second pattern and the substrate P are substantially stationary. Moreover, the exposure apparatus of the stitch system may be an exposure apparatus of a step-and-stitch system in which at least two patterns are partially overlapped on the substrate P and transferred thereto, and the substrate P is sequentially moved.

In addition, for example, the exposure apparatus EX may be an exposure apparatus in which patterns of two masks are combined on the substrate via the projection optical system and one shot region on the substrate is approximately simultaneously double-exposed by single scanning exposure, as disclosed in U.S. Pat. No. 6,611,316. Moreover, the exposure apparatus EX may be an exposure apparatus of a proximity system, a mirror projection aligner, or the like.

Figure 35:
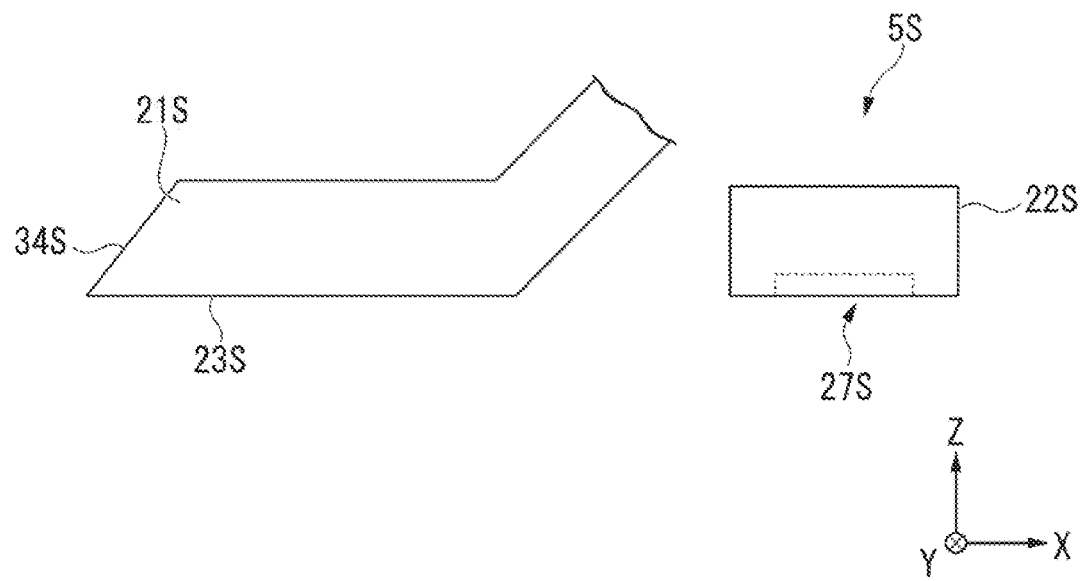
FIG. 35 is a view showing an example of the liquid immersion member.

In addition, in each of the above-described embodiments, the exposure apparatus EX may be an exposure apparatus of a twin stage type which includes a plurality of substrate stages, as disclosed in U.S. Pat. Nos. 6,341,007, 6,208,407, 6,262,796, or the like. For example, as shown in FIG. 35, when the exposure apparatus EX includes two substrate stages 2001 and 2002, the object which is able to be disposed so as to be opposite to the emitting surface 12 includes at least one of one substrate stage, a substrate which is held by a first holding portion of the one substrate stage, another substrate stage, and a substrate which is held by a first holding portion of another substrate stage.

Moreover, the exposure apparatus EX may be an exposure apparatus which includes the plurality of substrate stages and measurement stages.

The exposure apparatus EX may be an exposure apparatus for manufacturing a semiconductor element which exposes a semiconductor element pattern on the substrate P, an exposure apparatus for manufacturing a liquid crystal display element or a display, or an exposure apparatus for manufacturing a thin film magnetic head, an imaging element (CCD), a micromachine, a MEMS, a DNA chip, or a reticle or mask, or the like.

Moreover, in each of the above-described embodiments, the light transmission type mask is used in which a predetermined light shielding pattern (or a phase pattern, a dimming pattern) is formed on the substrate having light transparency. However, instead of this mask, for example, as disclosed in U.S. Pat. No. 6,778,257, a variable molding mask (also referred to as an electronic mask, an active mask, or an image generator) may be used which forms a transparent pattern, a reflective pattern, or a light-emitting pattern based on electronic data of the pattern to be exposed. In addition, instead of the variable molding masks which include a non-light emission type image display element, a pattern-forming apparatus which includes a self light-emission type image display element may be provided.

In each of the above-described embodiments, the exposure apparatus EX includes the projection optical system PL. However, the components in each of the above-described embodiments may be applied to an exposure apparatus and an exposing method which do not use the projection optical system PL. For example, the components in each of the above-described embodiments may be applied to an exposure apparatus and an exposing method in which the liquid immersion space is formed between an optical member such as a lens and the substrate and the exposure light is radiated to the substrate via the optical member.

Moreover, for example, the exposure apparatus EX may be an exposure apparatus (a lithography system) in which interference fringes are formed on the substrate P, and thus, a line-and-space pattern is exposed on the substrate P, as disclosed in PCT International Publication No. WO 2001/035168.

The exposure apparatuses EX of the above-described embodiments are manufactured by assembling various subsystems including each above-described component so as to maintain predetermined mechanical accuracy, electrical accuracy, and optical accuracy. In order to secure the various accuracies, before and after the assembly, adjustment for achieving optical accuracy with respect to various optical systems, adjustment for achieving mechanical accuracy with respect to various mechanical systems, and adjustment for achieving electrical accuracy with respect to various electrical systems are performed. The process of assembling the exposure apparatus from various subsystems includes mechanical connections, wiring connections of electric circuits, piping connections of air-pressure circuits, or the like between various subsystems. Of course, the respective assembly processes of each subsystem are needed before the assembly process from various subsystems to the exposure apparatus. After the assembly process of exposure apparatus by various subsystems is terminated, a general adjustment is performed, and thus, various accuracies in the overall exposure apparatus are secured. Moreover, it is preferable that the manufacturing of the exposure apparatus be performed in a clean room in which temperature, a degree of cleanness, or the like is controlled.

Figure 38:
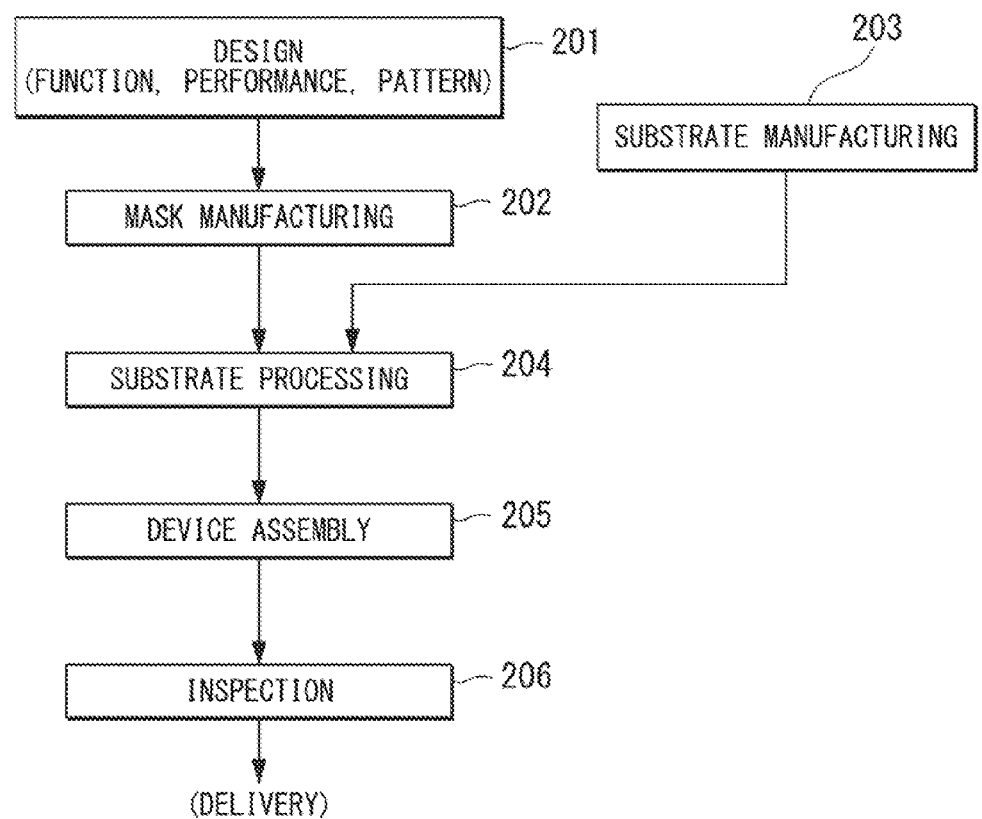
FIG. 38 is a flowchart for explaining an example of a device manufacturing method.

As shown in FIG. 38, a micro-device such as a semiconductor device is manufactured through a step 201 in which the function and performance design of the micro-device is performed, a step 202 in which a mask (reticle) is manufactured based on the design step, a step 203 in which a substrate which is a base material of the device is manufactured, a substrate processing step 204 which includes the substrate processing (exposure processing) including exposing the substrate by the exposure light from the pattern of the mask and developing the exposed substrate according to the above-described embodiments, a device assembly step (which includes manufacturing processes such as a dicing process, a bonding process, and a package process) 205, an inspection step 206, or the like.

Moreover, the aspects of each of the above-described embodiments may be appropriately combined. In addition, some components may not be used. Moreover, as long as legally permitted, the disclosures of all publications and United States patents with respect to the exposure apparatuses or the like cited in each of the above-mentioned embodiments and modifications are incorporated in the disclosures of the present application.

What is claimed is:

1. An exposure apparatus that sequentially exposes each of a plurality of shot regions of a substrate by exposure light via liquid between an emitting surface of an optical member and the substrate while moving the substrate in a scanning direction with respect to the exposure light emitted from the emitting surface, the exposure apparatus comprising:
a liquid immersion member that includes a first member and a second member and that is configured to form a liquid immersion space of the liquid, the first member being disposed at at least a portion of surrounding of the optical member, the second member being disposed at a portion of surrounding of the optical member;
a driving apparatus that is configured to move the second member with respect to the first member; and
a controller that is configured to control the driving apparatus,
wherein, before or after sequential exposures of each of a plurality of shot regions, which are included in one row on the substrate and are disposed in a direction which intersects with the scanning direction, are performed, shot regions of another row different from the one row are exposed,
the controller controls the driving apparatus so that a first operation of the second member in a first movement period of the substrate which is between exposure termination of a first shot region and exposure start of a second shot region is different from a second operation of the second member in a second movement period of the substrate which is between exposure termination of a third shot region and exposure start of a fourth shot region, the first and second shot regions being included in the same row, the third and fourth shot regions being arranged in different rows, and
positions of the second member with respect to the optical member are different from each other in the direction which intersects with the scanning direction at start of the first movement period and at start of the second movement period.

2. The exposure apparatus according to claim 1, wherein the third shot region is included in same row as the first shot region.

3. The exposure apparatus according to claim 1, wherein the second shot region is disposed to be adjacent to the first shot region with respect to the direction which intersects with the scanning direction.

4. The exposure apparatus according to claim 1, wherein the row including the fourth shot region is disposed to be adjacent to the row including the third shot region with respect to the scanning direction.

5. The exposure apparatus according to claim 1, wherein movement directions of the second member are different from each other in the first movement period and the second movement period.

6. The exposure apparatus according to claim 5, wherein the movement directions include the direction which intersects with the scanning direction.

7. The exposure apparatus according to claim 5, wherein the second member moves to one side with respect to the direction which intersects with the scanning direction in the first movement period, and wherein
the second member moves to one side or the other side with respect to the direction which intersects with the scanning direction in the second movement period.

8. The exposure apparatus according to claim 7, wherein the substrate moves to one side with respect to the direction which intersects with the scanning direction in the first movement period, and wherein
the substrate moves to one side or the other side with respect to the direction which intersects with the scanning direction in the second movement period.

9. The exposure apparatus according to claim 1, wherein movement distances of the second member are different from each other in the first movement period and the second movement period.

10. The exposure apparatus according to claim 9, wherein the movement distances include a movement distance with respect to the direction which intersects with the scanning direction.

11. The exposure apparatus according to claim 1, wherein positions of the second member with respect to the optical member are different from each other at termination of the first movement period and termination of the second movement period.

12. The exposure apparatus according to claim 1, wherein movement speeds of the second member are different from each other in the first movement period and the second movement period.

13. The exposure apparatus according to claim 12, wherein
the movement speeds include a movement speed with respect to the direction which intersects with the scanning direction.

14. The exposure apparatus according to claim 1, wherein accelerations of the second member are different from each other in the first movement period and the second movement period.

15. The exposure apparatus according to claim 14, wherein
the accelerations include an acceleration with respect to the direction which intersects with the scanning direction.

16. The exposure apparatus according to claim 1, wherein the second member moves within a movable range which is determined with respect to the direction which intersects with the scanning direction.

17. The exposure apparatus according to claim 1, wherein the second member continuously moves in the first movement period.

18. The exposure apparatus according to claim 17, wherein
the second member continuously moves in a first exposure period and in the first movement period, the first exposure period being between exposure start and exposure termination of the first shot region.

19. The exposure apparatus according to claim 17, wherein
the second member continuously moves in the first exposure period which is between the exposure start and the exposure termination of the first shot region, in the first movement period, and in a second exposure period which is between the exposure start and the exposure termination of the second shot region.

20. The exposure apparatus according to claim 1, wherein the second member continuously moves in the second movement period.

21. The exposure apparatus according to claim 20, wherein
the second member continuously moves in a third exposure period and in the second movement period, the third exposure period being between the exposure start and the exposure termination of the third shot region.

22. The exposure apparatus according to claim 20, wherein
the second member continuously moves in the third exposure period which is between the exposure start and the exposure termination of the third shot region, in the second movement period, and in a fourth exposure period which is between the exposure start and the exposure termination of the fourth shot region.

23. The exposure apparatus according to claim 1, wherein the second member stops in at least a portion of the second movement period.

24. The exposure apparatus according to claim 23, wherein
the substrate moves in a direction substantially parallel to the scanning direction in at least a portion of the second movement period, and wherein
the second member stops in at least a portion of the period in which the substrate is moved in a direction substantially parallel to the scanning direction.

25. The exposure apparatus according to claim 23, wherein
the second member continuously moves in the third exposure period which is between the exposure start and the exposure termination of the third shot region.

26. The exposure apparatus according to claim 23, wherein
the second member continuously moves in the third exposure period which is between the exposure start and the exposure termination of the third shot region, and in the fourth exposure period which is between the exposure start and the exposure termination of the fourth shot region.

27. The exposure apparatus according to claim 1, wherein the second movement period is longer than the first movement period.

28. The exposure apparatus according to claim 1, wherein in the first movement period, the second member is moved at a first acceleration to one side of the direction which intersects with the scanning direction in a first state where the substrate is moving at a first speed to the one side of the direction which intersects with the scanning direction, and the second member is moved at a second acceleration to one side of the direction which intersects with the scanning direction in a second state where the substrate is moving at a second speed to the one side of the direction which intersects with the scanning direction, the second acceleration being an acceleration lower than the first acceleration, the second speed being a speed higher than the first speed.

29. The exposure apparatus according to claim 1, wherein in the second movement period, the second member is moved at a third acceleration to one side of the direction which intersects with the scanning direction in a third state where the substrate is moving at a third speed to the one side of the direction which intersects with the scanning direction, and the second member is moved at a fourth acceleration to one side of the direction which intersects with the scanning direction in a fourth state where the substrate is moving at a fourth speed to the one side of the direction which intersects with the scanning direction, the fourth acceleration being an acceleration lower than the third acceleration, the fourth speed being a speed higher than the third speed.

30. The exposure apparatus according to claim 28, wherein
the second member is moved to the other side of the direction which intersects with the scanning direction in a second exposure period in which the substrate is moved in the scanning direction during the exposure of the second shot region.

31. The exposure apparatus according to claim 30, wherein the second member is moved at a constant speed to the other side of the direction which intersects with the scanning direction in at least a portion of the second exposure period.

32. The exposure apparatus according to claim 1, wherein the second member is moved in a direction substantially perpendicular to an optical axis of the optical member.

33. The exposure apparatus according to claim 1, wherein the second member is moved in a movement direction of the substrate in at least a portion of a period in which the substrate is moved.

34. The exposure apparatus according to claim 1, wherein the second member is moved so that a relative speed between the second member and the substrate is decreased.

35. The exposure apparatus according to claim 1, wherein the second member is moved so that a relative speed between the second member and the substrate becomes smaller than a relative speed between the first member and the substrate.

36. The exposure apparatus according to claim 1, wherein the second member is moved in the direction which intersects with the scanning direction.

37. The exposure apparatus according to claim 1, wherein the first member does not substantially move.

38. The exposure apparatus according to claim 1, further comprising:
a fluid recovery part which recovers at least a portion of the liquid of the liquid immersion space.

39. The exposure apparatus according to claim 38, wherein
at least a portion of the fluid recovery part is capable of being opposite to the substrate.

40. The exposure apparatus according to claim 38, wherein
the fluid recovery part is disposed at the second member.

41. The exposure apparatus according to claim 38, wherein
the fluid recovery part is disposed at at least a portion of surrounding of the second lower surface.

42. The exposure apparatus according to claim 38, wherein
the fluid recovery part recovers the liquid via holes of a porous member.

43. The exposure apparatus according to claim 1, further comprising:
a supply part which supplies the liquid to form the liquid immersion space.

44. The exposure apparatus according to claim 43, wherein
the supply part is disposed at the first member.

45. The exposure apparatus according to claim 43, wherein
at least a portion of the liquid from the supply part is supplied to a first space between the first lower surface and the second upper surface, and a liquid recovery part which faces the first space and recovers the liquid of the first space is provided.

46. The exposure apparatus according to claim 45, wherein
the liquid recovery part is disposed at the first member.

47. The exposure apparatus according to claim 1, wherein
the first member comprises a first opening through which the exposure light can pass, and wherein
the second member comprises a second opening through which the exposure light can pass.

48. The exposure apparatus according to claim 47, wherein
the first opening is larger than the second opening.

49. A method of manufacturing a device, comprising:
exposing the substrate using the exposure apparatus according to claim 1; and
developing the exposed substrate.

50. An exposing method that sequentially exposes each of a plurality of shot regions of a substrate by exposure light via liquid between an emitting surface of an optical member and the substrate while moving the substrate in a scanning direction with respect to the exposure light emitted from the emitting surface, the exposing method comprising:
forming a liquid immersion space of the liquid by using a liquid immersion member that includes a first member and a second member, the first member being disposed at at least a portion of surrounding of the optical member, the second member being disposed at a portion of surrounding of the optical member;
sequentially exposing each of a plurality of shot regions by the exposure light emitted from the emitting surface via the liquid of the liquid immersion space, the plurality of shot regions being included in one row on the substrate and being disposed in a direction which intersects with a scanning direction;
exposing shot regions of another row different from the one row via the liquid of the liquid immersion space before or after exposing the shot regions included in the one row; and
moving the second member with respect to the first member in at least a portion of an exposure of the substrate so that a first operation of the second member in a first movement period of the substrate which is between exposure termination of a first shot region and exposure start of a second shot region is different from a second operation of the second member in a second movement period of the substrate which is between exposure termination of a third shot region and exposure start of a fourth shot region, the first and second shot regions being included in the same row, the third and fourth shot regions being arranged in different rows,
positions of the second member with respect to the optical member being different from each other in the direction which intersects with the scanning direction at start of the first movement period and at start of the second movement period.

51. A method of manufacturing a device comprising:
exposing the substrate using the exposing method according to claim 50; and
developing the exposed substrate.

* * * * *